(12) United States Patent
Chung

(10) Patent No.: US 10,192,615 B2
(45) Date of Patent: *Jan. 29, 2019

(54) ONE-TIME PROGRAMMABLE DEVICES HAVING A SEMICONDUCTOR FIN STRUCTURE WITH A DIVIDED ACTIVE REGION

(71) Applicant: Attopsemi Technology Co., LTD, Hsinchu (TW)

(72) Inventor: Shine C. Chung, San Jose, CA (US)

(73) Assignee: Attopsemi Technology Co., LTD, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/884,362

(22) Filed: Jan. 30, 2018

(65) Prior Publication Data

US 2018/0174650 A1 Jun. 21, 2018

Related U.S. Application Data

(63) Continuation-in-part of application No. 15/365,584, filed on Nov. 30, 2016, now Pat. No. 9,881,970,
(Continued)

(51) Int. Cl.
*G11C 11/00* (2006.01)
*G11C 13/00* (2006.01)
(Continued)

(52) U.S. Cl.
CPC ...... *G11C 13/0004* (2013.01); *G11C 11/1659* (2013.01); *G11C 11/1675* (2013.01);
(Continued)

(58) Field of Classification Search
CPC ............ G11C 13/0002; G11C 13/0004; G11C 13/0007; G11C 13/0011; G11C 13/003;
(Continued)

(56) References Cited

U.S. PATENT DOCUMENTS 3,198,670 A 8/1965 Nissim
3,715,242 A 2/1973 Daniel
(Continued)

FOREIGN PATENT DOCUMENTS

CN 1469473 A 1/2004
CN 1691204 A 11/2005
(Continued)

OTHER PUBLICATIONS

U.S. Appl. No. 13/471,704, filed May 15, 2012.
(Continued)

*Primary Examiner* — Gene Auduong

(57) ABSTRACT

An One-Time Programmable (OTP) memory is built in at least one of semiconductor fin structures. The OTP memory has a plurality of OTP cells. At least one of the OTP cells can have at least one resistive element and at least one fin. The at least one resistive element can be built by an extended source/drain or a MOS gate. The at least one fin can be built on a common well or on an isolated structure that has at least one MOS gate dividing fins into at least one first active region and a second active region.

20 Claims, 48 Drawing Sheets

Related U.S. Application Data which is a continuation of application No. 14/500,743, filed on Sep. 29, 2014, now Pat. No. 9,548,109, which is a continuation of application No. 13/761,097, filed on Feb. 6, 2013, now Pat. No. 8,848,423, which is a continuation-in-part of application No. 13/026,678, filed on Feb. 14, 2011, now Pat. No. 8,482,972.

(60) Provisional application No. 61/595,165, filed on Feb. 6, 2012.

(51) Int. Cl.
  *G11C 17/16* (2006.01)
  *H01L 27/092* (2006.01)
  *G11C 11/16* (2006.01)
  *H01L 27/24* (2006.01)
  *H01L 27/22* (2006.01)
  *H01L 27/12* (2006.01)
  *H01L 45/00* (2006.01)

(52) U.S. Cl.
  CPC ........ *G11C 13/0002* (2013.01); *G11C 13/003* (2013.01); *G11C 13/004* (2013.01); *G11C 13/0007* (2013.01); *G11C 13/0011* (2013.01); *G11C 13/0028* (2013.01); *G11C 13/0069* (2013.01); *G11C 17/16* (2013.01); *H01L 27/0924* (2013.01); *H01L 27/1211* (2013.01); *H01L 27/224* (2013.01); *H01L 27/228* (2013.01); *H01L 27/2409* (2013.01); *H01L 27/2436* (2013.01); *H01L 27/2463* (2013.01); *H01L 27/2472* (2013.01); *H01L 45/1253* (2013.01); *G11C 2013/0073* (2013.01); *G11C 2213/72* (2013.01); *G11C 2213/74* (2013.01); *H01L 45/04* (2013.01); *H01L 45/06* (2013.01); *H01L 45/085* (2013.01); *H01L 45/144* (2013.01); *H01L 45/146* (2013.01); *H01L 45/147* (2013.01)

(58) Field of Classification Search
  CPC ... G11C 13/004; G11C 17/16; G11C 11/1659; G11C 11/1675; G11C 13/0028
  USPC ........... 365/148, 96, 158, 100, 163; 257/379
  See application file for complete search history.

(56) References Cited

U.S. PATENT DOCUMENTS

| | | | |
|---|---|---|---|
| 4,148,046 A | 4/1979 | Hendrickson et al. | |
| 4,192,059 A | 3/1980 | Khan et al. | |
| 4,642,674 A | 2/1987 | Schoofs | |
| 5,192,989 A | 3/1993 | Matsushita et al. | |
| 5,355,342 A | 10/1994 | Ueoka | |
| 5,389,552 A | 2/1995 | Iranmanesh | |
| 5,447,876 A | 9/1995 | Moyer et al. | |
| 5,548,225 A | 8/1996 | Rountree | |
| 5,600,588 A | 2/1997 | Kawashima | |
| 5,610,871 A | 3/1997 | Hidaka | |
| 5,635,742 A | 6/1997 | Hoshi et al. | |
| 5,637,901 A | 6/1997 | Beigel et al. | |
| 5,723,890 A | 3/1998 | Fujihira et al. | |
| 5,757,046 A | 5/1998 | Fujihira et al. | |
| 5,761,148 A | 6/1998 | Allan et al. | |
| 5,962,903 A | 10/1999 | Sung et al. | |
| 6,002,156 A | 12/1999 | Lin | |
| 6,008,092 A | 12/1999 | Gould | |
| 6,034,882 A | 3/2000 | Johnson et al. | |
| 6,054,344 A | 4/2000 | Liang et al. | |
| 6,108,247 A | 8/2000 | Suzu | |
| 6,140,687 A | 10/2000 | Shimormura et al. | |
| 6,215,681 B1 | 4/2001 | Schuurman et al. | |
| 6,222,244 B1 | 4/2001 | Arndt et al. | |
| 6,243,864 B1 | 6/2001 | Odani et al. | |
| 6,249,472 B1 | 6/2001 | Tamura et al. | |
| 6,346,727 B1 | 2/2002 | Ohtomo | |
| 6,388,292 B1 | 5/2002 | Lin | |
| 6,400,540 B1 | 6/2002 | Chang | |
| 6,405,160 B1 | 6/2002 | Djaja et al. | |
| 6,461,934 B2 | 10/2002 | Nishida et al. | |
| 6,483,734 B1 | 11/2002 | Sharma et al. | |
| 6,597,629 B1 | 7/2003 | Raszka et al. | |
| 6,611,043 B2 | 8/2003 | Takiguchi | |
| 6,731,535 B1 | 5/2004 | Ooishi et al. | |
| 6,770,953 B2 | 8/2004 | Boeck et al. | |
| 6,798,684 B2 | 9/2004 | Low et al. | |
| 6,803,804 B2 | 10/2004 | Madurawe | |
| 6,813,705 B2 | 11/2004 | Duesterwald et al. | |
| 6,897,543 B1 | 5/2005 | Huang et al. | |
| 6,934,176 B2 | 8/2005 | Low et al. | |
| 6,944,083 B2 | 9/2005 | Pedlow | |
| 6,967,879 B2 | 11/2005 | Mizukoshi | |
| 7,009,182 B2 | 3/2006 | Kannan et al. | |
| 7,102,951 B2 | 9/2006 | Paillet et al. | |
| 7,167,397 B2 | 1/2007 | Paillet et al. | |
| 7,211,843 B2 | 5/2007 | Low et al. | |
| 7,212,432 B2 | 5/2007 | Ferrant et al. | |
| 7,224,598 B2 | 5/2007 | Perner | |
| 7,263,027 B2 | 8/2007 | Kim et al. | |
| 7,294,542 B2 | 11/2007 | Okushima | |
| 7,369,452 B2 | 5/2008 | Kenkare et al. | |
| 7,391,064 B1 | 6/2008 | Tripsas et al. | |
| 7,405,590 B1 | 7/2008 | Kaneko | |
| 7,411,844 B2 | 8/2008 | Nitzan et al. | |
| 7,439,608 B2 | 10/2008 | Arendt | |
| 7,450,414 B2 | 11/2008 | Scheuerlein | |
| 7,461,371 B2 | 12/2008 | Luo et al. | |
| 7,573,762 B2 | 8/2009 | Kenkare et al. | |
| 7,579,232 B1 | 8/2009 | Ping | |
| 7,589,367 B2 | 9/2009 | Oh et al. | |
| 7,609,578 B2 | 10/2009 | Buer et al. | |
| 7,660,181 B2 | 2/2010 | Kumar et al. | |
| 7,696,017 B1 | 4/2010 | Tripsas et al. | |
| 7,701,038 B2 | 4/2010 | Chen et al. | |
| 7,759,766 B2 | 7/2010 | Booth | |
| 7,764,532 B2 | 7/2010 | Kurjanowicz et al. | |
| 7,772,591 B1 | 8/2010 | Shih et al. | |
| 7,802,057 B2 | 9/2010 | Iyer et al. | |
| 7,808,815 B2 | 10/2010 | Ro et al. | |
| 7,830,697 B2 | 11/2010 | Herner | |
| 7,833,823 B2 | 11/2010 | Klersy | |
| 7,834,659 B1 | 11/2010 | Im et al. | |
| 7,852,656 B2 | 12/2010 | Shin et al. | |
| 7,859,920 B2 | 12/2010 | Jung | |
| 7,889,204 B2 | 2/2011 | Hansen et al. | |
| 7,910,999 B2 | 3/2011 | Lee et al. | |
| 8,008,723 B2 | 8/2011 | Nagai | |
| 8,050,129 B2 | 11/2011 | Liu et al. | |
| 8,089,137 B2 | 1/2012 | Lung et al. | |
| 8,115,280 B2 | 2/2012 | Chen et al. | |
| 8,119,048 B2 | 2/2012 | Nishimura | |
| 8,154,005 B2 | 4/2012 | Hsia | |
| 8,168,538 B2 | 5/2012 | Chen et al. | |
| 8,174,063 B2 | 5/2012 | Liu et al. | |
| 8,174,922 B2 | 5/2012 | Naritake | |
| 8,179,711 B2 | 5/2012 | Kim et al. | |
| 8,183,665 B2 | 5/2012 | Bertin et al. | |
| 8,217,490 B2 | 7/2012 | Bertin et al. | |
| 8,233,316 B2 | 7/2012 | Liu et al. | |
| 8,339,079 B2 | 12/2012 | Yamada | |
| 8,369,166 B2 | 2/2013 | Kurjanowicz et al. | |
| 8,373,254 B2 | 2/2013 | Chen et al. | |
| 8,380,768 B2 | 2/2013 | Hoefler | |
| 8,415,764 B2 | 4/2013 | Chung | |
| 8,482,972 B2 * | 7/2013 | Chung ................ | G11C 11/1659 365/148 |
| 8,488,359 B2 | 7/2013 | Chung | |
| 8,488,364 B2 | 7/2013 | Chung | |
| 8,503,141 B2 | 8/2013 | Mallikarjunaswamy | |
| 8,514,606 B2 | 8/2013 | Chung | |
| 8,526,254 B2 | 9/2013 | Kurjanowicz et al. | |

(56) References Cited

U.S. PATENT DOCUMENTS

| | | |
|---|---|---|
| 8,559,208 B2 | 10/2013 | Chung |
| 8,570,800 B2 | 10/2013 | Chung |
| 8,576,602 B2 | 11/2013 | Chung |
| 8,598,639 B2 | 12/2013 | Hsin |
| 8,643,085 B2 | 2/2014 | Pfirsch |
| 8,644,049 B2 | 2/2014 | Chung |
| 8,648,349 B2 | 2/2014 | Masuda et al. |
| 8,649,203 B2 | 2/2014 | Chung |
| 8,680,620 B2 | 3/2014 | Salcedo |
| 8,699,259 B2 | 4/2014 | Zhang et al. |
| 8,760,904 B2 | 6/2014 | Chung |
| 8,804,398 B2 | 8/2014 | Chung |
| 8,817,563 B2 | 8/2014 | Chung |
| 8,830,720 B2 | 9/2014 | Chung |
| 8,848,423 B2 * | 9/2014 | Chung ............... H01L 27/1211 365/148 |
| 8,854,859 B2 | 10/2014 | Chung |
| 8,861,249 B2 | 10/2014 | Chung |
| 8,913,415 B2 | 12/2014 | Chung |
| 8,913,449 B2 | 12/2014 | Chung |
| 8,923,070 B2 | 12/2014 | Xia |
| 8,923,085 B2 | 12/2014 | Chung |
| 8,929,122 B2 | 1/2015 | Chung |
| 8,988,965 B2 | 3/2015 | Chung |
| 9,019,742 B2 | 4/2015 | Chung |
| 9,019,791 B2 | 4/2015 | Chung |
| 9,025,357 B2 | 5/2015 | Chung |
| 9,070,437 B2 | 6/2015 | Chung |
| 9,178,100 B2 | 11/2015 | Webster |
| 9,236,141 B2 | 1/2016 | Chung |
| 9,281,038 B2 | 3/2016 | Chung |
| 9,305,973 B2 | 4/2016 | Chung |
| 9,324,447 B2 | 4/2016 | Chung |
| 9,324,849 B2 | 4/2016 | Chung |
| 9,343,176 B2 | 5/2016 | Chung |
| 9,460,807 B2 | 10/2016 | Chung |
| 9,478,306 B2 | 10/2016 | Chung |
| 9,548,109 B2 * | 1/2017 | Chung ............... H01L 27/224 |
| 9,767,915 B2 | 9/2017 | Chung |
| 9,818,478 B2 | 11/2017 | Chung |
| 9,881,970 B2 * | 1/2018 | Chung ............... H01L 27/2454 |
| 9,981,970 B2 | 1/2018 | Chung |
| 2002/0018355 A1 | 2/2002 | Johnson et al. |
| 2002/0075744 A1 | 6/2002 | McCollum |
| 2002/0168821 A1 | 11/2002 | Williams et al. |
| 2002/0196659 A1 | 12/2002 | Hurst et al. |
| 2003/0104860 A1 | 6/2003 | Cannon et al. |
| 2003/0135709 A1 | 7/2003 | Niles et al. |
| 2003/0169625 A1 | 9/2003 | Hush et al. |
| 2004/0057271 A1 | 3/2004 | Parkinson |
| 2004/0113183 A1 | 6/2004 | Karpov et al. |
| 2004/0130924 A1 | 7/2004 | Ma et al. |
| 2005/0052915 A1 | 3/2005 | Herner |
| 2005/0060500 A1 | 3/2005 | Luo et al. |
| 2005/0062110 A1 | 3/2005 | Dietz et al. |
| 2005/0110081 A1 | 5/2005 | Pendharkar |
| 2005/0124116 A1 | 6/2005 | Hsu et al. |
| 2005/0146962 A1 | 7/2005 | Schreck |
| 2005/0242386 A1 | 11/2005 | Ang |
| 2006/0072357 A1 | 4/2006 | Wicker |
| 2006/0092689 A1 | 5/2006 | Braun et al. |
| 2006/0104111 A1 | 5/2006 | Tripsas et al. |
| 2006/0120148 A1 | 6/2006 | Kim et al. |
| 2006/0129782 A1 | 6/2006 | Bansal et al. |
| 2006/0215440 A1 | 9/2006 | Cho et al. |
| 2006/0244099 A1 | 11/2006 | Kurjanowicz |
| 2007/0004160 A1 | 1/2007 | Voldman |
| 2007/0008776 A1 | 1/2007 | Scheuerlein et al. |
| 2007/0030026 A1 | 2/2007 | Hsu et al. |
| 2007/0057323 A1 | 3/2007 | Furukawa et al. |
| 2007/0058422 A1 | 3/2007 | Phillips |
| 2007/0081377 A1 | 4/2007 | Zheng et al. |
| 2007/0133341 A1 | 6/2007 | Lee et al. |
| 2007/0138549 A1 | 6/2007 | Wu et al. |
| 2007/0183213 A1 | 8/2007 | Kusakabe |
| 2007/0218665 A1 | 9/2007 | Sutardja |
| 2007/0223266 A1 | 9/2007 | Chen |
| 2007/0279978 A1 | 12/2007 | Ho et al. |
| 2007/0284656 A1 | 12/2007 | Radigan |
| 2008/0025067 A1 | 1/2008 | Scheuerlein et al. |
| 2008/0025068 A1 | 1/2008 | Scheuerlein et al. |
| 2008/0028134 A1 | 1/2008 | Matsubara et al. |
| 2008/0044959 A1 | 2/2008 | Cheng et al. |
| 2008/0067601 A1 | 3/2008 | Chen |
| 2008/0105878 A1 | 5/2008 | Ohara |
| 2008/0144354 A1 | 6/2008 | Choi |
| 2008/0151612 A1 | 6/2008 | Pellizzer et al. |
| 2008/0170429 A1 | 7/2008 | Bertin et al. |
| 2008/0175060 A1 | 7/2008 | Liu et al. |
| 2008/0185568 A1 | 8/2008 | Kwon |
| 2008/0220560 A1 | 9/2008 | Klersy |
| 2008/0225567 A1 | 9/2008 | Burr et al. |
| 2008/0280401 A1 | 11/2008 | Burr et al. |
| 2008/0316852 A1 | 12/2008 | Matsufuji et al. |
| 2009/0039420 A1 | 2/2009 | Trivedi |
| 2009/0055617 A1 | 2/2009 | Bansal et al. |
| 2009/0115021 A1 | 5/2009 | Moriwaki |
| 2009/0168493 A1 | 7/2009 | Kim et al. |
| 2009/0172315 A1 | 7/2009 | Iyer et al. |
| 2009/0180310 A1 | 7/2009 | Shimomura et al. |
| 2009/0194839 A1 | 8/2009 | Bertin et al. |
| 2009/0213660 A1 | 8/2009 | Pikhay et al. |
| 2009/0219756 A1 | 9/2009 | Schroegmeier et al. |
| 2009/0269932 A1 | 10/2009 | Chen |
| 2009/0309089 A1 | 12/2009 | Hsia et al. |
| 2010/0002501 A1 | 1/2010 | Leuschner |
| 2010/0027326 A1 | 2/2010 | Kim et al. |
| 2010/0034016 A1 | 2/2010 | Liu et al. |
| 2010/0061136 A1 | 3/2010 | Koyama et al. |
| 2010/0085798 A1 | 4/2010 | Lu et al. |
| 2010/0091546 A1 | 4/2010 | Liu et al. |
| 2010/0103721 A1 | 4/2010 | Guha |
| 2010/0142254 A1 | 6/2010 | Choi et al. |
| 2010/0157651 A1 | 6/2010 | Kumar et al. |
| 2010/0171086 A1 | 7/2010 | Lung et al. |
| 2010/0177547 A1 | 7/2010 | Shen |
| 2010/0201410 A1 | 8/2010 | Illegems |
| 2010/0232203 A1 | 9/2010 | Chung et al. |
| 2010/0238701 A1 | 9/2010 | Tsukamoto et al. |
| 2010/0246237 A1 | 9/2010 | Borot et al. |
| 2010/0250974 A1 | 9/2010 | Ristic |
| 2010/0277967 A1 | 11/2010 | Lee et al. |
| 2010/0301304 A1 | 12/2010 | Chen et al. |
| 2011/0022648 A1 | 1/2011 | Harris et al. |
| 2011/0051491 A1 | 3/2011 | Takizawa |
| 2011/0062557 A1 | 3/2011 | Bandyopadhyay et al. |
| 2011/0108926 A1 | 5/2011 | Bahl |
| 2011/0127627 A1 | 6/2011 | Hoofman |
| 2011/0128772 A1 | 6/2011 | Kim et al. |
| 2011/0145777 A1 | 6/2011 | Iyer et al. |
| 2011/0175199 A1 | 7/2011 | Lin et al. |
| 2011/0186990 A1 | 8/2011 | Mawatari |
| 2011/0222330 A1 | 9/2011 | Lee et al. |
| 2011/0260289 A1 | 10/2011 | Oyamada |
| 2011/0267869 A1 | 11/2011 | Hoefler |
| 2011/0286261 A1 | 11/2011 | Sakuguchi |
| 2011/0297912 A1 | 12/2011 | Samachisa et al. |
| 2011/0310655 A1 | 12/2011 | Kreupl et al. |
| 2011/0312166 A1 | 12/2011 | Yedinak et al. |
| 2012/0032303 A1 | 2/2012 | Elkareh et al. |
| 2012/0039107 A1 | 2/2012 | Chung |
| 2012/0044736 A1 | 2/2012 | Chung |
| 2012/0044737 A1 | 2/2012 | Chung |
| 2012/0044738 A1 | 2/2012 | Chung |
| 2012/0044739 A1 | 2/2012 | Chung |
| 2012/0044740 A1 | 2/2012 | Chung |
| 2012/0044743 A1 | 2/2012 | Chung |
| 2012/0044744 A1 | 2/2012 | Chung |
| 2012/0044745 A1 | 2/2012 | Chung |
| 2012/0044746 A1 | 2/2012 | Chung |
| 2012/0044747 A1 | 2/2012 | Chung |
| 2012/0044748 A1 | 2/2012 | Chung |
| 2012/0044753 A1 | 2/2012 | Chung |
| 2012/0044756 A1 | 2/2012 | Chung |

(56) References Cited

U.S. PATENT DOCUMENTS

| | | |
|---|---|---|
| 2012/0044757 A1 | 2/2012 | Chung |
| 2012/0044758 A1 | 2/2012 | Chung |
| 2012/0047322 A1 | 2/2012 | Chung |
| 2012/0074460 A1 | 3/2012 | Kitagawa |
| 2012/0106231 A1 | 5/2012 | Chung |
| 2012/0120707 A1 | 5/2012 | Kim |
| 2012/0147653 A1 | 6/2012 | Chung |
| 2012/0147657 A1 | 6/2012 | Sekar et al. |
| 2012/0209888 A1 | 8/2012 | Chung |
| 2012/0224406 A1 | 9/2012 | Chung |
| 2012/0224413 A1 | 9/2012 | Zhang et al. |
| 2012/0256292 A1 | 10/2012 | Yu et al. |
| 2012/0257435 A1 | 10/2012 | Lin |
| 2012/0287730 A1 | 11/2012 | Kim |
| 2012/0314472 A1 | 12/2012 | Chung |
| 2012/0314473 A1 | 12/2012 | Chung |
| 2012/0320656 A1 | 12/2012 | Chung |
| 2012/0320657 A1 | 12/2012 | Chung |
| 2013/0148409 A1 | 6/2013 | Chung |
| 2013/0161780 A1 | 6/2013 | Kizilyalli et al. |
| 2013/0189829 A1 | 7/2013 | Mieczkowski et al. |
| 2013/0200488 A1 | 8/2013 | Chung |
| 2013/0201745 A1 | 8/2013 | Chung |
| 2013/0201746 A1 | 8/2013 | Chung |
| 2013/0201748 A1 | 8/2013 | Chung |
| 2013/0201749 A1 | 8/2013 | Chung |
| 2013/0208526 A1 | 8/2013 | Chung |
| 2013/0215663 A1 | 8/2013 | Chung |
| 2013/0235644 A1 | 9/2013 | Chung |
| 2013/0268526 A1 | 10/2013 | John et al. |
| 2013/0286710 A1 | 10/2013 | Hall |
| 2013/0308366 A1 | 11/2013 | Chung |
| 2014/0010032 A1 | 1/2014 | Seshadri et al. |
| 2014/0016394 A1 | 1/2014 | Chung et al. |
| 2014/0071726 A1 | 3/2014 | Chung |
| 2014/0092674 A1 | 4/2014 | Chung |
| 2014/0124871 A1 | 5/2014 | Ko et al. |
| 2014/0124895 A1 | 5/2014 | Salzman et al. |
| 2014/0126266 A1 | 5/2014 | Chung |
| 2014/0131710 A1 | 5/2014 | Chung |
| 2014/0131711 A1 | 5/2014 | Chung |
| 2014/0131764 A1 | 5/2014 | Chung |
| 2014/0133056 A1 | 5/2014 | Chung |
| 2014/0160830 A1 | 6/2014 | Chung |
| 2014/0211567 A1 | 7/2014 | Chung |
| 2014/0269135 A1 | 9/2014 | Chung |
| 2014/0340954 A1 | 11/2014 | Chung |
| 2015/0003142 A1 | 1/2015 | Chung |
| 2015/0003143 A1 | 1/2015 | Chung |
| 2015/0009743 A1 | 1/2015 | Chung |
| 2015/0014785 A1 | 1/2015 | Chung |
| 2015/0021543 A1 | 1/2015 | Chung |
| 2015/0029777 A1 | 1/2015 | Chung |
| 2015/0078060 A1 | 3/2015 | Chung |
| 2015/0130509 A1 | 5/2015 | Herner |
| 2015/0137258 A1 | 5/2015 | Mittal |
| 2015/0194433 A1 | 7/2015 | Ponoth |
| 2015/0380103 A1 | 12/2015 | Braun et al. |
| 2016/0034351 A1 | 2/2016 | Michael |
| 2016/0071582 A1 | 3/2016 | Chung |
| 2016/0268002 A1 | 9/2016 | Chen |
| 2016/0276043 A1 | 9/2016 | Chung |
| 2017/0053708 A1 | 2/2017 | Wong |
| 2017/0110512 A1 | 4/2017 | Chung |
| 2018/0005703 A1 | 1/2018 | Nguyen |
| 2018/0075906 A1 | 3/2018 | Chung |

FOREIGN PATENT DOCUMENTS

| | | |
|---|---|---|
| CN | 101057330 A | 10/2007 |
| CN | 101083227 A | 12/2007 |
| CN | 101188140 A | 5/2008 |
| CN | 101271881 A | 9/2008 |
| CN | 101483062 A | 7/2009 |
| CN | 101728412 A | 6/2010 |
| CN | 10238593 A | 3/2012 |
| CN | 102385932 A | 3/2012 |
| CN | 10261027 A | 7/2012 |
| CN | 102610272 A | 7/2012 |
| EP | 1367596 A1 | 12/2003 |
| JP | 03-264814 | 11/1991 |
| TW | I309081 | 10/2007 |

OTHER PUBLICATIONS

U.S. Appl. No. 13/026,650, filed Feb. 14, 2011.
U.S. Appl. No. 13/026,656, filed Feb. 14, 2011.
U.S. Appl. No. 13/026,664, filed Feb. 14, 2011.
U.S. Appl. No. 13/026,678, filed Feb. 14, 2011.
U.S. Appl. No. 13/026,692, filed Feb. 14, 2011.
U.S. Appl. No. 13/026,704, filed Feb. 14, 2011.
U.S. Appl. No. 13/026,717, filed Feb. 14, 2011.
U.S. Appl. No. 13/026,725, filed Feb. 14, 2011.
U.S. Appl. No. 13/026,752, filed Feb. 14, 2011.
U.S. Appl. No. 13/026,771, filed Feb. 14, 2011.
U.S. Appl. No. 13/026,783, filed Feb. 14, 2011.
U.S. Appl. No. 13/026,835, filed Feb. 14, 2011.
U.S. Appl. No. 13/026,840, filed Feb. 14, 2011.
U.S. Appl. No. 13/026,852, filed Feb. 14, 2011.
U.S. Appl. No. 13/214,198, filed Aug. 21, 2011.
U.S. Appl. No. 13/590,044, filed Aug. 20, 2012.
U.S. Appl. No. 13/590,047, filed Aug. 20, 2012.
U.S. Appl. No. 13/590,049, filed Aug. 20, 2012.
U.S. Appl. No. 13/590,050, filed Aug. 20, 2012.
U.S. Appl. No. 13/214,183, filed Aug. 20, 2011.
U.S. Appl. No. 13/288,843, filed Nov. 3, 2011.
U.S. Appl. No. 13/314,444, filed Dec. 8, 2011.
U.S. Appl. No. 13/397,673, filed Feb. 15, 2012.
U.S. Appl. No. 13/571,797, filed Aug. 10, 2012.
U.S. Appl. No. 13/678,539, filed Nov. 15, 2012.
U.S. Appl. No. 13/678,544, filed Nov. 15, 2012.
U.S. Appl. No. 13/678,541, filed Nov. 15, 2012.
U.S. Appl. No. 13/678,543, filed Nov. 15, 2012.
Ahn, S.J. et al, "Highly Reliable 50nm Contact Cell Technology for 256Mb PRAM," IEEE VLSI Tech Symp., Jun. 2005, pp. 98-99.
Alavi, Mohsen, et al., "A PROM Element Based on Salicide Allgomeration of Poly Fuses in a CMOS Logic Process," IEEE IEDM, 97, pp. 855-858.
Andre, T. W. et al., "A 4-Mb 0.18um 1T1MTJ Toggle MRAM With Balanced Three Input Sensing Scheme and Locally Mirrored Unidirectional Write Drivers," IEEE J. of Solid-State Circuits, vol. 40, No. 1, Jan. 2005, pp. 301-309.
Ang, Boon et al., "NiSi Polysilicon Fuse Reliability in 65nm Logic CMOS Technology," IEEE Trans. on Dev. Mat. Rel. vol. 7, No. 2, Jun. 2007, pp. 298-303.
Aziz, A. et al., "Lateral Polysilicon n+p Diodes: Effect of the Grain boundaries and of the p-Implemented Doping Level on the I-V and C-V Characteristics," Springer Proceedings in Physics, vol. 54, 1991, pp. 318-322.
Aziz, A. et al., "Lateral Polysilicon PN Diodes: Current-Voltage Characteristics Simulation Between 200K and 400K a Numerical Approach," IEEE Trans. on Elec. Dev., vol. 41, No. 2, Feb. 1994, pp. 204-211.
Banerjee, Kaustav et al., "High Current Effects in Silicide Films for Sub-0.25um VLSI Technologies," IEEE 36th IRPS, 1998, pp. 284-292.
Bedeschi, F. et al., "4-Mb MOSFET-Selected uTrench Phase-Change Memory Experimental Chip," IEEE J. of Solid-State Circuits, vol. 40, No. 7, Jul. 2005, pp. 1557-1565.
Bedeschi, F. et al., "A Bipolar-Selected Phase Change Memory Featuring Multi-Level Cell Storage," IEEE J. Sol. Stat. Cir., vol. 44, No. 1, Jan. 2009, pp. 217-227.
Bedeschi, F. et al., "A Fully Symmetrical Sense Amplifier for Non-volatile Memories," IEEE. Int. Symp. on Circuits and Systems, (ISCAS), vol. 2, 2004, pp. 625-628.
Bedeschi, F. et al., "An 8Mb Demonstrator for High-Density 1.8V Phase-Change Memories," VLIS Cir. Symp, Jun. 2004, pp. 442-445.

(56) References Cited

OTHER PUBLICATIONS

Bedeschi, F. et al., "Set and Reset Pulse Characterization in BJT-Selected Phase-Change Memory," IEEE Int. Symp. on Circuits and Systems (ISCAS), 2005, pp. 1270-1273.

Braganca, P. M. et al., "A Three-Terminal Approach to Developing Spin-Torque Written Magnetic Random Access Memory Cells," IEEE Trans. on Nano. vol. 8, No. 2, Mar. 2009, pp. 190-195.

Cagli, C. et al., "Evidence for threshold switching in the set process of NiO-based RRAM and physical modeling for set, reset, retention and disturb prediction," IEEE IEDM, 2008, pp. 1-4.

Chan, W. T. et al., "CMOS Compatible Zero-Mask One-Time Programmable (OTP) Memory Design," Proc. Int. Conf. Solid State Integr. Cir. Tech., Beijing, China, Oct. 20-23, 2008. pp. 861-864.

Chan, Wan Tim, et al., "CMOS Compatible Zero-Mask One Time Programmable Memory Design", Master Thesis, Hong-Kong University of Science and Technologies, 2008.

Chang, Meng-Fan et al., "Circuit Design Challenges in Embedded Memory and Resistive RAM (RRAM) for Mobile SoC and 3D-IC", Design Automation Conference (ASP-DAC), 16th Asia and South Pacific, 2011, pp. 197-203.

Cheng, Yu-Hsing et al., "Failure Analysis and Optimization of Metal Fuses for Post Package Trimming," IEEE 45th IRPS, 2007, pp. 616-617.

Chiu, Pi-Feng et al., "A Low Store Energy, Low VDDmin, Nonvolatile 8T2R SRAM with 3D Stacked RRAM Devices for Low Power Mobile Applications," IEEE VLSI Cir./Tech Symp., Jun. 2010, pp. 229-230.

Cho, Woo Yeong et al., "A 0.18um 3.0V 64Mb Non-Volatile Phase-Transition Random-Access Memory (PRAM)," ISSCC, Feb. 2004, Sec. 2-1.

Choi, Sang-Jun et al., "Improvement of CBRAM Resistance Window by Scaling Down Electrode Size in Pure-GeTe Film," IEEE Elec. Dev., vol. 30, No. 2, Feb. 2009, pp. 120-122.

Choi, Youngdon et al., "A 20nm 1.8V 8Gb PRAM with 40MB/s Program Bandwidth," IEEE ISSCC, 2012, pp. 46-47.

Chung, S. et al., "A 1.25um2 Cell 32Kb Electrical Fuse Memory in 32nm CMOS with 700mV Vddmin and Parallel/Serial Interface," VLSI Cir. Symp., Jun. 2009, pp. 30-31.

Chung, S. et al., "A 512×8 Electrical Fuse Memory with 15um2 Cells Using 8-sq Asymmetrical Fuse and Core Devices in 90nm CMOS," VLSI Cir. Symp., Jun. 2007, pp. 74-75.

Crowley, Matthew et al., "512Mb PROM with 8 Layers of Antifuse/Diode Cells," IEEE ISSCC 2003, Sec. 16.4.

De Sandre, Guido et al., "A 4Mb LV MOS-Selected Embedded Phase Change Memory in 90nm Standard CMOS Technology," IEEE J. Sol. Stat. Cir, vol. 46. No. 1, Jan. 2011, pp. 52-63.

De Sandre, Guido et al., "A 90nm 4Mb Embedded Phase-Change Memory with 1.2V 12ns Read Access Time and 1MB/s Write Throughput," ISSCC 2010, Sec. 14.7.

Desikan, Rajagopalan et al., "On-Chip MRAM as a High-Bandwidth Low-Latency Replacement for DRAM Physical Memories," Tech Report TR-02-47, Dept. of Computer Science, University of Texas, Austin, Sep. 27, 2002, 18 pages.

Dietrich, Stefan et al., "A Nonvolatile 2-Mbit CBRAM Memory Core Featuring Advanced Read and Program Control," IEEE J. of Solid-Stat Cir., vol. 42, No. 4, Apr. 2007, pp. 839-845.

Dion, Michael J., "Reservoir Modeling for Electromigration Improvement of Metal Systems with Refractory Barriers," IEEE 39th IRPS, 2001, pp. 327-333.

Doorn, T. S. et al., "Ultra-fast Programming of Silicided Polysilicon Fuses Based on New Insights in the Programming Physics," IEEE IEDM, 2005, pp. 667-670.

Doorn, T. S., "Detailed Qualitative Model for the Programming Physics of Silicided Polysilicon Fuses," IEEE Trans. on Elec. Dev. vol. 54, No. 12, Dec. 2007, pp. 3285-3291.

Durlam, M. et al., "A 1-Mbit MRAM Based on 1T1MTJ Bit Cell Integrated With Copper Interconnects," IEEE J. of Solid-State Circuits, vol. 38, No. 5, May 2003, pp. 769-773.

Engel, B. et al., "The Science and Technology of Magnetoresistive Tunnel Memory," IEEE Tran. on Nanotechnology, vol. 1, No. 1, Mar. 2002, pp. 32-38.

Engel, B.N. et al., "A 4Mb Toggle MRAM Based on a Novel bit and Switching Method," IEEE Trans. on Mag. vol. 41, No. 1, Jan. 2005, pp. 132-136.

Fellner, Johannes, et al., "Lifetime Study for a Poly Fuse in a 0.35um Polycide CMOS Process," IEEE 43rd IRPS, 2005, pp. 446-449.

Gao, B. et al., "Oxide-Based RRAM: Uniformity Improvement Using a New Material-Oriented Methodology," IEEE VLSI Tech. Symp., Jun. 2009, pp. 30-31.

Gao, B. et al., "Oxide-Based RRAM Switching Mechanism: A New Ion-Transport-Recombination Model," IEDM, Dec. 2008, pp. 563-566.

Gill, M. et al., "Ovonic Unified Memory—A High Performance Nonvolatile Memory Technology for Stand-Alone Memory and Embedded Applications," IEEE, ISSCC Dig. of Tech. Paper, Feb. 2002, pp. 202-203.

Gogl, D. et al., "A 16-Mb MRAM Featuring Bootstrapped Write Drivers," IEEE J. of Solid-State Circuits, vol. 40, No. 4, Apr. 2005, pp. 902-908.

Gopalan, C. et al., Demonstration of Conductive Bridging Random Access Memory (CBRAM) in Logic CMOS Process, IEEE Int. Memory Workshop, 2010, pp. 1-4.

Ha, Daewon and Kim, Kinam, "Recent Advances in High Density Phase Change Memory (PRAM)," IEEE VLSI Tech. Symp. Jun. 2007.

Hosoi, Y. et al., "High Speed Unipolar Switching Resistance RAM (RRAM) Technology," IEEE IEDM, Dec. 2006, pp. 1-4.

Hosomi, M. et al., "A Novel Nonvolatile Memory with Spin Torque Transfer Magnetization Switching: Spin-RAM," IEEE IEDM Dig. of Tech. Paper, Dec. 2005, pp. 459-463.

Huang, Chia-En et al., "A New CMOS Logic Anti-Fuse Cell with Programmable Contact," IEEE IEDM Tech. Dig. 2007, pp. 48-51.

Im, Jay et al., "Characterization of Silicided Polysilicon Fuse Implemented in 65nm CMOS Technology," 7th Annual Non-Volatile Memory Technology Symp, (NVMTS) 2006, pp. 55-57.

Jin, Li-Yan et al., "Low-Area 1-Kb Multi-Bit OTP IP Design," IEEE 8th Int. Conf. on ASIC (ASICON), 2009. pp. 629-632.

Johnson, Mark et al., "512Mb PROM with a Three-Dimensional Array of Diode/Antifuse Memory Cells," IEEE J. of Sol. Stat. Cir., vol. 38, No. 11, Nov. 2003, pp. 1920-1928.

Kalnitsy, Alexander et al., "CoSi2 Integrated Fuses on Poly Silicon for Low Voltage 0.18um CMOS Applications," IEEE IEDM 1999, pp. 765-768.

Kang, Han-Byul et al., "Electromigration of NiSi Poly Gated Electrical Fuse and Its Resistance Behaviors Induced by High Temperature," IEEE IRPS, 2010, pp. 265-270.

Kang, Sangbeom et al., "A 0.1um 1.8V 256Mb Phase-Change Random Access Memory (PRAM) with 66Mhz Synchronous Burst-Read," IEEE J. of Sol. Stat. Cir. vol. 42. No. 1, Jan. 2007, pp. 210-218.

Kawahara, T. et al., "2Mb Spin-Transfer Torque RAM (SPRAM) with Bit-by-Bit Bidirectional Current Write and Parallelizing-Direction Current Read," IEEE ISSCC Dig. of Tech. Paper, Feb. 2007, pp. 480-481.

Ker, Ming-Dou et al., "High-Current Characterization of Polysilicon Diode for Electrostatic Discharge Protection in Sub-Quarter-Micron Complementary Metal Oxide Semiconductor Technology," Jpn. J. Appl. Phys. vol. 42 (2003) pp. 3377-3378.

Ker, Ming-Dou et al., "Ultra-High-Voltage Charge Pump Circuit in Low-Voltage Bulk CMOS Processes With Polysilicon Diodes," IEEE Trans. on Cir. and Sys.-II: Exp. Brief., vol. 54, No. 1, Jan. 2007, pp. 47-51.

Kim, Deok-Kee et al., "An Investigation of Electrical Current Induced Phase Transitions in the NiPtSi/Polysilicon System," J. App. Phy. 103, 073708 (2008).

Kim, I. S. et al., "High Performance PRAM Cell Scalable to sub-20nm Technology with below 4F2 Cell Size, Extendable to DRAM Applications," IEEE VLSI Tech Symp., Jun. 2010, pp. 203-204.

(56) References Cited

OTHER PUBLICATIONS

Kim, Jinbong et al., "3-Transistor Antifuse OTP ROM Array Using Standard CMOS Process," IEEE VLSI Cir. Symposium, Jun. 2003, pp. 239-242.
Kim, O. et al., "CMOS trimming circuit based on polysilicon fusing," Elec. Lett. vol. 34, No. 4, pp. 355-356, Feb. 1998.
Klee, V. et al., "A 0.13um Logic-Based Embedded DRAM Technology with Electrical Fuses, Cu Interconnect in SiLK, sub-7ns Random Access Time and its Extension to the 0.10um Generation," IEEE IEDM, 2001, pp. 407-410.
Kothandaramam, C. et al., "Electrically programmable fuse (eFUSE) using electromigration in silicides," IEEE Elec. Dev. Lett., vol. 23, No. 9, pp. 523-525, Sep. 2002.
Kulkarni, S. et al., "High-Density 3-D Metal-Fuse PROM Featuring 1.37um2 1T1R Bit Cell in 32nm High-K Metal-Gate CMOS Technology," VLSI Cir. Symp., Jun. 2009 pp. 28-29.
Kulkarni, S. et al., "A 4Kb Metal-Fuse OTP-ROM Macro Featuring a 2V Programmable 1.37um2 1T1R Bit Cell in 32nm High-K Metal-Gate," IEEE J. of Sol. Stat. Cir, vol. 45, No. 4, Apr. 2010, pp. 863-868.
Kund, Michael et al., "Conductive Bridging RAM (CBRAM): An Emerging Non-Volatile Memory Technology Scalable to Sub 20nm," IEEE IEDM 2005, pp. 754-757.
Lai, Han-Chao et al., "A 0.26um2 U-Shaped Nitride-Based Programming Cell on Pure 90nm CMOS Technology," IEEE Elec. Dev. Lett. vol. 28, No. 9, Sep. 2007, pp. 837-839.
Lai, S., "Current Status of the Phase Change Memory and Its Future," IEEE IEDM Dig. of Tech. Paper, Dec. 2003, pp. 255-258.
Lee, H. Y. et al., "Low Power and High Speed Bipolar Switching with a Thin Reactive Ti Buffer Layer in Robust HfO2 Based RRAM," IEEE IEDM, 2008, pp. 1-4.
Lee, K.J., et al., "A 90nm 1.8V 512Mb Diode-Switch PRAM with 266MB/s Read Throughout," IEEE ISSCC, Dig. of Tech. Paper, Feb. 2007, 3 pgs.
Lee, Kwang-Jin et al., "A 90nm 1.8V 512Mb Diode-Switch PRAM with 266MB/s Read Throughput," IEEE J. of Sol. Stat. Cir., vol. 43, No. 1, Jan. 2008, pp. 150-162.
Lee, M.-J. et al., "Stack Friendly all-Oxide 3D RRAM Using GaInZnO Peripheral TFT Realized Over Glass Substrates," IEDM, Dec. 2008. pp. 1-4.
Lee, Man Chiu et al., "OTP Memory for Low Cost Passive RFID Tags," IEEE Conf. on Electron Devices and Solid-State Circuits (EDSSC), 2007, pp. 633-636.
Liaw, Corvin et al., "The Conductive Bridging Random Access Memory (CBRAM): A Non-volatile Multi-Level Memory Technology," 37th European Solid-State Device Research Conference (ESSDERC), 2007, pp. 226-229.
Lim, Kyunam et al., "Bit Line Coupling Scheme and Electrical Fuse Circuit for Reliable Operation of High Density DRAM," IEEE VLSI Cir. Symp. Jun. 2001, pp. 33-34.
Maffitt, T. et al., "Design Considerations for MRAM," IBM J. Res. & Dev., vol. 50, No. 1, Jan. 2006, pp. 25-39.
Meng, X.Z. et al., "Reliability Concept for Electrical Fuses," IEE Proc.-Sci Meas. Technol., vol. 144, No. 2, Mar. 1997, pp. 87-92.
Min, Byung-Jun et al., "An Embedded Non-volatile FRAM with Electrical Fuse Repair Scheme and One Time Programming Scheme for High Performance Smart Cards," IEEE CICC, Nov. 2005, pp. 255-258.
Mojumder, N. N. et al., "Three-Terminal Dual-Pillar STT-MRAM for High Performance Robust Memory Applications," IEEE Trans. Elec. Dev. vol. 58. No. 5, May 2011, pp. 1508-1516.
Morimoto, T. et al., "A NiSi Salicide Technology for Advanced Logic Devices," IEEE IEDM, Dec. 1991, pp. 653-656.
Neale, Ron, "PCM Progress Report No. 6 Afterthoughts," http://www.eetimes.com/General/PrintView/4236240, Feb. 13, 2012, 5 pages.
Nebashi, R. et al., "A 90nm 12ns 32Mb 2T1MTJ MRAM," IEEE ISSCC Dig. of Tech. Paper, Sess. 27.4, Feb. 2009, 3 pages.

Ng, K.P. et al., "Diode-Base Gate Oxide Anti-Fuse One-Time Programmable Memory Array in Standard CMOS Process," IEEE Int. Conf. of Elect. Dev. & Solid-Stat Cir. (EDSSC), Dec. 2009, pp. 457-460.
Ohbayashi, Shigeki et al., "A 65nm Embedded SRAM With Wafer Level Burn-In Mode, Leak-Bit Redundancy and Cu E-Trim Fuse for Known Good Die," IEEE J. of Solid. Stat. Cir., vol. 43, No. 1, Jan. 2008, pp. 96-108.
Oh, G. H. et al., "Parallel Multi-Confined (PMC) Cell Technology for High Density MLC PRAM," IEEE VLSI Tech. Symp., Jun. 2009, pp. 220-221.
Oh, J. H. et al., "Full Integration of Highly Manufacturable 512Mb PRAM Based on 90nm Technology," IEEE IEDM Dig. of Tech. Paper, Dec. 2006, pp. 1-4.
Osada, K. et al., "Phase Change RAM Operated with 1.5V CMOS as Low Cost Embedded Memory," IEEE CICC, Nov. 2005, pp. 431-434.
Park, Don et al., "Study on Reliability of Metal Fuse for Sub-100nm Technology," IEEE Int. Symp. on Semiconductor Manufacturing (ISSM), 2005, pp. 420-421.
Park, Jongwoo et al., "Phase Transformation of Programmed NiSi Electrical Fuse: Diffusion, Agglomeration, and Thermal Stability," 18th IEEE Int. Symp. on Physical and Failure Analysis of Integrated Circuits, (IPFA), 2011, pp. 1-7.
Park, Young-Bae et al., "Design of an eFuse OTP Memory of 8 Bits Based on a 0.35um BCD Process," Mobile IT Convergence (ICMIC), 2011 Int. Conf. on, pp. 137-139.
Pellizzer, F. et al., "Novel uTrench Phase-Change Memory Cell for Embedded and Stand-alone Non-Volatile Memory Applications," IEEE VLSI Tech Symp. Jun. 2004, pp. 18-19.
Peng, J. et al., "A Novel Embedded OTP NVM Using Standard Foundry CMOS Logic Technology," IEEE 21st Non-Volatile Semiconductor Memory Workshop (NVSMW) 2006, pp. 24-26.
Rizzolo, R. F. et al., "IBM System z9 eFUSE applications and methodology," IBM J. Res. & Dev. vol. 51 No. ½ Jan./Mar. 2007, pp. 65-75.
Robson, Norm et al., "Electrically Programmable Fuse (eFuse) from Memory Redundancy to Autonomic Chips," IEEE CICC, 2007, pp. 799-804.
Russo, U. et al., "Conductive-Filament Switching Analysis and Self-Accelerated Thermal Dissolution Model for Reset in NiO-based RRAM," IEDM, Dec. 2007, pp. 775-778.
Safran, J. et al., "A Compact eFUSE Programmable Array Memory for SOI CMOS," VLSI Cir. Symp. Jun. 2007, pp. 72-73.
Sasaki, Takahiko et al., "Metal-Segregate-Quench Programming of Electrical Fuse," IEEE 43rd IRPS, 2005, pp. 347-351.
Schrogmeier, P. et al., "Time Discrete Voltage Sensing and Iterative Programming Control for a 4F2 Multilevel CBRAM," VLSI Cir. Symp., Jun. 2007, pp. 186-187.
Sheu, Shyh-Shyuan et al., "A 5ns Fast Write Multi-Level Non-Volatile 1K-bits RRAM Memory with Advance Write Scheme," VLSI Cir. Symp., Jun. 2009, pp. 82-83.
Sheu, Shyh-Shyuan et al., "Fast-Write Resistive RAM (RRAM) for Embedded Applications," IEEE Design & Test of Computers, Jan./Feb. 2011, pp. 64-71.
Shi, Min et al., "Zero-Mask Contact Fuse for One-Time-Programmable Memory in Standard CMOS Processes," IEEE Dev. Lett. vol. 32, No. 7, Jul. 2011, pp. 955-957.
Song, Y. J. et al., "Highly Reliable 256Mb PRAM with Advanced Ring Contact Technology and Novel Encapsulating Technology," IEEE VLSI Tech Symp., Jun. 2006, pp. 153-154.
Suto, Hiroyuki et al., "Programming Conditions for Silicided Poly-Si or Copper Electrically Programmable Fuses," IEEE IIRW Final Report, 2007, pp. 84-89.
Suto, Hiroyuki et al., "Study of Electrically Programmable Fuses Through Series of I-V Measurements," IEEE IIRW Final Report, 2006, pp. 83-86.
Suto, Hiroyuki et al., "Systematic Study of the Dopant-Dependent Properties of Electrically Programmable Fuses With Silicide Poly-Si Links Through a Series of I-V Measurements," IEEE Trans. on Dev. Mat. Rel. vol. 7, No. 2, Jun. 2007, pp. 285-297.

(56) References Cited

OTHER PUBLICATIONS

Takaoka, H. et al., A Novel Via-fuse Technology Featuring Highly Stable Blow Operation with Large On-off Ratio for 32nm Node and Beyond, IEDM, 2007, pp. 43-46.
Tehrani, S. et al., "Magnetoresistive Random Access Memory Using Magnetic Tunnel Junction," Proc. of IEEE, vol. 91, No. 5, May 2003, pp. 703-714.
Tehrani, S., "Status and Outlook of MRAM Memory Technology," IEEE IEDM Dig. of Tech Paper., Dec. 2006, pp. 1-4.
Teichmann, J. et al., "One Time Programming (OTP) with Zener Diodes in CMOS Processes," 33rd Conf. on European Solid-State Device Research (ESSDERC), 2003, pp. 433-436.
Tian, C. et al., "Reliability Investigation of NiPtSi Electrical Fuse with Different Programming Mechanisms," IEEE IIRW Final Report, 2007, pp. 90-93.
Tian, C. et al., "Reliability Qualification of CoSi2 Electrical Fuse for 90nm Technology," IEEE 44th IRPS, 2006, pp. 392-397.
Tian, Chunyan et al., "Reliability Investigation of NiPtSi Electrical Fuse with Different Programming Mechanisms," IEEE Trans. on Dev. Mat. Rel. vol. 8, No. 3, Sep. 2008, pp. 536-542.
Tonti, W. R. et al., "Product Specific Sub-Micron E-Fuse Reliability and Design Qualification," IEEE IIRW Final Report, 2003, pp. 36-40.
Tonti, W. R., "Reliability and Design Qualification of a Sub-Micro Tungsten Silicide E-Fuse," IEEE IRPS Proceedings, 2004, pp. 152-156.
Tonti, W. R., "Reliability, Design Qualification, and Prognostic Opportunity of in Die E-Fuse," IEEE Conference on Prognostics and Health Management (PHM), 2011, pp. 1-7.
Ueda, T. et al., "A Novel Cu Electrical Fuse Structure and Blowing Scheme utilizing Crack-assisted Mode for 90-45nm-node and beyond," IEEE VLSI Tech. Sym., Jun. 2006, 2 pages.
Ulman, G. et al., "A Commercial Field-Programmable Dense eFUSE Array Memory with 00.999% Sense Yield for 45nm SOI CMOS", ISSCC 2008/ Session 22 / Variation Compensation and Measurement/ 22.4, 2008 IEEE International Solid-State Circuits Conference, pp. 406-407.
Vimercati, Daniele et al., "A 45nm 1Gbit 1.8V PCM for Wireless and Embedded Applications," IEEE ISSCC Feb. 2010, 26 pages.
Vinson, J. E., "NiCr Fuse Reliability—A New Approach," Southcon/ 94, Conference Record, 1994, pp. 250-255.
Walko, J., "Ovshinsky's Memories," IEE Review, Issue 11, Nov. 2005, pp. 42-45.
Wang, J. P. et al., "The Understanding of Resistive Switching Mechansim in HfO2-Based Resistive Random Access Memory," IEDM, 2011, pp. 12.1.1-12.1.4.
Wikipedia, "Programmable read-only memory", http://en.wikipedia.org/wiki/Programmable_read-only_memory, downloaded Jan. 31, 2010, 4 pages.
Worledge, D.C., "Single-Domain Model for Toggle MRAM," IBM J. Res. & Dev. vol. 50, No. 1, Jan. 2006, pp. 69-79.
Wu, Kuei-Sheng et al., "The Improvement of Electrical Programmable Fuse with Salicide-Block Dielectrical Film in 40nm CMOS Technology," Interconnect Technololgy Conference (IITC) 2010 Int. pp. 1-3.
Wu, Kuei-Sheng et al., "Investigation of Electrical Programmable Metal Fuse in 28nm and beyond CMOS Technology," IEEE International Interconnect Technology Conference and 2011 Materials for Advanced Metallization (IITC/MAM), 2011, pp. 1-3.
Yin, M. et al., "Enhancement of Endurance for CuxO based RRAM Cell," 9th Int. Conf. on Solid-State and Integrated-Circuit Technology (ICSICT) 2008, pp. 917-920.
Zhu, Jian-Gang, "Magnetoresistive Random Access Memory: The Path to Competitiveness and Scalability," Proc. of IEEE, vol. 96, No. 11, Nov. 2008, pp. 1786-1798.
Zhuang, W. W. et al., "Novell Colossal Magnetonresistive Thin Film Nonvolatile Resistance Random Access Memory (RRAM)," IEEE IEDM 2002, pp. 193-196.
Notice of Allowance for U.S. Appl. No. 13/026,664 dated Sep. 18, 2012.
Office Action for U.S. Appl. No. 13/471,704 dated Jul. 31, 2012.
Notice of Allowance for U.S. Appl. No. 13/471,704 dated Oct. 18, 2012.
Notice of Allowance for U.S. Appl. No. 13/026,678 dated Sep. 19, 2012.
Office Action for U.S. Appl. No. 13/026,783 dated Sep. 27, 2012.
Office Action for U.S. Appl. No. 13/026,717 dated Oct. 25, 2012.
Office Action for U.S. Appl. No. 13/026,650 dated Nov. 9, 2012.
Office Action for U.S. Appl. No. 13/026,692 dated Nov. 9, 2012.
Office Action for U.S. Appl. No. 13/026,752 dated Nov. 9, 2012.
Office Action for U.S. Appl. No. 13/026,656 dated Nov. 13, 2012.
Office Action for U.S. Appl. No. 13/026,704 dated Nov. 23, 2012.
Office Action for U.S. Appl. No. 13/397,673, dated Dec. 18, 2012.
Office Action for U.S. Appl. No. 13/026,840, dated Dec. 31, 2012.
Office Action for U.S. Appl. No. 13/026,852, dated Jan. 14, 2013.
Restriction Requirement for U.S. Appl. No. 13/026,835, dated Dec. 12, 2012.
Notice of Allowance for U.S. Appl. No. 13/026,717, dated Feb. 12, 2013.
Office Action for U.S. Appl. No. 13/471,704, dated Jan. 25, 2013.
U.S. Appl. No. 13/761,048, filed Feb. 6, 2013.
U.S. Appl. No. 13/761,057, filed Feb. 6, 2013.
U.S. Appl. No. 13/761,097, filed Feb. 6, 2013.
U.S. Appl. No. 13/761,045, filed Feb. 6, 2013.
Office Action for U.S. Appl. No. 13/026,678, dated Feb. 20, 2013.
Notice of Allowance for U.S. Appl. No. 13/026,783, dated Mar. 4, 2013.
Notice of Allowance for U.S. Appl. No. 13/026,692, dated Mar. 15, 2013.
Notice of Allowance for U.S. Appl. No. 13/026,835, dated Mar. 20, 2013.
Notice of Allowance for U.S. Appl. No. 13/026,664, dated Apr. 22, 2013.
Notice of Allowance for U.S. Appl. No. 13/026,656, dated Apr. 22, 2013.
Jagasivamani et al., "Development of a Low-Power SRAM Compiler", IEEE Press, 2001, pp. 498-501.
Liu et al., "A Flexible Embedded SRAM Compiler", IEEE Press, 2002, 3 pgs.
Sundrararajan, "OSUSPRAM: Design of a Single Port SRAM Compiler in NCSU FREEPDK45 Process", Mater of Science in Electrical Engineering, Oklahoma State University, Jul. 2010, 117 pgs.
Notice of Allowance for U.S. Appl. No. 13/026,835, dated Apr. 18, 2013.
Notice of Allowance for U.S. Appl. No. 13/026,704, dated Apr. 30, 2013.
Notice of Allowance for U.S. Appl. No. 13/026,852, dated May 10, 2013.
Notice of Allowance for U.S. Appl. No. 13/026,717, dated May 15, 2013.
Notice of Allowance for U.S. Appl. No. 13/471,704, dated May 22, 2013.
Notice of Allowance for U.S. Appl. No. 13/026,678, dated May 28, 2013.
Notice of Allowance for U.S. Appl. No. 13/026,650, dated May 30, 2013.
Restriction Requirement for U.S. Appl. No. 13/314,444, dated Jun. 7, 2013.
Restriction Requirement for U.S. Appl. No. 13/214,198, dated Jun. 13, 2013.
Notice of Allowance for U.S. Appl. No. 13/026,840, dated Jun. 13, 2013.
Restriction Requirement for U.S. Appl. No. 13/026,771, dated Jun. 13, 2013.
Notice of Allowance for U.S. Appl. No. 13/026,752, dated Jul. 1, 2013.
Restriction Requirement for U.S. Appl. No. 13/678,543, dated Jul. 8, 2013.
Office Action for U.S. Appl. No. 13/026,725, dated Jul. 19, 2013.
Notice of Allowance for U.S. Appl. No. 13/026,664, dated Jul. 22, 2013.

(56) References Cited

OTHER PUBLICATIONS

Notice of Allowance for U.S. Appl. No. 13/026,692, dated Jul. 23, 2013.
Notice of Allowance for U.S. Appl. No. 13/397,673, dated Jul. 30, 2013.
Notice of Allowance for U.S. Appl. No. 13/026,704, dated Aug. 2, 2013.
Notice of Allowance for U.S. Appl. No. 13/026,783, dated Aug. 5, 2013.
Office Action for U.S. Appl. No. 13/214,198, dated Aug. 6, 2013.
Office action for Chinese Patent 2013. Application No. 201110279954.7, dated Jul. 1, 2013.
Shen et al., "High-K Metal Gate Contact RRAM (CRRAM) in Pure 28 nm CMOS Logic Process", Electron Devices Meeting (IEDM), 2012 IEEE International, Dec. 2012, 4 pgs.
Tseng et al., "A New High-Density and Ultrasmall-Cell Size Contact RRAM (CR-RAM) with Fully CMOS-Logic-Compatible Technology and Circuits", IEEE Transactions on Electron Devices, vol. 58, Issue 1, Jan. 2011, 6 pgs.
Office Action for U.S. Appl. No. 13/026,783, dated Sep. 9, 2013.
Office Action for U.S. Appl. No. 13/314,444, dated Sep. 9, 2013.
Office Action for U.S. Appl. No. 13/026,771, dated Sep. 9, 2013.
Notice of Allowance for U.S. Appl. No. 13/026,852, dated Sep. 18, 2013.
Office Action (Ex Parte) for U.S. Appl. No. 13/678,543, dated Sep. 20, 2013.
Office Action for U.S. Appl. No. 13/835,308, dated Sep. 27, 2013.
Notice of Allowance for U.S. Appl. No. 13/026,717, dated Oct. 1, 2013.
Office Action for U.S. Appl. No. 13/954,831, dated Oct. 1, 2013.
Notice of Allowance for U.S. Appl. No. 13/026,656, dated Oct. 4, 2013.
Office Action for U.S. Appl. No. 13/214,183, dated Oct. 25, 2013.
Chua, "Many Times Programmable z8 Microcontroller", e-Gizmo.cim, Nov. 21, 2006, pp. 1-5.
Forum, Intel Multi-byte Nops, asmcommunity.net, Nov. 21, 2006, pp. 1-5.
CMOS Z8 OTP Microcontrollers Product Specification, Zilog Inc., May 2008, Revision 1, pp. 1-84.
OTP Programming Adapter Product User Guide, Zilog Inc., 2006, pp. 1-3.
Notice of Allowance for U.S. Appl. No. 13/026,852, dated Nov. 15, 2013.
Notice of Allowance for U.S. Appl. No. 13/026,835, dated Nov. 22, 2013.
Notice of Allowance for U.S. Appl. No. 13/026,725, dated Dec. 10, 2013.
Office Action for U.S. Appl. No. 13/026,783, dated Dec. 23, 2013.
Notice of Allowance for U.S. Appl. No. 13/026,771, dated Jan. 15, 2014.
Office Action for Chinese Patent Application No. 201110244362.1, dated Sep. 29, 2013.
Office Action for Chinese Patent Application No. 201110235464.7, dated Oct. 8, 2013.
Office Action for Chinese Patent Application No. 201110244400.3, dated Nov. 5, 2013.
Office Action for Chinese Patent Application No. 201110244342.4, dated Oct. 31, 2013.
Restriction Requirement for U.S. Appl. No. 13/678,541, dated Feb. 28, 2014.
Notice of Allowance for U.S. Appl. No. 13/026,840, dated Mar. 6, 2014.
Notice of Allowance for U.S. Appl. No. 13/026,840, dated Mar. 10, 2014.
Notice of Allowance of U.S. Appl. No. 13/678,543, dated Dec. 13, 2013.
Notice of Allowance for U.S. Appl. No. 13/835,308, dated Mar. 14, 2014.
Notice of Allowance for U.S. Appl. No. 13/026,835, dated Mar. 14, 2014.
Notice of Allowance for U.S. Appl. No. 13/026,725, dated Mar. 31, 2014.
Notice of Allowance for U.S. Appl. No. 13/026,852, dated Mar. 20, 2014.
Notice of Allowance for U.S. Appl. No. 13/026,771, dated Mar. 18, 2014.
Final Office Action for U.S. Appl. No. 13/214,183, dated Apr. 17, 2014.
"Embedded Systems/Mixed C and Assembly Programming", Wikibooks, Aug 6, 2009, pp. 1-7.
Notice of Allowance for U.S. Appl. No. 13/761,097, dated Jul. 15, 2014.
Office Action for U.S. Appl. No. 13/571,797, dated Apr. 24, 2014.
Notice of Allowance for U.S. Appl. No. 13/590,044, dated Apr. 29, 2014.
Notice of Allowance for U.S. Appl. No. 13/954,831, dated May 27, 2014.
Notice of Allowance of U.S. Appl. No. 13/833,044, dated May 29, 2014.
Notice of Allowance for U.S. Appl. No. 13/761,048, dated Jun. 10, 2014.
Office Action for Taiwanese Patent Application No. 100129642, dated May 19, 2014 (with translation).
Office Action for U.S. Appl. No. 13/072,783, dated Nov. 7, 2013.
Notice of Allowance for U.S. Appl. No. 13/026,840, dated Jun. 24, 2014.
Notice of Allowance for U.S. Appl. No. 13/214,198, dated Jun. 23, 2014.
Notice of Allowance for U.S. Appl. No. 13/590,044, dated Jun. 23, 2014.
Ker et al., "MOS-bounded diodes for on-chip ESD protection in a 0.15-μ m shallow-trench-isolation salicided CMOS Process" International Symposium on VLSI Technology, Systems and Applications, 2003, 5 pgs.
Notice of Allowance for U.S. Appl. No. 13/840,965, dated Jun. 25, 2014.
Office Action for U.S. Appl. No. 13/970,562, dated Jun. 27, 2014.
Office Action for U.S. Appl. No. 13/835,308, dated Jun. 27, 2014.
Notice of Allowance for U.S. Appl. No. 13/288,843, dated Jul. 8, 2014.
Restriction Requirement for U.S. Appl. No. 13/678,539, dated Jul. 1, 2014.
Notice of Allowance for U.S. Appl. No. 14/231,413, dated Jul. 18, 2014.
Notice of Allowance for U.S. Appl. No. 13/590,044, dated Jul. 23, 2014.
Restriction Requirement for U.S. Appl. No. 13/833,067, dated Jul. 11, 2014.
Notice of Allowance for U.S. Appl. No. 13/954,831, dated Aug. 4, 2014.
Restriction Requirement for U.S. Appl. No. 13/678,544, dated Aug. 1, 2014.
Notice of Allowance for U.S. Appl. No. 13/761,097, dated Jul. 25, 2014.
Ex parte Quayle for U.S. Appl. No. 13/761,057, dated Aug. 8, 2014.
Final Office Action for U.S. Appl. No. 13/314,444, dated May 14, 2014.
Corrected Notice of Allowability for U.S. Appl. No. 13/288,843, dated Aug. 19, 2014.
Office Action for U.S. Appl. No. 13/590,049, dated Aug. 29, 2014.
Ex Parte Quayle for U.S. Appl. No. 13/590,047, dated Aug. 29, 2014.
Ex Parte Quayle for U.S. Appl. No. 13/590,050, dated Sep. 3, 2014.
Office Action for U.S. Appl. No. 13/678,544, dated Sep. 12, 2014.
Office Action for U.S. Appl. No. 13/678,539, dated Sep. 10, 2014.
Notice of Allowance for U.S. Appl. No. 13/288,843, dated Sep. 18, 2014.
Notice of Allowance for U.S. Appl. No. 13/761,057, dated Sep. 26, 2014.
Notice of Allowance for U.S. Appl. No. 13/833,044, dated Sep. 24, 2014.
Notice of Allowance for U.S. Appl. No. 13/314,444, dated Sep. 24, 2014.

(56) References Cited

OTHER PUBLICATIONS

Office Action for U.S. Appl. No. 13/761,045, dated Sep. 30, 2014.
Notice of Allowance for U.S. Appl. No. 13/835,308, dated Oct. 10, 2014.
Notice of Allowance for U.S. Appl. No. 13/571,797, dated Oct. 14, 2014.
Office Action for U.S. Appl. No. 13/833,067, dated Oct. 20, 2014.
Notice of Allowance for U.S. Appl. No. 14/085,228, dated Oct. 23, 2014.
Office Action for U.S. Appl. No. 13/842,824, dated Oct. 29, 2014.
Herner et al., "Vertical p-i-n Polysilicon Diode with Antifuse for stackable Field-Programmable ROM", IEEE Electron Device Letters, vol. 25, No. 5, pp. 271-273,.
Notice of Allowance for U.S. Appl. No. 13/590,049, dated Nov. 25, 2014.
Notice of Allowance for U.S. Appl. No. 13/590,047, dated Nov. 24, 2014.
Office Action for U.S. Appl. No. 13/590,044, dated Dec. 9, 2014.
Notice of Allowance for U.S. Appl. No. 13/590,050, dated Dec. 18, 2014.
Office Action for U.S. Appl. No. 14/042,392, dated Dec. 31, 2014.
Office Action for U.S. Appl. No. 14/071,957, dated Dec. 29, 2014.
International Search Report and Written Opinion for International Patent Application No. PCT/US/2014/056676, dated Dec. 19, 2014.
Office Action for U.S. Appl. No. 14/493,083, dated Jan. 8, 2015.
Office Action for Chinese Patent Application No. 2011102443903, dated Dec. 16, 2014 (with translation).
Notice of Allowance for U.S. Appl. No. 13/970,562, dated Jan. 23, 2015.
Notice of Allowance for U.S. Appl. No. 14/493,069, dated Feb. 17, 2015.
Notice of Allowance for U.S. Appl. No. 14/085,228, dated Feb. 18, 2015.
Notice of Allowance for U.S. Appl. No. 13/761,045, dated Feb. 18, 2015.
Notice of Allowance for U.S. Appl. No. 14/231,404, dated Jan. 22, 2015.
Notice of Allowance for U.S. Appl. No. 14/021,990, dated Dec. 9, 2014.
Final Office Action for U.S. Appl. No. 13/678,544, dated Feb. 15, 2015.
Office Action for U.S. Appl. No. 14/101,125, dated Mar. 6, 2015.
Hassan, "Argument for anti-fuse non-volatile memory in 28nm high-k metal gate", Feb. 15, 2011, wwwl.eeetimes.com publication.
Office Action for U.S. Appl. No. 13/026,783, dated Mar. 5, 2015.
Final Office Action for U.S. Appl. No. 13/678,539, dated Apr. 1, 2015.
Office Action for U.S. Appl. No. 14/636,155, dated Apr. 10, 2015.
Notice of Allowance for U.S. Appl. No. 14/021,990, dated Apr. 14, 2015.
Notice of Allowance for U.S. Appl. No. 13,842,824, dated Apr. 14, 2015.
Notice of Allowance for U.S. Appl. No. 14/071,957, dated Apr. 14, 2014.
Notice of Allowance for U.S. Appl. No. 14/231,404, dated Apr. 17, 2015.
Notice of Allowance for U.S. Appl. No. 13/590,444, dated May 12, 2015.
Notice of Allowance for U.S. Appl. No. 13/072,783, dated May 13, 2015.
Notice of Allowance for U.S. Appl. No. 13,833,067, dated Jun. 5, 2015.
Office Action for U.S. Appl. No. 13/314,444, dated Dec. 10, 2014.
Final Office Action for U.S. Appl. No. 13/026,783, dated Jul. 30, 2015.
Notice of Allowance for U.S. Appl. No. 14/553,874, dated Aug. 10, 2015.
Office Action for U.S. Appl. No. 14/500,743, dated Aug. 17, 2015.
Notice of Allowance for U.S. Appl. No. 14/042,392, dated Aug. 21, 2015.
Office Action for U.S. Appl. No. 14/485,696, dated Aug. 20, 2015.
Notice of Allowance for U.S. Appl. No. 14/493,083, dated Aug. 27, 2015.
Office Action for U.S. Appl. No. 13/678,539, dated Sep. 16, 2015.
Office Action for U.S. Appl. No. 14/507,691, dated Oct. 30, 2015.
Final Office Action for U.S. Appl. No. 14/101,125, dated Nov. 17, 2015.
Notice of Allowance for U.S. Appl. No. 13/072,783, dated Oct. 27, 2015.
Office Action for U.S. Appl. No. 14/792,479, dated Aug. 28, 2015.
Notice of Allowance for U.S. Appl. No. 14/500,743, dated Dec. 2, 2015.
Notice of Allowance for U.S. Appl. No. 14/636,155, dated Dec. 4, 2015.
Notice of Allowance for U.S. Appl. No. 14/071,957, dated Dec. 4, 2015.
Notice of Allowance for U.S. Appl. No. 13/678,544, dated Feb. 12, 2016.
Office Action for U.S. Appl. No. 14/749,392, dated Feb. 25, 2016.
Office Action for U.S. Appl. No. 14/940,012, dated Feb. 26, 2016.
Notice of Allowance for U.S. Appl. No. 14/485,698, dated Mar. 1, 2016.
Notice of Allowance for U.S. Appl. No. 14/507,691, dated Mar. 15, 2016.
Final Office Action for U.S. Appl. No. 13/314,444, dated Dec. 8, 2011.
Final Office Action for U.S. Appl. No. 13/678,539, dated Apr. 8, 2016.
Notice of Allowance for U.S. Appl. No. 14/545,775, dated Apr. 12, 2016.
Final Office Action for U.S. Appl. No. 14/101,125, dated Apr. 21, 2016.
Notice of Allowance for U.S. Appl. No. 14/500,743, dated Apr. 26, 2016.
Notice of Allowance for U.S. Appl. No. 14/749,392, dated Jun. 27, 2016.
Notice of Allowance for U.S. Appl. No. 14/940,012, dated Jul. 15, 2016.
Office Action for U.S. Appl. No. 14/985,095, dated Jul. 21, 2016.
Notice of Allowance for U.S. Appl. No. 13/314,444, dated Aug. 5, 2016.
Notice of Allowance for U.S. Appl. No. 14/485,696, dated Sep. 21, 2016.
Notice of Allowance for U.S. Appl. No. 15/076,460, dated Dec. 5, 2016.
Final Office Action for U.S. Appl. No. 14/101,125, dated Dec. 14, 2016.
Office Action for U.S. Appl. No. 15/297,922, dated Dec. 23, 2016.
Office Action for U.S. Appl. No. 15/270,287, dated Dec. 23, 2016.
Final Office Action for U.S. Appl. No. 13/678,539, dated Feb. 8, 2017.
Notice of Allowance for U.S. Appl. No. 15/076,460, dated Mar. 15, 2017.
Office Action for U.S. Appl. No. 15/422,266, dated Mar. 17, 2017.
Office Action for U.S. Appl. No. 15/365,584, dated Apr. 21, 2017.
Notice of Allowance for U.S. Appl. No. 14/485,696, dated May 25, 2017.
Notice of Allowance for U.S. Appl. No. 14/101,125, dated Jul. 10, 2017.
Notice of Allowance for U.S. Appl. No. 15/076,460, dated Jul. 20, 2017.
Final Office Action for U.S. Appl. No. 14/485,698, dated Jul. 24, 2017.
Renewed Final Office Action for U.S. Appl. No. 14/485,698, dated Aug. 2, 2017.
Office Action for Taiwanese Patent Application No. 102145000, dated Jul. 7, 2017. (with translations).
Office Action for Chinese Patent Application No. 102610272 A, dated Jul. 10, 2017. (with translations).
Final Office Action for U.S. Appl. No. 15/422,266, dated Sep. 12, 2017.
Notice of Allowance for U.S. Appl. No. 15/365,584, dated Sep. 13, 2017.

(56) References Cited

OTHER PUBLICATIONS

Notice of Allowance for U.S. Appl. No. 14/485,698, dated Oct. 16, 2017.
Final Office Action for U.S. Appl. No. 15/422,266, dated Jan. 22, 2018.
Notice of Allowance for U.S. Appl. No. 14/485,698, dated Feb. 15, 2018.
Extended Search Report for EP Application No. 14901820, dated Jun. 23, 2017.
Office Action for U.S. Appl. No. 15/884,362, dated May 4, 2018.
Extended European Search Report for EP Application No. 18151106.4, dated Apr. 6, 2018.
Tonti, "Reliability, design qualification, and prognostic opportunity of in due E-Fuse" Prognostics and Heath Management IEEE Conference Jun. 20, 2011, pp. 1-7.
Office Action for U.S. Appl. No. 15/805,109, dated May 29, 2018.
Office Action for U.S. Appl. No. 14/485,698, dated Jun. 21, 2018.

\* cited by examiner

ONE-TIME PROGRAMMABLE DEVICES HAVING A SEMICONDUCTOR FIN STRUCTURE WITH A DIVIDED ACTIVE REGION

CROSS-REFERENCE TO RELATED APPLICATIONS

This application is a continuation-in-part of U.S. patent application Ser. No. 15/365,584, filed on Nov. 30, 2016 and entitled "PROGRAMMABLE RESISTIVE DEVICES USING FINFET STRUCTURES FOR SELECTORS," which is hereby incorporated herein by reference, which in turn is a continuation of U.S. patent application Ser. No. 14/500,743, filed on Sep. 29, 2014 and entitled "CIRCUIT AND SYSTEM FOR USING FINFET FOR BUILDING PROGRAMMABLE RESISTIVE DEVICES," which is hereby incorporated herein by reference, which in turn is a continuation of U.S. patent application Ser. No. 13/761,097, filed on Feb. 6, 2013 and entitled "CIRCUIT AND SYSTEM FOR USING FINFET FOR BUILDING PROGRAMMABLE RESISTIVE DEVICES," which is hereby incorporated herein by reference, which in turn is a continuation-in-part of U.S. patent application Ser. No. 13/026,678, filed on Feb. 14, 2011 and entitled "MEMORY DEVICES USING A PLURALITY OF DIODES AS PROGRAM SELECTORS WITH AT LEAST ONE BEING A POLYSILICON DIODE," which is hereby incorporated herein by reference.

The prior application, U.S. patent application Ser. No. 13/761,097, also claims priority benefit of U.S. Provisional Patent Application No. 61/595,165, filed on Feb. 6, 2012 and entitled "NOVEL ONE-TIME PROGRAMMABLE DEVICE IN STANDARD FINFET TECHNOLOGIES," which is hereby incorporated herein by reference.

BACKGROUND OF THE INVENTION

A programmable resistive device is generally referred to a device's resistance states that may change after means of programming. Resistance states can also be determined by resistance values. For example, a resistive device can be a One-Time Programmable (OTP) device, such as electrical fuse, and the programming means can apply a high voltage to induce a high current to flow through the OTP element. When a high current flows through an OTP element by turning on a program selector, the OTP element can be programmed, or burned into a high or low resistance state (depending on either fuse or anti-fuse). A programmable resistive device can be programmed reversibly and repetitively based on the magnitude, duration, or voltage/current limit of the current flowing through the programmable resistive element, such as the films and electrodes in PCRAM (Phase-Change RAM), RRAM (Resistive RAM), CBRAM (Conductive Bridge RAM). A programmable resistive device can also be programmed based on the direction of the current flowing through the programmable resistive element, such as MTJ (Magnetic Tunnel Junction) in MRAM, or resistive films in some kinds of RRAM or CBRAM.

An electrical fuse is a common OTP which is a programmable resistive device that can be constructed from a segment of interconnect, such as polysilicon, silicided polysilicon, silicide, metal, metal alloy, or some combination thereof. The metal can be aluminum, copper, or other transition metals. One of the most commonly used electrical fuses is a CMOS gate, fabricated in silicided polysilicon, used as interconnect. The electrical fuse can also be one or more contacts or vias instead of a segment of interconnect. A high current may blow the contact(s) or via(s) into a very high resistance state. The electrical fuse can be an anti-fuse, where a high voltage makes the resistance lower, instead of higher. The anti-fuse can consist of one or more contacts or vias with an insulator in between. The anti-fuse can also be a CMOS gate coupled to a CMOS body with a thin gate oxide as insulator.

A conventional programmable resistive memory cell 10 using MOS as program selector is shown in FIG. 1(a). The cell 10 consists of a resistive element 11 and an NMOS program selector 12. The resistive element 11 is coupled to the drain of the NMOS 12 at one end, and to a high voltage V+ at the other end. The gate of the NMOS 12 is coupled to a select signal (Sel), and the source is coupled to a low voltage V−. When a high voltage is applied to V+ and a low voltage to V−, the resistive cell 10 can be programmed by raising the select signal (Sel) to turn on the NMOS 12. One of the most common resistive elements is a silicided polysilicon, the same material and fabricated at the same time as a MOS gate. The size of the NMOS 12, as program selector, needs to be large enough to deliver the required program current for a few microseconds. The program current for a silicided polysilicon is normally between a few milliamps for a fuse with width of 40 nm to about 20 mA for a fuse with width about 0.6 um. As a result, the cell size of an electrical fuse using silicided polysilicon tends to be very large. The resistive memory cell 10 can be organized as a two-dimensional array with all select signals Sel's and voltages V−'s in a row coupled as wordlines (WLs) and a ground line, respectively, and all voltages V+'s in a column coupled as bitlines (BLs).

Another programmable resistive device using diode as program selector is shown in FIG. 1(b). The programmable resistive device 15 has a programmable resistive element 16 and a diode 17 as program selector. The programmable resistive element 16 is coupled between an anode of the diode 17 and a high voltage V+. A cathode of the diode 17 is coupled to a low voltage V−. By applying a proper voltage between V+ and V− for a proper duration of time, the programmable resistive element 16 can be programmed into high or low resistance states, depending on magnitude, duration, current/voltage limit, current direction, or combinations thereof. The programmable resistive cell 15 can be organized as a two dimensional array with all voltages V−'s in a row coupled as wordline bars (WLBs), and all voltages V+'s in a column coupled as bitlines (BLs).

A FinFET device is a 3D type of MOS device, instead of a planar CMOS, suitable for CMOS generations beyond 20 nm. FIG. 2(a) shows a conventional planar CMOS with source, drain, and channel laid on the silicon surface and a MOS gate built on top of the silicon substrate. FIG. 2(b) shows a 3D conceptual view of a MOS in a FinFET bulk technology. A tall and thin silicon island can be built on a substrate. The two sides and top surface of the island are grown with gate oxide and then a MOS gate can be built across the thin island to divide the fin into source, drain, and body. The channel region can be extended into the body because the fin is so thin such that the body is almost depleted. After the gate is built, the surface is oxidized to provide isolation between different fins. The current still flows in parallel to the silicon surface, but the channel width is twice of the fin height plus the fin thickness. FIG. 2(c) shows a 3D conceptual view of a MOS in a FinFET SOI technology. The FinFET SOI is very similar to the FinFET bulk except that the tall and thin fins in the FinFET SOI are isolated from the silicon substrate. A FinFET can have multiple fins, just like a planar MOS can have multiple fingers. The sources or drains of the multiple fins can be coupled together by constructing extended source/drain regions. The extended S/D regions can be built on field oxide after the fins and gates are fabricated, and therefore, is thermally isolated from the substrate. The extended source/drain can connect multiple fins together or one fin each. The extended S/D can be fabricated by depositing or growing polysilicon, polycrystalline Si/SiGe, lateral epitaxial silicion/SiGe, or Selective Epitaxial Growth (SEG), etc. The extended source/drain can be a diamond shape with facets and rise above the fin height when doping with SiGe in certain crystal directions, especially for source/drain of a PMOS. FIG. 2(d) shows another 3D conceptual view of a multiple-fin FinFET. FIG. 2(e) shows a SEM photo of a multi-fin FinFETs with sources/drains coupled by extended sources/drains.

FIG. 2(f) shows another 3D view of a FinFET with more structure details as an example. The FinFET is a tall and narrow structure of fin built on a substrate. Then, a layer of field oxide is deposited or grown on a substrate. A MOS gate is fabricated across the fin to divide the fin into source and drain regions. The two ends of the source and drain regions are grown with epitaxial to provide more area for contacts.

FIGS. 2(fa) and 2(fb) show cross sections of three (3) different planes, corresponding to the FIG. 2(f), The MOS device is built like in the conventional planar MOS with STI (Shallow Trench Isolation), gate oxide, gate, gate spacer, LDD (Lightly Doped Drain) and epitaxial source/drain. As an example, the gate length can be 22 nm, fin width can be 11 nm. Fin height can be 55 nm, STI thickness is 100 nm, shallow LDD junction is 5 nm, and space between gate and epitaxial S/D is 30 nm, referring to Tsunaki Takahashi, et al, "Thermal-Aware Device Design of Nanoscale Bulk/SOI FinFETs: Suppression of Operation Temperature and Its Variability," IEEE IEDM, December, 2011, pp. 809-812.

FIG. 3(a1) shows a top view of a 4-fin FinFET 20, loosely corresponding to the 3D views of FIGS. 2(b), 2(c), 2(d), and 2(e). The FinFET 20 has 4 fins, 21-1 to 21-4, on a substrate. The fins are crossed by a gate 22 in a perpendicular direction. Extended source and drain, 27 and 23, respectively, are built to connect the sources and drains of each fin together. Extended source/drain or active region 26 is used as a body tie for bulk FinFET. Two contact holes 29 per fin allow sources or drains of the FinFET being coupled to metal interconnect (not shown). In some embodiments, the contacts can be replaced by metal-0, i.e. an local interconnect that can provide self-align and low contact resistance. The FinFET 20 can be covered by an N+ implant layer 24 for a NMOS FinFET. The body tie 26 can be covered by a P+ implant 25. FIG. 3(a2) shows an equivalent circuit 20' of FIG. 3(a1) that has 4 transistors 21'-1 to 21'-4 corresponding to 4 FinFETs in FIG. 3(a1).

As a reference FinFET device in a 45 nm technology, the parameters of the FinFET shown in FIG. 3(a1) can be: fin width Wfin=10 nm, gate length Lg=45 nm, fin-to-fin space S=200 nm, source/drain distance Ls=Ld=90 nm, contact size=20×20 nm, and fin height H=50 nm. Refer to A. Griffoni et al, "Next Generation Bulk FinFET Devices and Their Benefits for ESD Robustness," IEEE EOS/ESD Sym., 2009, 09-59.

A FinFET is 3D structure that has many properties a planar MOS device cannot have. Other than distinct electrical properties from the planar MOS, the tall and narrow silicon islands erected from a substrate have poor thermal conductivity.

SUMMARY

Embodiments of programmable resistive device cells using MOS devices or diodes in standard FinFET technologies as program selectors are disclosed. The programmable resistive devices can be fabricated using standard FinFET processes to reduce cell size and cost.

Embodiments can using FinFET structures to provide programmable resistive devices and memories in FinFET technologies. The FinFET structures can be 3D FinFET structures, which can serve to provide thermal separation or isolation. The 3D FinFET structures can thermally isolated extensive source/drain regions or the FinFET itself, as program selectors and/or OTP elements using standard FinFET processes for One-Time Programmable devices.

In one embodiment, a programmable resistive device and memory can use a diode as program selector constructed from FinFET technologies, where the P and N terminals of the diode are P+ fins and N+ body ties of an N well, respectively. In another embodiment, a diode as program selector can be constructed from a single or plural of fins with P+ and N+ implants in two ends of the fins. The P+ or N+ implant region can be isolated by dummy MOS gate or Silicide Block Layer (SBL). The same P+ and N+ implants can be used to create sources or drains of PMOS and NMOS devices, respectively. Advantageously, the same N well can be used to house PMOS in standard FinFET processes. By using diodes constructed in standard FinFET processes, a small cell size can be achieved, without incurring any special processing or masks. In another embodiment, a MOS constructed from at least one FinFET can be used as program selector for programmable resistive device and memory. In FinFET technologies, FinFET itself can have a breakdown and can be used to construct an OTP element in one embodiment. In another embodiment, extended source/drain regions in a FinFET technology can be used to constructed program selector and/or OTP element in an OTP memory cell. Thus, costs can be reduced substantially for variously applications, such as embedded applications.

The invention can be implemented in numerous ways, including as a method, system, device, or apparatus (including graphical user interface and computer readable medium). Several embodiments of the invention are discussed below.

As a programmable resistive memory, one embodiment can, for example, include at least a plurality of programmable resistive cells. At least one of the programmable resistive cells including: a resistive element; at least one fin structure coupled to the resistive element, the at least one fin structure being a semiconductor structure and including at least a first active region and a second active region, the first active region having a first type of dopant, and the second active region having the first type of dopant or the second type of dopant; and a gate provided over at least a portion of the at least one fin structure, the gate being provided between or adjacent both the first and second active regions. At least a portion of the first and second active regions can reside in a common well or on an isolated substrate.

As a programmable resistive memory, one embodiment can, for example, include at least a plurality of programmable resistive cells. At least one of the programmable resistive cells including: a resistive element; at least one fin structure coupled to the resistive element, the at least one fin structure being a semiconductor structure and including an active region, the active region being divided into at least a first active region and a second active region, the first active region having a first type of dopant, and the second active region having the first type of dopant or the second type of dopant; and a gate provided over at least a portion of the at least one fin structure, the gate facilitates dividing the active region into the first and second active regions. At least a portion of the first and second active regions can reside in a common well or on an isolated substrate.

As a programmable resistive memory, one embodiment can, for example, include a plurality of programmable resistive cells. At least one of the programmable resistive cells can include a resistive element coupled to a first supply voltage line, and at least one MOS or diode including at least a first active region and a second active region on at least one fin structure or on at least one isolated active region. The first active region can have a first type of dopant and the second region can have a first or second type of dopant. The first active region can provide a first terminal of the MOS or diode, the second active region can provide a second terminal of the MOS or diode, and both the first and second active regions can reside on a common well. The first and second active regions can be isolated by at least one gate for MOS or at least one dummy gate/Silicide Block Layer (SBL) for a diode. The first active region can also be coupled to the resistive element, and the second active region can be coupled to a second supply voltage line. The gate of the MOS can be coupled to a third supply voltage line. The first and second active regions can be implanted from source or drain implant of CMOS devices. The well can be fabricated from a CMOS well. The isolated active regions can be fabricated from extended source/drain regions or part of a fin in FinFET technologies. The resistive element can be configured to be programmable by applying voltages to the first, second, and/or third supply voltage lines to thereby change the resistance into a different logic state.

As an electronics system, one embodiment can, for example, include at least a processor, and a programmable resistive memory operatively connected to the processor. The programmable resistive memory can include at least a plurality of programmable resistive cells for providing data storage. Each of the programmable resistive cells can include at least a resistive element coupled to a first supply voltage line, and at least one MOS or diode including at least a first active region and a second active region on at least one fin structure or on at least one isolated active region. The first active region can have a first type of dopant and the second region can have a first or second type of dopant. The first active region can provide a first terminal of the MOS or diode, the second active region can provide a second terminal of the MOS or diode, and both the first and second active regions can reside in a common well. The first and second active regions can be isolated by at least one MOS gate for MOS or by at least one dummy MOS gate,/Silicide Block Layer (SBL) for a diode. The first active region can be coupled to the resistive element and the second active region can be coupled to a second supply voltage line. The MOS gate can be coupled to a third supply voltage line. The first and second active regions can be implanted from source or drain implant of CMOS devices. The well can be fabricated from CMOS wells. The isolated active regions can be fabricated from extended source/drain regions or part of a fin in FinFET technologies. The programmable resistive element can be configured to be programmable by applying voltages to the first, second, and/or the third supply voltage lines to thereby change the resistance into a different logic state.

As a method for providing a programmable resistive memory, one embodiment can, for example, include at least providing a plurality of programmable resistive cells, and programming a logic state into at least one of the programmable resistive cells by applying voltages to the first, second, and/or third voltage lines. The at least one of the programmable resistive cells can include at least (i) a resistive element coupled to a first supply voltage line, (ii) at least one MOS or diode including at least a first active region and a second active region on at least one fin structure or on at least one isolated active region, and (iii) the first and second active regions can be isolated by at least one MOS gate for MOS or by at least one dummy MOS gate/Silicide Block Layer (SBL) for diode. The first active region can be coupled to the resistive element and the second active region can be coupled to a second supply voltage line. The MOS gate can be coupled to a third supply voltage line. The first active region can have a first type of dopant and the second region can have a first or second type of dopant. The first active region can provide a first terminal of the MOS or diode, the second active region can provide a second terminal of the MOS or diode, and both the first and second active regions can be implanted from source or drain implant of CMOS devices and can reside in a common well fabricated from CMOS wells. The isolated active regions can be fabricated from extended source/drain regions or part of a fin in a FinFET technology.

As a One-Time Programmable (OTP) memory, one embodiment can, for example, include at least a plurality of OTP cells. At least one of the OTP cells can include at least a resistive element and at least one semiconductor fin structure. The at least one semiconductor fin structure can reside in a common well or on an isolated substrate. The semiconductor fin structure can include a plurality of fins, at least one of the plurality of fins can be covered by at least one MOS gate to divide the at least one of the plurality of fins into at least a first active region and a second active region, the first active region having a first type of dopant and the second active region having the first type of dopant or the second type of dopant, the first active region being coupled to one end of the resistive element, the other end of the resistive element being coupled to a first voltage supply line, the second active region being coupled to a second voltage supply line, and the MOS gate being coupled to a third voltage supply line. The first and/or the second active regions of two or more of the plurality of fins can be coupled together by at least one extended source/drain. The resistive element can be configured to be programmable into a different resistance state by applying voltages to the first, second, and the third voltage supply lines.

As an electronics system, one embodiment can, for example, include at least a processor, and an OTP memory operatively connected to the processor. The OTP memory includes at least a plurality of OTP cells for providing data storage. Each of the OTP cells includes at least a resistive element, and at least one semiconductor fin structure residing in a common well or on an isolated substrate. The semiconductor fin structure can include a plurality of fins, at least one of the plurality of fins can be covered by at least one MOS gate to divide the at least one fins into at least a first active region and a second active region. The first active region can have a first type of dopant, and the second active region can have the first type of dopant or the second type of dopant. The first active region can coupled to the resistive element, the other end of the resistive element can be coupled to a first voltage supply line. The second active region can be coupled to a second voltage supply line, and the gate can be coupled to a third voltage supply line. The first and/or the second active region of the fins are coupled together by extended source/drain. The resistive element can be configured to be programmable into a different resistance state by applying voltages to the first, second, and the third voltage supply lines.

As a method for providing an One-Time Programmable (OTP) memory, one embodiment can, for example, include at least: providing a plurality of OTP cells, and programming a logic state into at least one of the OTP cells. At least one of the OTP cells can include at least (i) a resistive element coupled to a first supply voltage line, and (ii) at least one semiconductor fin structure having at least one active region divided by at least one MOS gate into at least a first active region and a second active region, the first active region having a first type of dopant and the second region having a first or second type of dopant, both the first and second active regions being fabricated from sources or drains of CMOS devices. Both the first and second active regions can reside in a common well fabricated from CMOS wells or on an isolated substrate. At least one of the first or the second active regions can be coupled together by at least one extended source/drain. The first active region can be coupled to the resistive element and the second active region can be coupled to a second supply voltage line. The MOS gate can be coupled to a third supply voltage line. The programming of the logic state into at least one of the OTP cells can be achieved by applying voltages to the first, second, and/or third voltage lines.

As a One-Time Programmable (OTP) memory, one embodiment can, for example, include at least a plurality of OTP cells. At least one of the OTP cells can include at least a resistive element, and at least one semiconductor fin structure residing in a common well or on an isolated substrate. The semiconductor fin structure includes a plurality of fins, at least one of the plurality of fins being covered by at least one MOS gate to divide the at least one of the plurality of fins into the first active region coupled to one end of the resistive element, the other end of the resistive element being coupled to a first voltage supply line, the second active region being coupled to a second voltage supply line, and the MOS gate being coupled to a third voltage supply line. The first and/or the second active regions of two or more of the plurality of fins can be coupled together by at least one extended source/drain. The resistive element can be configured to be programmable into a different resistance state by applying voltages to the first, second, and the third voltage supply lines.

BRIEF DESCRIPTION OF THE DRAWINGS

The present invention will be readily understood by the following detailed descriptions in conjunction with the accompanying drawings, wherein like reference numerals designate like structural elements, and in which:

FIG. 3(a2) shows an equivalent circuit corresponding to the FinFET in FIG. 3(a1).

FIG. 5(a2) shows a top view of diodes corresponding to FIG. 5(a1).

FIG. 6(b2) shows a top view of OTP cells corresponding to FIG. 6(b1).

FIG. 6(b3) shows a 3D view of an OTP cell using a diode in FinFET as a program selector, part of the fin as an OTP element, and SiGe in raised S/D for further interconnect, according to one embodiment.

FIG. 6(c1) shows a top view of OTP cells using diodes in FinFETs as program selectors and extended source/drain regions as OTP elements, according to another embodiment.

FIG. 6(c2) shows an equivalent circuit of OTP cells corresponding to FIG. 6(c1).

FIG. 6(d1) shows a top view of OTP cells using MOS devices in FinFETs as program selectors and extended source/drain regions as OTP elements, according to another embodiment.

FIG. 6(d2) shows an equivalent circuit of OTP cells corresponding to FIG. 6(d1).

FIG. 6(e0) shows a schematic diagram of a single programmable resistive device cell.

FIG. 6(e1) shows a top view of a programmable resistive device cell, corresponding to the schematic diagram in FIG. 6(e0), according to one embodiment of the invention.

FIG. 6(e2) shows a top view of a programmable resistive device cell, corresponding to the schematic diagram in FIG. 6(e0), according to another embodiment of the invention.

FIG. 6(e3) shows a top view of a programmable resistive device cell, corresponding to the schematic in FIG. 6(e0), according to yet another embodiment of the invention.

FIG. 7(a2) shows an equivalent circuit of OTP cells corresponding to FIG. 7(a1).

FIG. 8(*a*2) shows an equivalent circuit of OTP cells corresponding to FIG. 8(*a*1).

FIG. 9(*a*2) shows an equivalent circuit of OTP cells corresponding to FIG. 9(*a*1).

FIG. 9(*b*1) shows a top view of OTP cells using diodes in FinFETs as program selectors and interconnects as OTP elements, according to another embodiment.

FIG. 9(*b*2) shows an equivalent circuit of OTP cells corresponding to FIG. 9(*b*1).

FIG. 9(*c*1) shows an electrical fuse element according to one embodiment.

FIG. 9(*c*2) shows an electrical fuse element with a small body and slightly tapered structures according to another embodiment.

FIG. 9(*c*3) shows an electrical fuse element with a thermally conductive but electrically insulated heat sink in the anode according to another embodiment.

FIG. 9(*c*4) shows an electrical fuse element with a thinner oxide near the anode as a heat sink according to another embodiment.

FIG. 9(*c*5) shows an electrical fuse element with at least one notch in the body according to another embodiment.

FIG. 9(*c*6) shows an electrical fuse element with part NMOS metal gate and part PMOS metal gate according to another embodiment.

FIG. 9(*c*7) shows an electrical fuse element with a segment of polysilicon between two metal gates according to another embodiment.

FIG. 9(*c*8) shows a diode constructed from a polysilicon between two metal gates according to another embodiment.

FIG. 10(*b*) shows a top view of 2×4 OTP cell array using diodes in FinFETs as program selectors, according to another embodiment.

FIG. 11(*a*2) shows an equivalent circuit corresponding to FIG. 11(*a*1).

FIG. 11(*b*1) shows a top view of 1×4 reversible programmable resistive cells using MOS devices as program selectors and PCM built inside contact holes, according to the present invention.

FIG. 11(*b*2) shows an equivalent circuit corresponding to FIG. 11(*b*1).

FIG. 12(*a*2) shows an equivalent circuit corresponding to FIG. 12(*a*1).

FIG. 12(*b*1) shows a top view of 1×4 reversible programmable resistive cells using diodes as program selectors and planar PCM, according to the present invention.

FIG. 12(*b*2) shows an equivalent circuit corresponding to FIG. 12(*b*1)

FIG. 13(*a*2) shows an equivalent circuit corresponding to FIG. 13(*a*1).

FIG. 13(*b*1) shows a top view of 1×2 MRAM cells using diodes as 0 and 1 program selectors and Magnetic Tunnel Junctions (MTJs) as resistive elements, according to another embodiment.

FIG. 13(*b*2) shows an equivalent circuit corresponding to FIG. 13(*b*1).

FIG. 14(*a*2) shows an equivalent circuit of contact-fuse cells corresponding to FIG. 14(*a*1).

FIG. 14(*b*1) shows a top view of contact-fuse cells using diodes in FinFETs as program selectors and contacts as OTP elements, according to another embodiment.

FIG. 14(*b*2) shows an equivalent circuit of contact-fuse cells corresponding to FIG. 14(*b*1).

FIG. 16(*b*) shows another embodiment of constructing a portion of MRAM memory with 2-terminal MRAM cells.

FIG. 18(*b*) shows a schematic of a bitline circuit according to one embodiment.

FIG. 18(*c*) shows a portion of memory with an internal power supply VDDP coupled to an external supply VDDPP and a core logic supply VDD through power selectors.

FIG. 19(*b*) shows one embodiment of a schematic of an amplifier according to one embodiment.

FIG. 19(*c*) shows a timing diagram of the pre-amplifier and the amplifier in FIGS. 19(*a*) and 19(*b*), respectively.

FIG. 20(*b*) shows level shifters according to one embodiment.

FIG. 20(*c*) shows another embodiment of an amplifier with current-mirror loads.

FIG. 20(*d*) shows another embodiment of a pre-amplifier with two levels of PMOS pullup stacked so that all core devices can be used.

FIG. 20(*e*) shows another embodiment of a pre-amplifier with an activation device for enabling.

FIG. 21(*b*) depicts a method of reading a programmable resistive memory in a flow chart according to one embodiment.

DETAILED DESCRIPTION OF EMBODIMENTS OF THE INVENTION

Embodiments disclosed herein use a junction diode or MOS in standard FinFET technologies as program selector for a programmable resistive device. The diode can comprise P+ and N+ active regions on an N well or on an isolated active region. Since the P+ and N+ active regions and N well and/or isolated active region are readily available in standard FinFET processes, these devices can be formed in an efficient and cost effective manner. For standard FinFET technologies, extended source/drain regions or part of fins are isolated active regions that can be used to construct diodes as program selectors or even One-Time Programmable (OTP) element. There are no additional masks or process steps to save costs. The programmable resistive device can also be included within an electronic system.

Figure 1A:
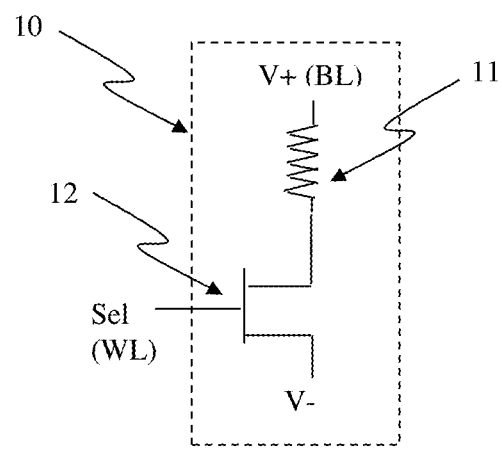
FIG. 1(a) shows a conventional programmable resistive memory cell using MOS as program selector.
Figure 1B:
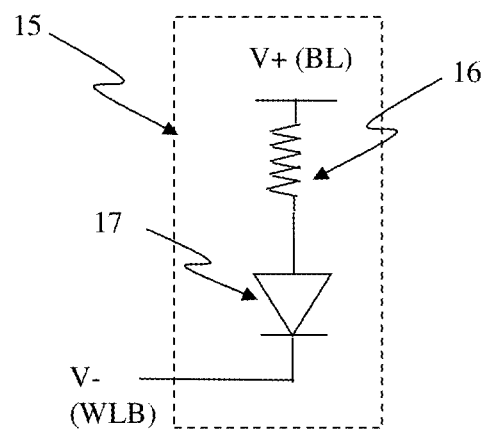
FIG. 1(b) shows another programmable resistive memory cell using diode as program selector.
Figure 2A:
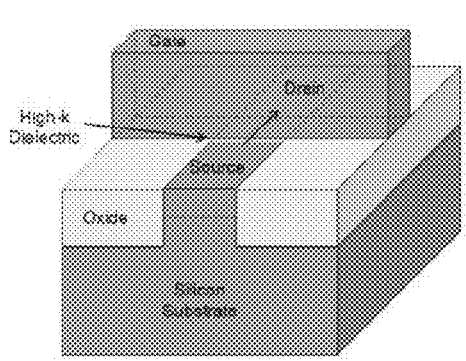
FIGS. 2(a), 2(b), and 2(c) show 3D conceptual views of planar CMOS, FinFET bulk, and FinFET SOI devices, respectively.
Figure 2B:
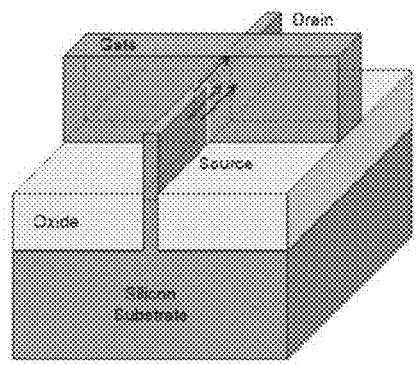
Figure 2C:
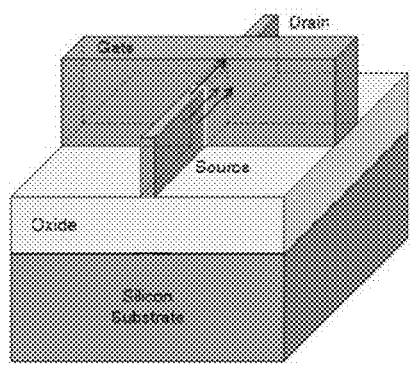
Figures 2D, 2E:
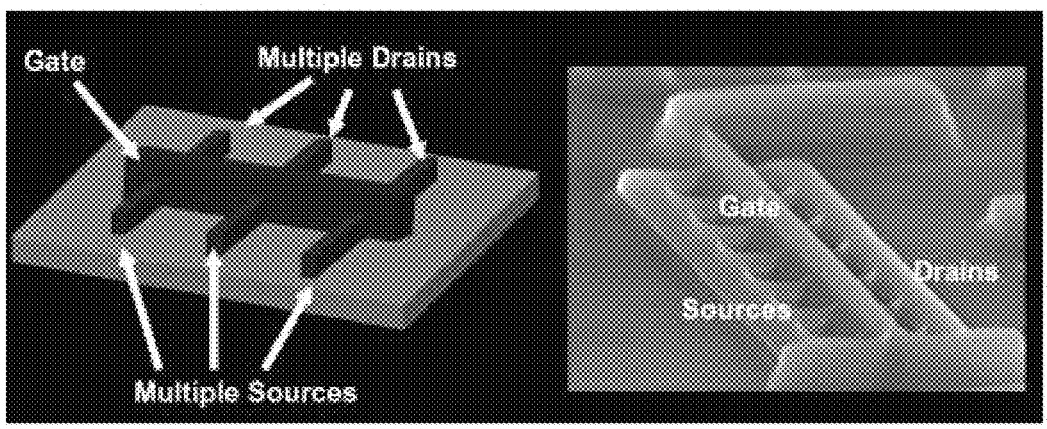
FIG. 2(d) shows a 3D conceptual view of a three-fin FinFET device without extended source/drain regions.
FIG. 2(e) shows a SEM photo of a multi-fin FinFET with extended source/drain regions built between fins.
Figure 2F:
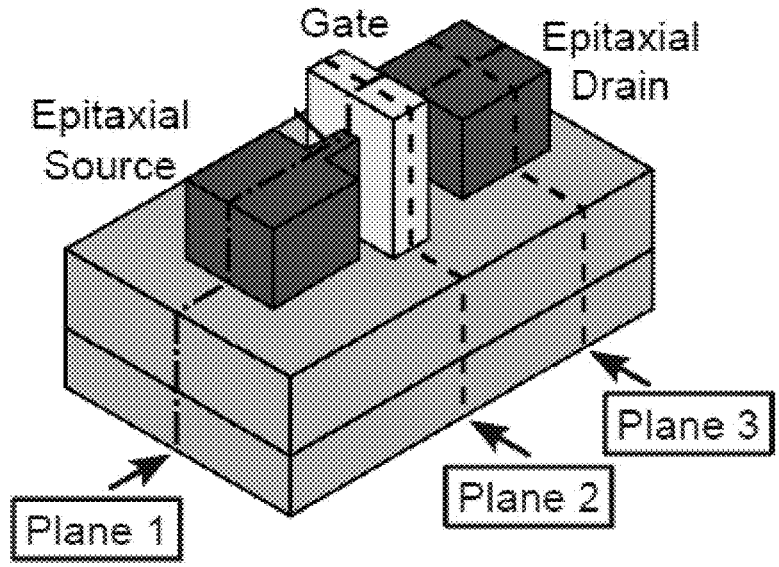
FIG. 2(f) shows anther 3D view of a FinFET showing more structure details.
Figure 2:
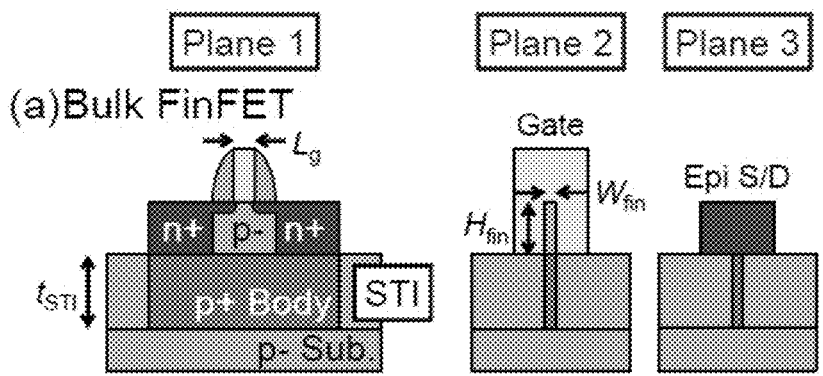
FIGS. 2(fa) and 2(fb) show cross sections of 3 different planes of a FinFET, corresponding to FIG. 2(f), for bulk and SOI FinFET technologies, respectively.
Figure 2:
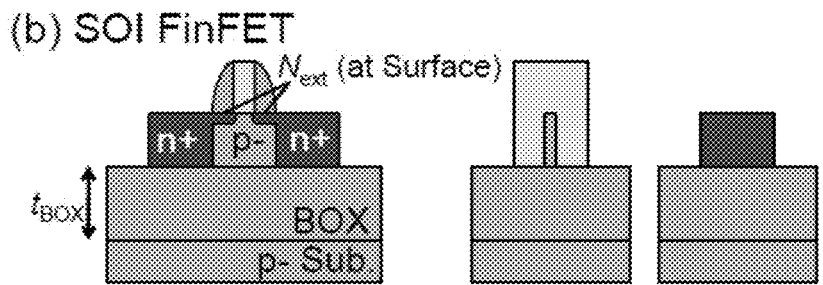
Figure 3:
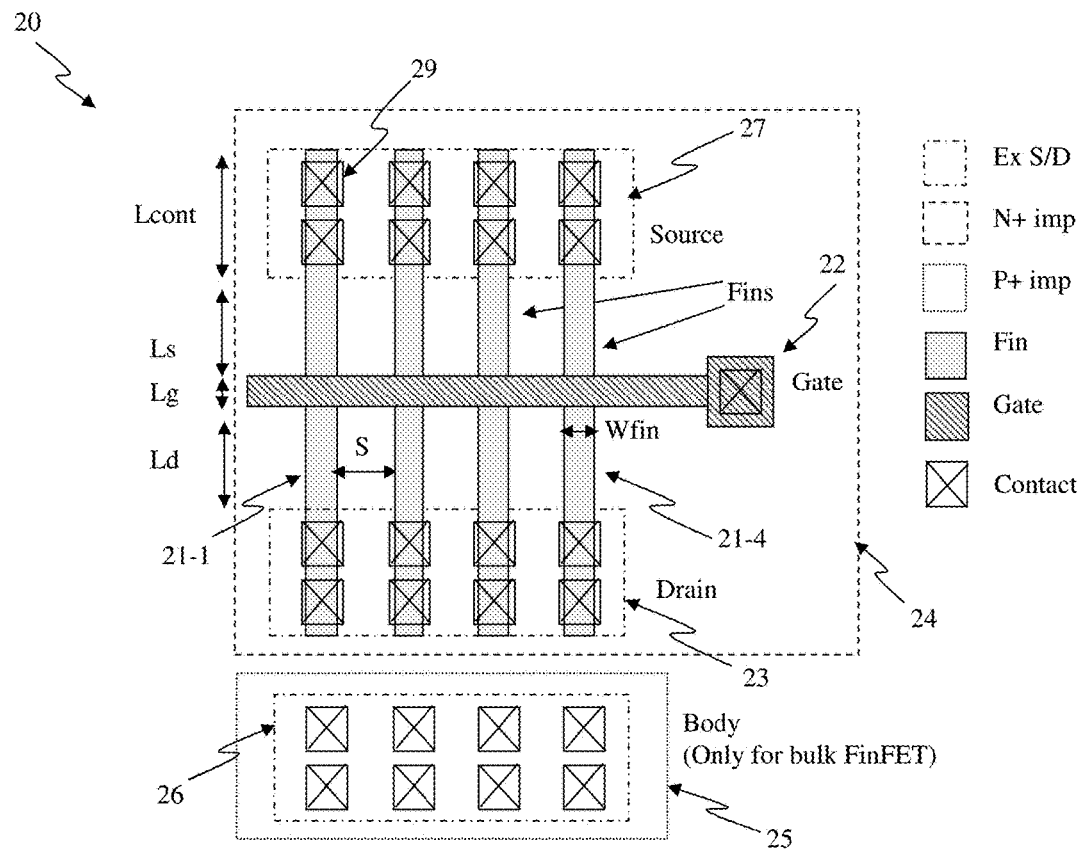
FIG. 3(a1) shows a top view of a multi-fin FinFET, loosely corresponding to FIGS. 2(b), 2(c), 2(d), and 2(e).
Figure 3:
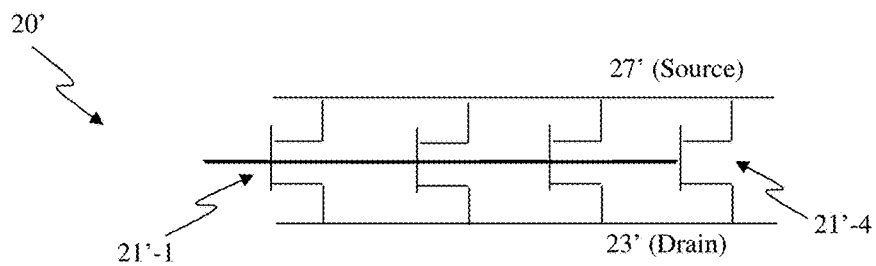
Figure 4:
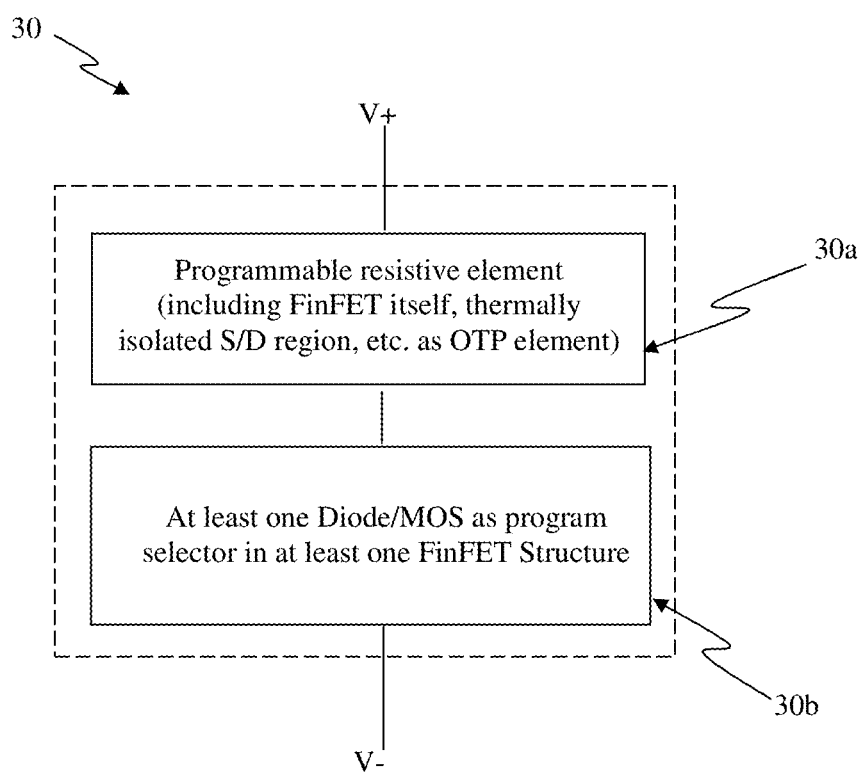
FIG. 4 shows a block diagram of a programmable resistive cell in FinFET technologies according to the present invention.

FIG. 4 shows a block diagram of a memory cell 30 using a FinFET diode or MOS in FinFET structures or isolated active region as program selector coupled to a programmable resistive element, according to the present invention. In particular, the memory cell 30 includes a resistive element 30a and at least a diode or MOS 30b built in FinFET structures. The resistive element 30a can be coupled between an anode of the diode or a drain of an MOS in at least one fin structure 30b and a high voltage V+. A cathode of the diode or the source of the FinFET 30b can be coupled to a low voltage V−. The gate of the FinFET MOS 30b can be a select signal (Sel). By applying proper voltages to V+, V−, and/or the gate of a FinFET MOS for a proper duration of time, the resistive element 30a can be programmed into high or low resistance states, depending on magnitude, duration, current/voltage limit, and/or direction of the current, thereby programming the memory cell 30 to store a data value (e.g., bit of data). The coupling of the resistive element 30a and the diode or MOS 30b between the supply voltages V+ and V− can be interchanged in another embodiment.

The resistive element 30a in FIG. 4 can be a One-Time Programmable (OTP) element, such as fuse, for example, interconnect fuse, contact fuse, or via fuse, or can be an anti-fuse based on dielectric, gate-oxide, junction, or source/drain breakdown, or source/drain punch-through. The interconnect can be polysilicon, silicided polysilicon, silicide, polymetal, metal, metal alloy, local interconnect, thermally isolated active region, CMOS gate, or some combination thereof. CMOS gate can be polysilicon gate or non-aluminum metal gate. Particularly, the FinFET structure itself or the extended source/drain region can be used as an OTP element for programming. Even a diode can be constructed from an extended source/drain region as a program selector. The resistive element can be a reversible programmable resistive element, such as in the memory cells of PCRAM, RRAM, or CBRAM, that can be programmed reversibly and repetitively. The resistive element can also be a Magnetic Tunnel Junction (MTJ) or other types of memory element that can be programmed based on the directions of the current.

The FinFET diode or MOS 30b in FIG. 4 can serve as a program selector of the memory cell 30. The FinFET diode can be constructed from at least one P+ fin with at least one N well tap in FinFET technologies. The FinFET diode can also be constructed from at least one fin structure with a dummy gate across to divide the fin structure into two regions that are further covered by N+ and P+ implants, respectively, to serve as N and P portions of the diode. In another embodiment, a FinFET diode can also be constructed from at least one fin structure with a Silicide Block Layer (SBL) across to divide the fin structure into two regions, and both regions are further covered by N+ and P+ implants to serve as N and P portions of the diode. The N+ and P+ implants can be separated with a gap. The SBL covers the gap and overlaps into both regions. The doping concentration in the gap region can be slightly N, P, or unintended doped. The width or the doping level in the gap can be used to adjust the breakdown voltage or leakage of the diode. The FinFET structure can be inside an N well, an N well in standard CMOS. The N+ and P+ implants can be the source or drain implant in a standard CMOS. If there is no silicide available, the SBL can be omitted in another embodiment. In another embodiment, at least one fin in FinFET MOS can be used as program selector. In yet another embodiment, at least one fin in FinFET MOS can be constructed as diode-connect (i.e. gate coupled to drain) as program selector. In yet another embodiment, an extended source/drain, part of a fin, or a thermally isolated active region can be implanted with part N and part P to constitute a diode as program selector. Alternatively, the diode can be constructed from at least one N+ fin with at least one P well tap in a triple-well process or using an N type substrate.

Figure 5:
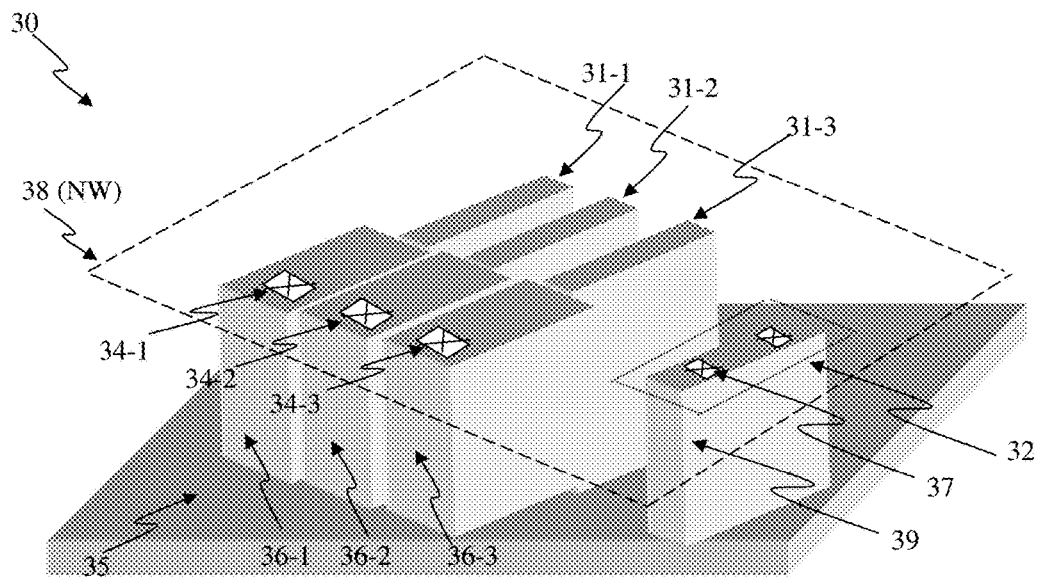
FIG. 5(a1) shows a 3D view of diodes constructed from P type fins with an N well tap in a FinFET technology.
Figure 5:
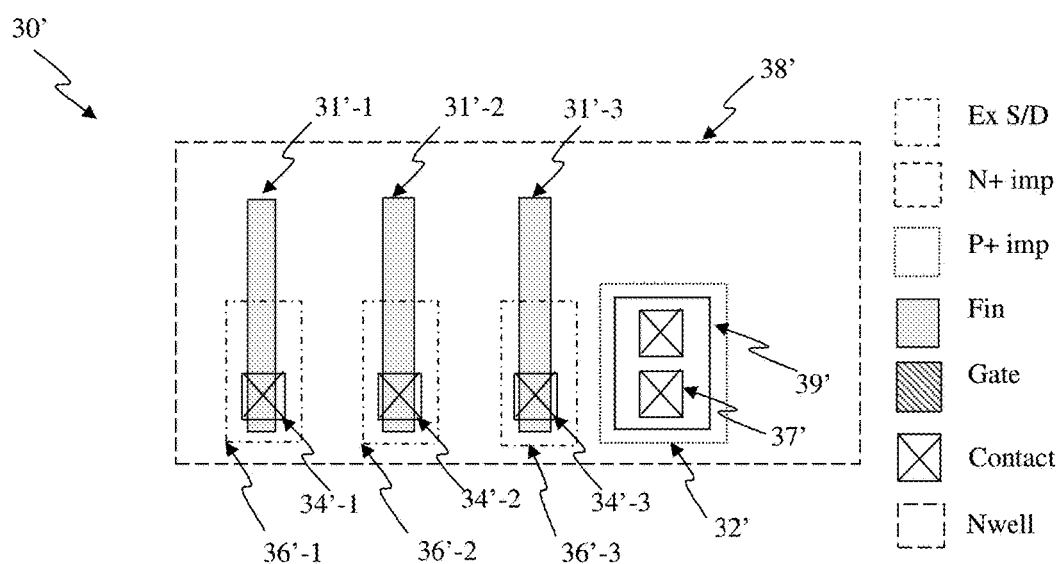

FIG. 5(a1) shows a 3D view of diodes 30 constructed from fin structures 31-1,2,3 on a substrate with field oxide 35 in a FinFET technology, according to one embodiment. The diodes 30 can, for example, be used as the program selector 30b illustrated in FIG. 4. Diodes 30 are constructed from fins 31-1,2,3 inside an N well 38. One end of the fins 31-1,2,3 are coupled to extended source/drain regions, 36-1,2,3, with contacts 34-1,2,3 on top to couple to other interconnects (not shown), respectively. At least one N well tap has an active area 39, N+ implant 32, and contacts 37 to serve as the N terminal of the diodes. The active area 39 can rise from the substrate 35 like fins, can be extended source/drain region, part of a fin, or can be on the substrate 35 without oxide built on top. P+ implant (not shown in FIG. 5(a1)) is a complement of the N+ implant 32 that covers the fins 31-1,2,3 and extended source/drains 36-1,2,3, which serve as the P terminals of the diodes 30. A resistive element (not shown) can be coupled to each of the extended source/drain regions 36-1,2,3 and to a first supply voltage. The N terminal of the diodes 30 can be coupled to a second supply voltage. To program this resistive device, high and low voltages can be applied to the first and second supply voltage to conduct a current flowing through. Thus the resistive element can be programmed into high or low resistance state, depending on the magnitude, duration, current/voltage limit, and/or current direction. FIG. 5(a2) shows a top view of the diodes 30′, corresponding to the diodes 30 in FIG. 5(a1).

Figure 5B:
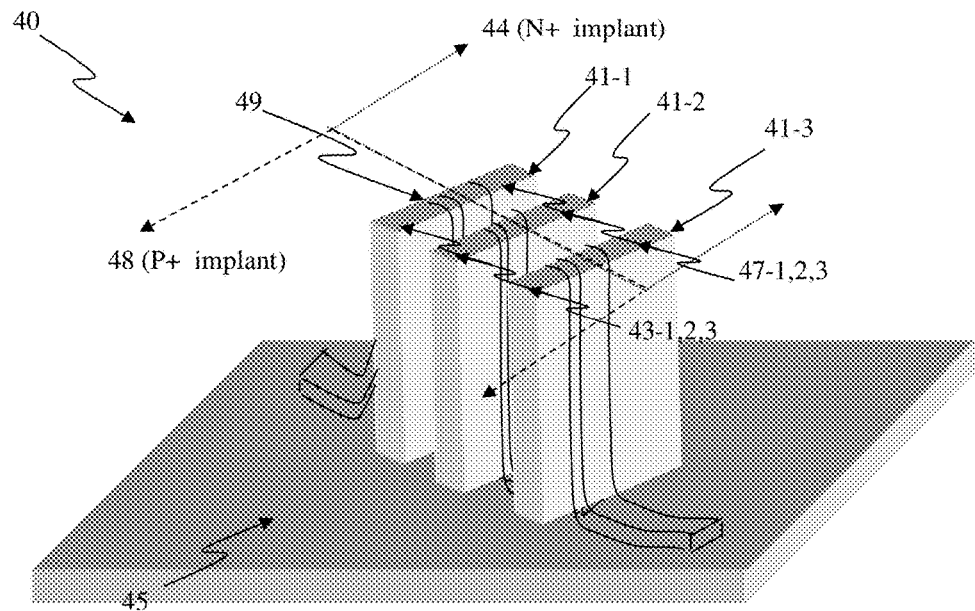
FIG. 5(b) shows a 3D view of diodes constructed from FinFETs with a dummy gate across and N+/P+ implants on two ends of the fins and the dummy gate.

FIG. 5(b) shows a 3D view of diodes 40 constructed from fin structures 40-1,2,3 using dummy gate isolation on a substrate with field oxide 45 in a FinFET technology, according to another embodiment. The diodes 40 can, for example, be used as the program selector 30b illustrated in FIG. 4. Diodes 40 are constructed from fins 41-1,2,3 with a dummy MOS gate 49 across to divide the fins into 43-1,2,3 and 47-1,2,3 regions, respectively, which are further covered by P+48 and N+44 implants, respectively. The N+47-1,2,3, and P+43-1,2,3 regions of the fins 41-1,2,3 can be built with extended source/drain regions and contacts (not shown) to serve as P and N terminal of the diodes, respectively. A resistive element (not shown) can be coupled to the P terminal of the diodes 40 and to a first supply voltage. The N terminal of the diodes 40 can be coupled to a second supply voltage. To program the programmable resistive device, high and low voltages can be applied to the first and second supply voltage to conduct a current flowing through the resistive element. Thus, the resistive element can be programmed into high or low resistance state, depending on the magnitude, duration, current/voltage limit, and/or current direction.

Figure 5C:
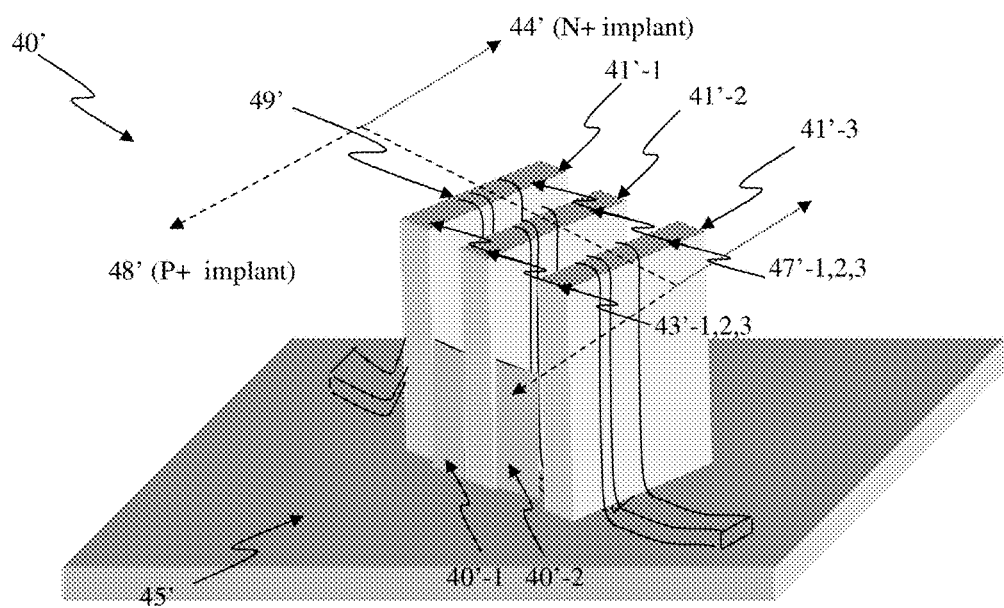
FIG. 5(c) shows a 3D view of diodes constructed from FinFETs with a dummy gate across, N+/P+ implants on two ends of the fins and the dummy gate, and extended source/drains between fins.

FIG. 5(c) shows a 3D view of diodes 40' constructed from fin structures 40'-1,2,3 using dummy gate isolation on a substrate with field oxide 45' in a FinFET technology, according to another embodiment. The diodes 40' can, for example, be used as the program selector 30b illustrated in FIG. 4. Diodes 40' are constructed from fins 41'-1,2,3 with a dummy MOS gate 49' across to divide the fins into 43'-1,2,3 and 47'-1,2,3, respectively, which are further covered by P+48' and N+44' implants, respectively. The N+47'-1,2,3, and P+43'-1,2,3 regions of the fins 41'-1,2,3 can be built with extended source/drain regions 40'-1 and 40'-2 to serve as N and P terminal of the diodes, respectively. The extended source/drain 40'-1 and 40'-2 can be fabricated from polysilicon, polycrystalline SiGe, lateral epitaxial growth silicon/SiGe, or Selective Epixatial Growth (SEG) of Silicon/SiGe, etc. A resistive element (not shown) can be coupled to the P terminal of the diodes 40' and to a first supply voltage. The N terminal of the diodes 40' can be coupled to a second supply voltage. To program the programmable resistive device, high and low voltages can be applied to the first and second supply voltage to conduct a current flowing through the resistive element. Thus, the resistive element can be programmed into high or low resistance state, depending on the magnitude, duration, current/voltage limit, and/or current direction. The extended source/drain regions 40'-1 and 40'-2 can be built between fins or can be extended from the ends of the fin structures. The extended source/drain 40'-1,2 can be filled up to the fin height in another embodiment.

Figure 5D:
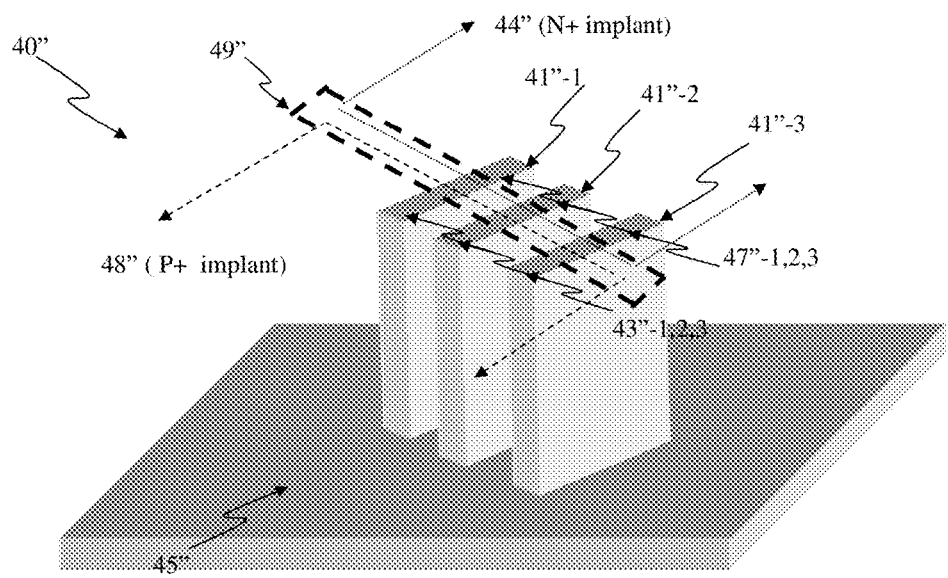
FIG. 5(d) shows a 3D view of diodes constructed from FinFETs with a silicide block layer isolation across and N+/P+ implants on two ends of the fins and the silicide block layer.

FIG. 5(d) shows a 3D view of diodes 40" constructed from fin structures 41"-1,2,3 using silicide block layer (SBL) 49" isolation on a substrate with field oxide 45" in a FinFET technology, according to another embodiment. The diodes 40" can, for example, be used as the program selector 30b illustrated in FIG. 4. Diodes 40" are constructed from fins 41"-1,2,3 with a SBL 49" across to divide the fins into 43"-1,2,3 and 47"-1,2,3 regions, respectively, which are further covered by P+48" and N+44" implants, respectively. The N+47"-1,2,3, and P+43"-1,2,3 regions of the fins 41"-1,2,3 can be built with extended source/drain regions and contacts (not shown) to serve as N and P terminal of the diodes, respectively. The P+48" and the N+44" can be separated with a space. The SBL 49" covers the space and overlaps into both regions. The dopants in the space region can be slightly N, P, or unintended doped. The width of the space and doping level in the space region can be used to adjust the diode's breakdown voltage or leakage current. A resistive element (not shown) can be coupled to the P terminal of the diodes and to a first supply voltage. The N terminal of the diodes 40" can be coupled to a second supply voltage. To program this programmable resistive device, high and low voltages can be applied to the first and second supply voltage to conduct a current flowing through the resistive element. Thus, the resistive element can be programmed into high or low resistance state, depending on the magnitude, duration, current/voltage limit, and/or current direction. If there is no silicide on top of the fins, the SBL layer can be omitted in another embodiment.

Figure 6A:
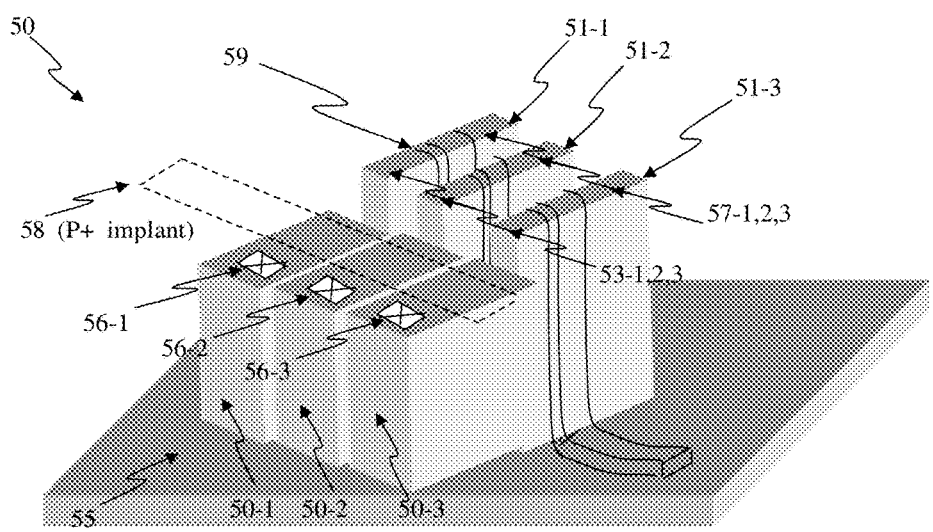
FIG. 6(a) shows a 3D view of OTP cells using MOS devices in FinFETs as program selectors and extended source/drain regions as OTP elements, according to one embodiment of the present invention.

FIG. 6(a) shows a 3D view of OTP cells 50 constructed from fin structures 51-1,2,3 and extended source/drain regions 50-1,2,3 as MOS program selector and OTP elements, respectively, on a substrate with field oxide 55 in a FinFET technology, according to another embodiment. The cells 50 can, for example, be used as the programmable resistive cell 30 illustrated in FIG. 4. MOS devices are constructed from fins 51-1,2,3 with a gate 59 across to divide the fins into drains 53-1,2,3 and sources 57-1,2,3, respectively. The drains 53-1,2,3 of the FinFETs 51-1,2,3 can be built with extended source/drain regions 50-1,2,3, and contacts 56-1,2,3 on top to couple to first supply voltage lines, respectively. The extended source/drain regions 50-1,2,3 serve as OTP elements and can be covered by part P+ implant 58 and part N+ implant (the complement of P+58). The OTP elements can be built as parts of the fin structure in another embodiment. The sources 57-1,2,3 can be built with extended source/drain regions and contacts (not shown) to further coupled to a second supply voltage. To program this programmable resistive device, high and low voltages can be applied to the first and second supply voltages to conduct a current flowing through the OTP elements 50-1,2,3. Thus, the OTP elements 50-1,2,3 can be programmed into high or low resistance state, depending on the magnitude and duration of the current. By integrated the OTP elements 50-1,2,3 and program selectors 51-1,2,3 into the same fin structures, the areas can be saved and thus the costs can be lower. The OTP elements 50-1,2,3 can be all N, P, part N and part P in other embodiments. Particularly, the OTP elements 50-1,2,3 can have N/P or P/N junction in the current direction for breakdown in another embodiment. The FinFETs can be NMOS or PMOS and/or can be a single or a plurality of fins in another embodiment. The FinFET can be diode-connect by tying the gate to drain as program selector in yet another embodiment. The MOS gate 59 can be polysilicon or metal gate. The bodies of the OTP element 50-1,2,3, excluding the contact areas, can have a length-to-width ratio of between 0.5 to 10, preferably. The width of the bodies can be the same as the contact area or can be narrower than the contact areas. The contact can be a single or a plurality in other embodiments, but preferably no more than two for better results. The contact size can be larger than at least one contact outside of the OTP memory array. The contact enclosure can be smaller than at least one contact enclosure outside of the OTP memory array in another embodiment.

Figure 6:
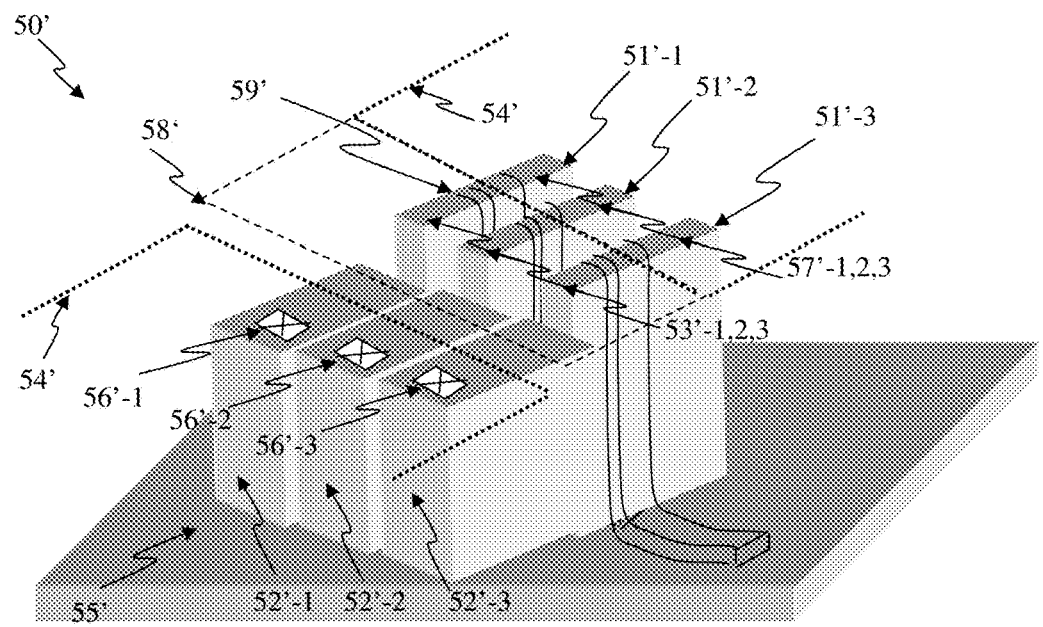
FIG. 6(b1) shows a 3D view of OTP cells using diodes in FinFETs as program selectors and extended source/drain regions as OTP elements, according to one embodiment of the present invention.
Figure 6:
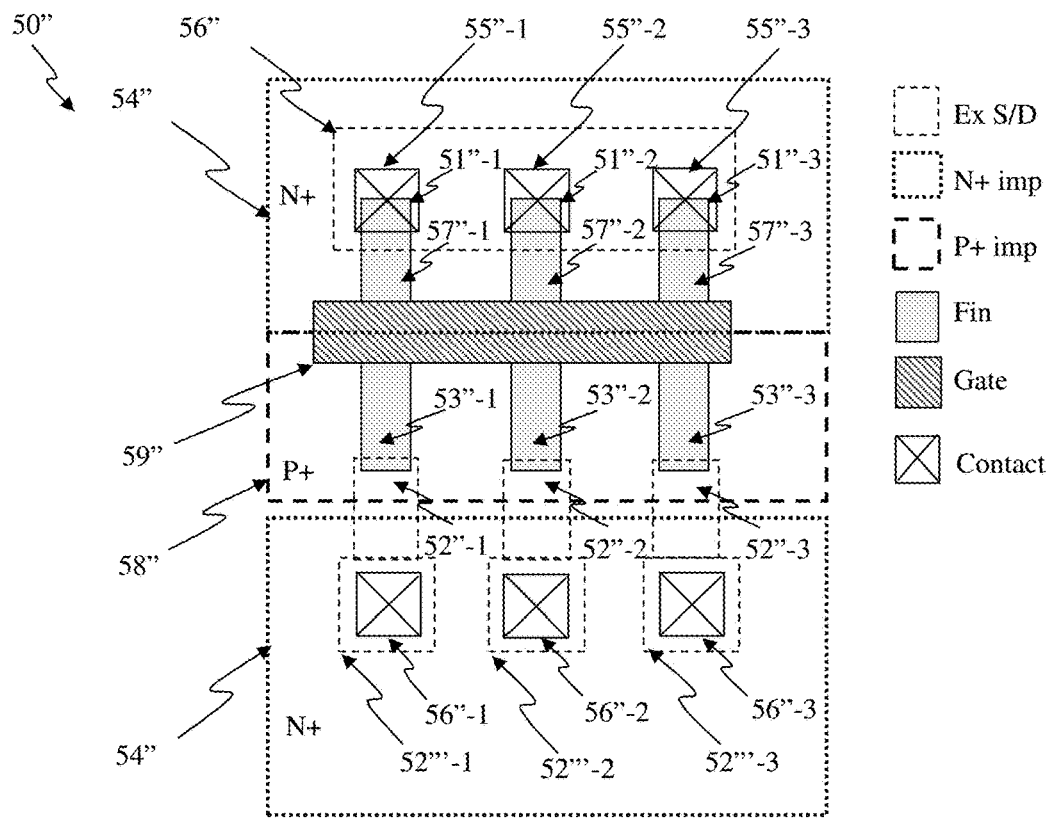
Figure 6:
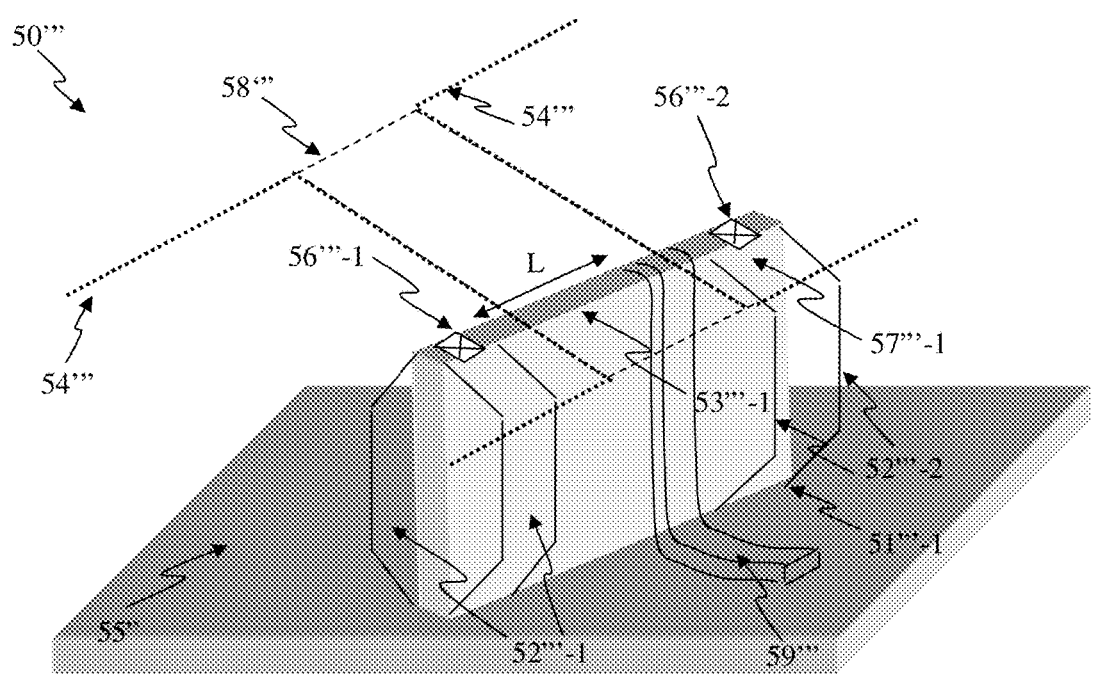
Figure 6:
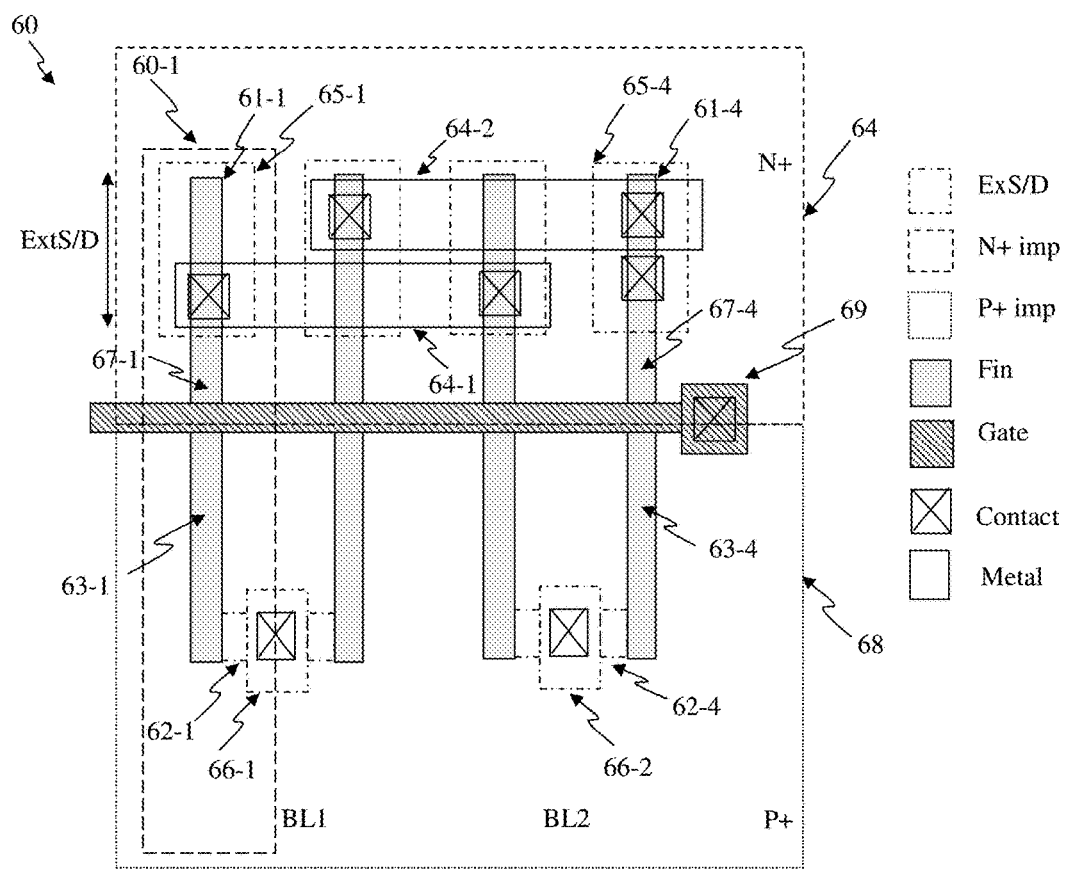
Figure 6:
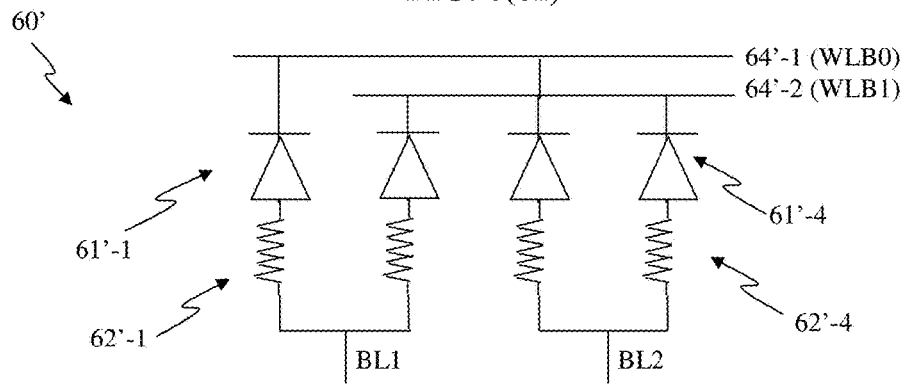
Figure 6:
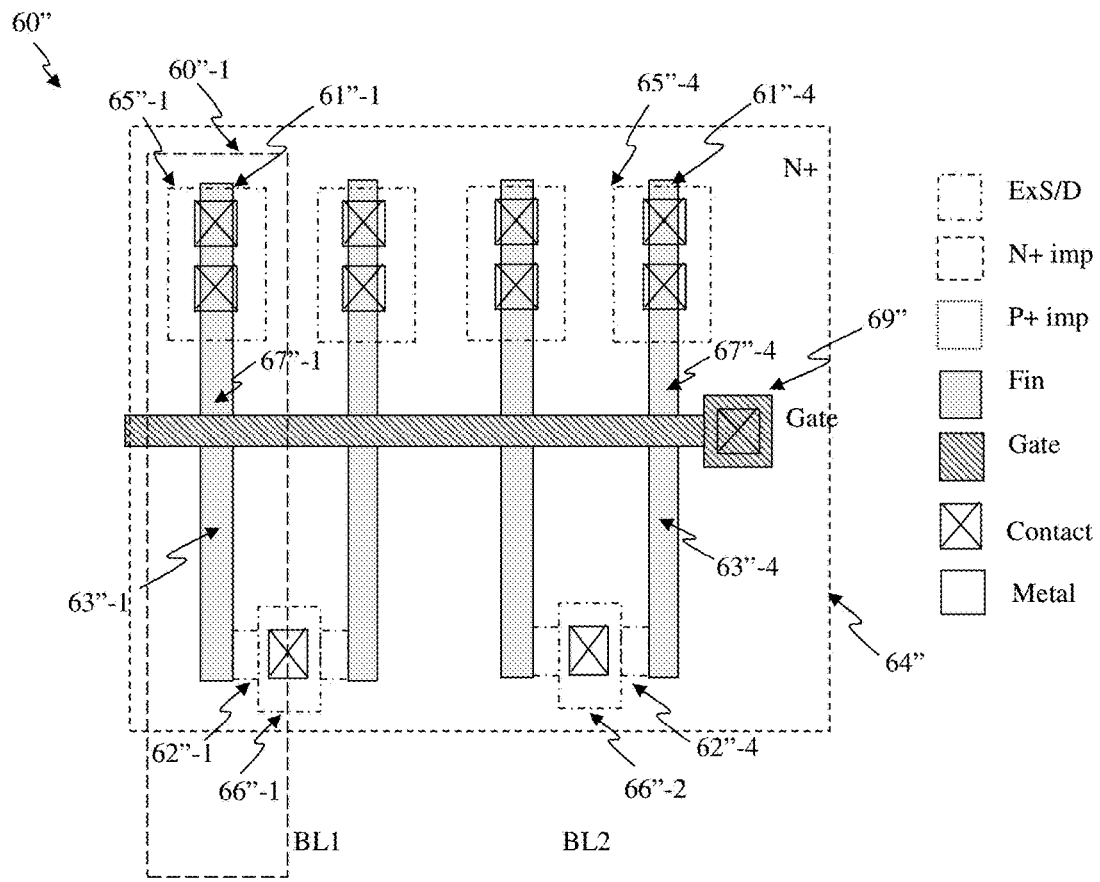
Figure 6:
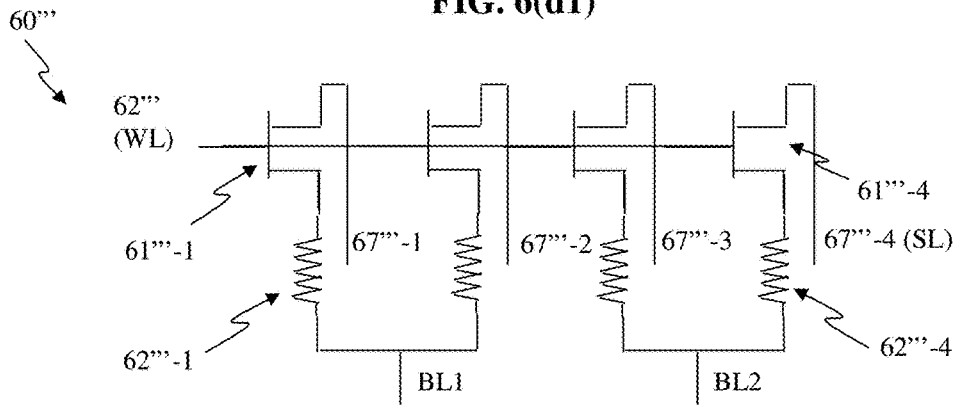
Figure 6:
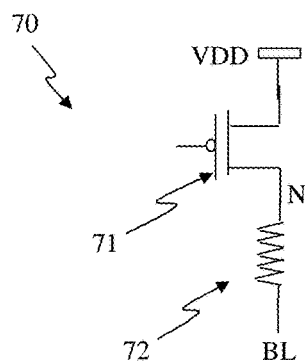
Figure 6:
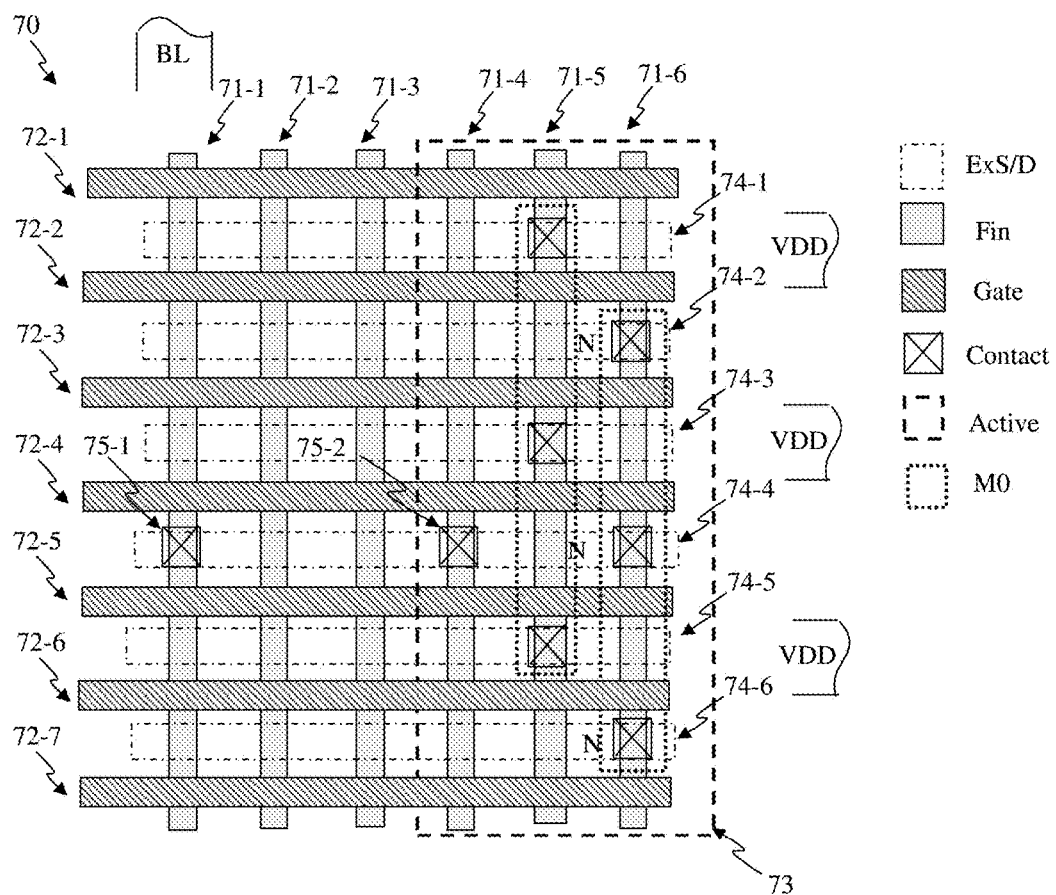
Figure 6:
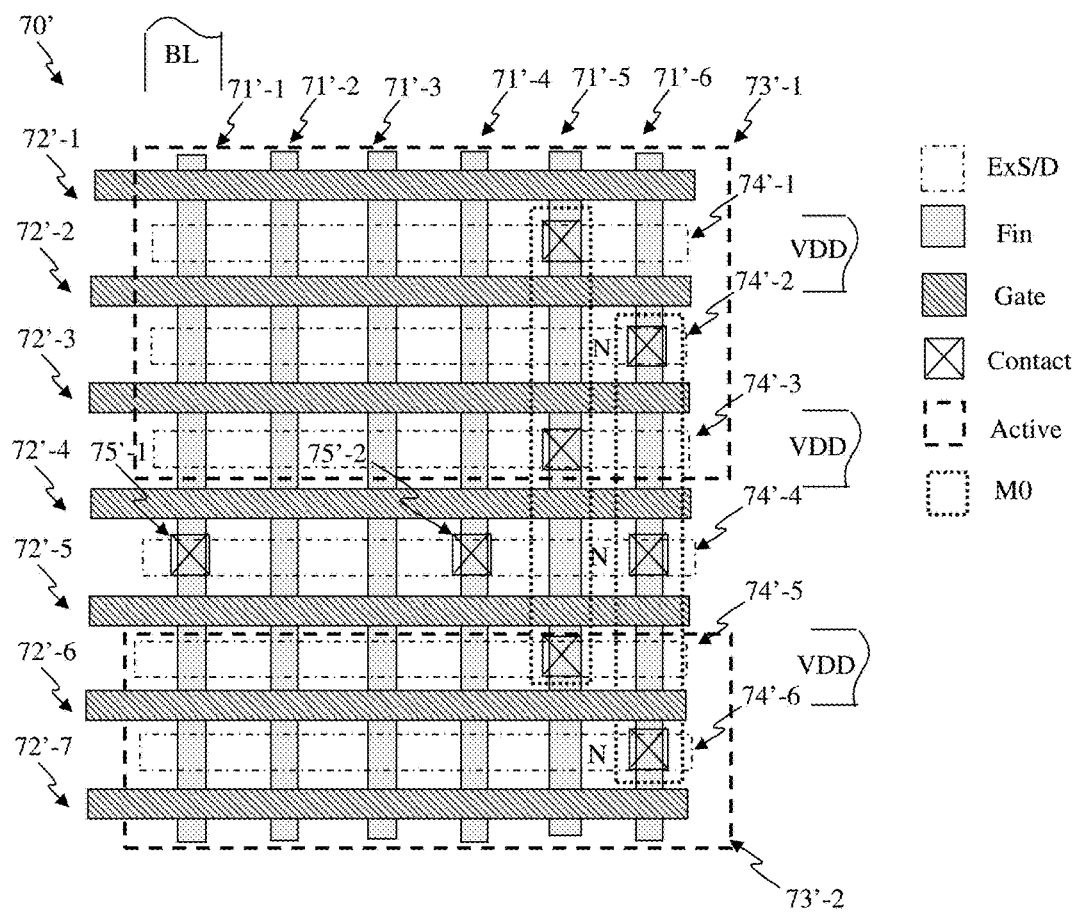
Figure 6:
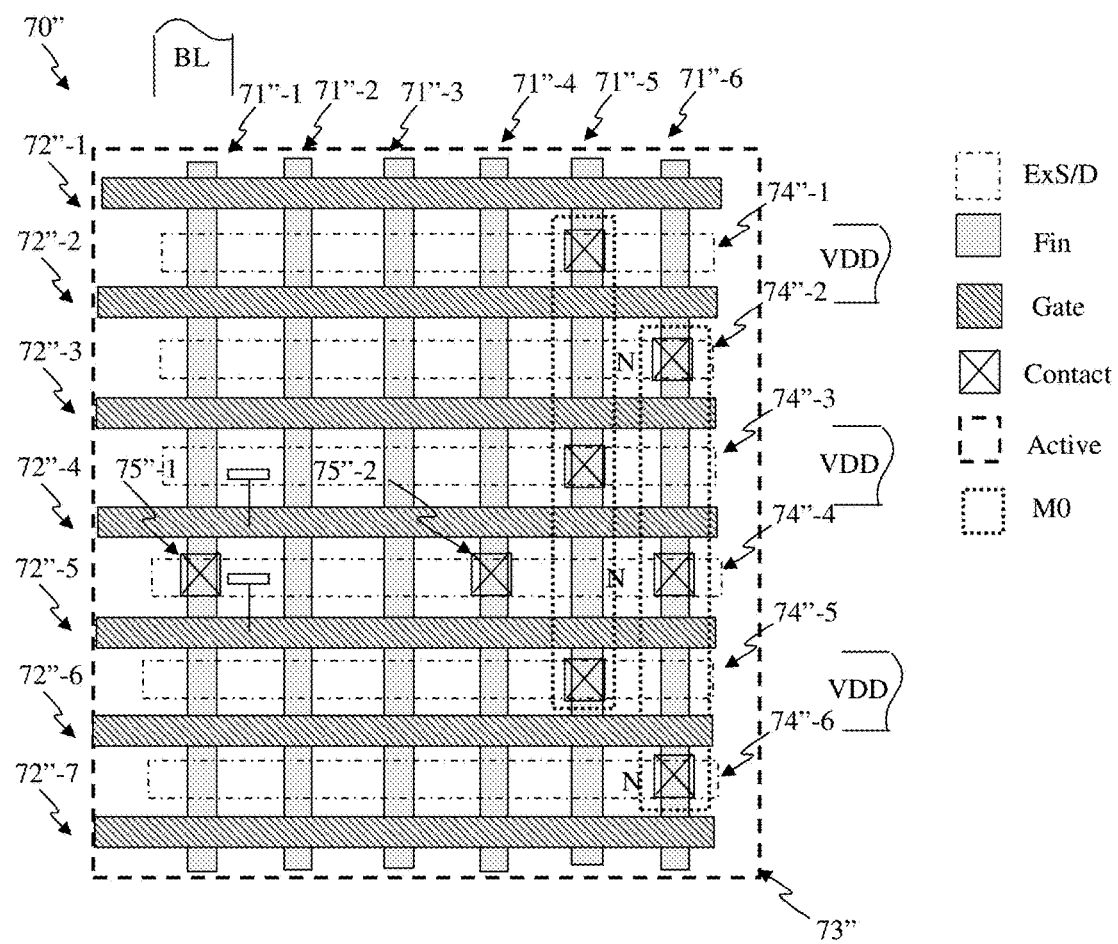

FIG. 6(b1) shows a 3D view of OTP cells 50' constructed from fin structures 51'-1,2,3 and extended source/drain regions as diode program selector and OTP elements, respectively, on a substrate with field oxide 55' in a FinFET technology, according to one embodiment. The cells 50' are very similar to the cells 50 in FIG. 6(a1) except that the fins are constructed as diodes with a dummy gate, instead of MOS devices. The cells 50' can, for example, be used as the programmable resistive cell 30 illustrated in FIG. 4. Diodes 50' are constructed from fins 51'-1,2,3 with a dummy gate 59' across to divide the fins into 53'-1,2,3 and 57'-1,2,3 regions, respectively, which are further covered by P+ implant 58' and N+ implant 54' to serve as P and N terminals of the diodes. The regions 53'-1,2,3 of the FinFETs 51'-1,2,3 can be built with extended source/drain regions 52'-1,2,3, and contacts 56'-1,2,3 to couple to first supply voltage lines, respectively. The extended source/drain regions 52'-1,2,3 serve as OTP elements and can be covered by part P+ implant 58' and part N+ implant 54'. The OTP elements can be built as parts of the fin structure in another embodiment. The regions 57'-1,2,3 can be built with extended source/drain regions and contacts (not shown in FIG. 6(b1)) and to further coupled to a second supply voltage. To program this programmable resistive device, high and low voltages can be applied to the first and second supply voltages to conduct a current flowing through the OTP elements 52'-1,2,3. Thus, the OTP elements 52'-1,2,3 can be programmed into a high resistance state, depending on the magnitude and duration of the current. By integrating the OTP elements and program selectors into the same fin structures, area can be saved and thus the costs can be lower. The P+58' and N+54' layers over 52'-1,2,3 can be separated with a gap and the doping level in the gap region can be slightly N, P, or unintentionally doped in another embodiment. The OTP elements 52'-1,2,3 can be all N, P, part N and part P doped in other embodiments. Particularly, the OTP elements 52-1,2,3 can have N/P or P/N junction in the current direction for breakdown in another embodiment. The P and N terminals of the diode can be reversed in another embodiment. The bodies of the OTP element 52'-1,2,3, excluding the contact areas, can be narrower than the contact area or the same width as the contact area. The bodies of the OTP element 52'-1,2,3 can have a length-to-width ratio of between 0.5 to 10. The extended source/drains 52'-1,2,3 can be built extending from the ends or the side walls of the fins in other embodiments. The contacts can be a single or a plurality in other embodiments, but preferably no more than two for better results. The size of the contacts 56'-1,2,3 can be larger than at least one contact outside of the OTP memory array. The contact enclosure can be smaller than at least one contact enclosure outside of the memory array. FIG. 6(b2) shows a top view of OTP cells 50", corresponding to the OTP cells 50 shown in FIG. 6(b1), to illustrate the concepts more clearly.

FIG. 6(b3) shows a 3D view of an OTP cell 50''' constructed from a fin structure 51'''-1 using dummy gate 59''' isolation to build a diode as program selector and part of the fin as an OTP element, on a substrate with field oxide 55''' in a FinFET technology, according to one embodiment. The cells 50''' are very similar to the cells 50 in FIG. 6(a1) except that a fin is constructed as a diode using a dummy gate, instead of a MOS device. The cells 50''' can, for example, be used as the programmable resistive cell 30 illustrated in FIG. 4. The diode 50''' is constructed from fin 51'''-1 with a dummy gate 59''' across to divide the fin into 53'''-1 and 57'''-1, regions, respectively, which are further covered by P+ implant 58''' and N+ implant 54''' to serve as P and N terminals of the diodes. The region 52'''-1 of the FinFET 51'''-1 can be built using SiGe as raised source/drain to reduce resistance and with at least one contact 56'''-1 to couple to a first supply voltage line. Using SiGe in source/drain may show diamond shape of structures and may be higher than the fin height in some technologies, especially for source/drain of a PMOS. The fin 53'''-1 serves as an OTP element with a length L and can be covered by part P+ implant 58''' and part N+ implant 54'''. The region 57'''-1 can be built with similar SiGe as raised source/drain 52'''-2 and at least one contact 56'''-2 and further coupled to a second supply voltage. To program this programmable resistive device, high and low voltages can be applied to the first and second supply voltages to conduct a current flowing through the OTP element 53'''-1. Thus, the OTP element 52'''-1 can be programmed into a high resistance state, depending on the magnitude and duration of the current. By integrating the OTP element and program selector into the same fin structure, area can be saved and thus the costs can be lower. The OTP element 53'''-1 can be all N, P, part N and part P doped, silicided or non-silicided, in other embodiments. The OTP element 53'''-1 can also be N- or P-LDD region and/or can be extended to be beyond the gate spacer region so that the shallow junction of the LDD region can be programmed in another embodiment. The P and N terminals of the diode can be reversed in another embodiment. The body of the OTP element 53'''-1, excluding the contact areas, can be the same width as the fin width. The body of the OTP element 53'''-1 can have a length L to the fin width ratio of between 2 to 6. The contact can be a single or a plurality in other embodiments, but preferably no more than two for better results. The size of the contact 56'''-1 can be larger than at least one contact outside of the OTP memory array. The contact enclosure can be smaller than at least one contact enclosure outside of the memory array. In some embodiments, the contact can be replaced by metal-0, namely a local interconnect, in large area so that self-alignment can be made and the contact resistance can be reduced. Since the fin is a tall and narrow silicon island, the heat generated on the top of the fin cannot be dissipated easily so that the fin itself can be programmed by electromigration, especially when there is a silicide grown on top of the fin.

FIG. 6(c1) shows a top view of 1×4 OTP cells 60 using diodes in FinFETs as program selectors and extended source/drain regions as OTP elements in a FinFET technology, according to one embodiment. The cells 60 can, for example, be used as the programmable resistive cell 30 illustrated in FIG. 4. Diodes are constructed from fins 61-1,2,3,4 with a dummy gate 69 across to divide the fins into 63-1,2,3,4 and 67-1,2,3,4 regions, respectively, which are further covered by P+ implant 68 and N+ implant 64 to serve as P and N portions of the diodes. The regions 63-1,2,3,4 of the fins 61-1,2,3,4 can be built with extended source/drain regions 62-1,2,3,4 to serve as the OTP elements. Another extended source/drain 66-1 can be coupled between 62-1,2 and 66-2 can be coupled between 61-3,4. The OTP elements can be built as parts of the fin structure in another embodiment. The regions 66-1,2 can be slightly larger to allow contacts to further coupled to metal bitlines BL1 and BL2, respectively. The regions 67-1,2,3,4 of the fins 61-1,2,3,4 can be built with extended source/drain regions 65-1,2,3,4, respectively. The 65-1 and 65-3 are coupled by a metal 64-1 as wordline bar (WLB0) and 65-2 and 65-4 are coupled by another metal 64-2 as WLB1. To program the programmable resistive device, high and low voltages can be applied to the bitline and wordline bar, respectively, to conduct a current flowing through the OTP elements. Thus, the OTP elements can be programmed into a high resistance state, depending on the magnitude and duration of the current. In this embodiment, two adjacent fins share a common bitline and every other cell in a row share a common wordline. The bitlines and wordlines can run in the vertical and horizontal directions, respectively, to construct a two-dimensional cell array. This embodiment has advantages when the space between fins is very large that can be used to accommodate OTP elements and contacts. In another embodiment, the bitlines between fins can be separated and the wordline bars can be shared for all 4 cells in a row, when the space between fins is wide enough. FIG. 6(c2) shows an equivalent circuit corresponding to the cells shown in FIG. 6(c1).

FIG. 6(d1) shows a top view of 1×4 OTP cells 60" using FinFET MOS devices as program selectors and extended source/drain regions as OTP elements, respectively, in a FinFET technology, according to one embodiment. The cells 60" can, for example, be used as the programmable resistive cell 30 illustrated in FIG. 4. MOS devices are constructed from fins 61"-1,2,3,4 with a gate 69" across to divide the fins into drains 63"-1,2,3,4 and sources 67"-1,2,3,4 regions, respectively, which are further covered by N+ implant 64" to construct NMOS devices. The regions 63"-1,2,3,4 of the fins 61"-1,2,3,4 can be built with extended source/drain regions 62"-1,2,3,4 as the bodies of OTP elements, respectively.

Another extended source/drain 66"-1 can be coupled between 61"-1 and 61"-2 and 66"-2 can be coupled between 61"-3 and 61"-4. The regions 66"-1,2 can be slightly larger to allow contacts to further coupled to metal bitlines BL1 and BL2, respectively. The OTP elements can be built as parts of the fin structure in another embodiment. The region 67"-1,2,3,4 of the fins 61"-1,2,3,4 can be built with extended source/drain regions 65"-1,2,3,4 as source lines (SL1,2,3,4), respectively. In other embodiment, the SL1/SL3 can be shared and SL2/SL4 can be shared too. The gate 69" can be coupled to a wordline (WL). To program this programmable resistive device, suitable voltages can be applied to the bitline, source line, and wordline to turn on the MOS devices 61"-1,2,3,4 and to conduct a current flowing through the OTP elements. Thus, the OTP elements can be programmed into a high resistance state, depending on the magnitude and duration of the current. In this embodiment, two adjacent fins share a bitline and each cell has its own source line. The bitline/source line and wordline can run in the vertical and horizontal directions, respectively, to construct a two-dimensional cell array. This embodiment has advantages when the space between fins is very large that can be used to accommodate OTP elements. In another embodiment, the bitlines between fins can be separated and the source lines can be shared for all 4 cells in a row, when the space between fins is wider enough. FIG. 6(d2) shows an equivalent circuit corresponding to the cells shown in FIG. 6(d1).

In some embodiments, a MOS device built with multiple fin structures can operate as a selector for programmable resistive devices (PRDs). Extended source/drain connections between sources or drains of fins can be used as a fuse for OTP. FIG. 6(e0) shows a schematics of a PRD cell 70 having a MOS with its source coupled to a supply voltage VDD and its drain coupled to a fuse 72. The other end of the fuse 72 is coupled to a bitline (BL).

FIG. 6(e1) shows a top view of the OTP cell 70 corresponding to the schematic drawing in FIG. 6(e0), according to one embodiment. The OTP cell 70 has fins 71-1 through 71-6 running vertically and gates 72-1 through 72-7 running horizontally. Layer 73 defines an active area. MOS devices can be formed at the cross-over between fins 71-1 to 71-6 and gates 72-1 to 72-7 which are covered by active area 73. No fins will be built outside of active area mask 73. The sources or drains of the MOS device formed by fins 71-4 to 71-6 and gates 72-1 to 72-7 can be coupled together by using extended source/drain (S/D) 74-1 through 74-6. The extended S/D 74-1, 74-3, and 74-5 can be coupled as VDD by contacts and metal-0 (M0). Similarly, the extended S/D 74-2, 74-4, and 74-6 can be coupled as node N by contacts and metal-0 (M0). A fuse can be formed by using the extended S/D 74-4 outside of the area active 73 (on field), while the other portion is inside the active area mask 73 is the node N. The fuse is defined by contacts 75-1 and 75-2 on the extended S/D 74-4, with contact 75-2 coupled to node N. In this embodiment, the fuse lands on field and is perpendicular to a bank of active area without any fins underneath. In another embodiment, contact 75-1 can be multiple contacts, and/or contact 75-2 can be removed to make fuse (e.g., fuse element) length longer.

FIG. 6(e2) shows a top view of another OTP cell 70' corresponding to the schematic diagram in FIG. 6(e0), according to another embodiment. The OTP cell 70' has fins 71'-1 through 71'-6 running vertically and gates 72'-1 through 72'-7 running horizontally. Layers 73'-1 and 73'-2 define active areas. Only for the cross-over between fins 71'-1 to 71'-6 and gates 72'-1 to 72'-7 covered by active areas 73'-1 or 73'-2 can form MOS devices. No fins will be built outside of active area mask 73'-1 or 73'-2. The sources or drains of a MOS formed by 71'-1 to 71'-6 and 72'-1 to 72'-3 can be coupled together by using extended S/D 74'-1 through 74'-3. Similarly, the sources or drains of a MOS formed by 71'-1 to 71'-6 and 72'-6 to 72'-7 can be coupled together by using extended S/D 74'-5 through 74'-6. The extended S/D 74'-1, 74'-3, and 74'-5 can be coupled as VDD by contacts and metal-0 (M0). Similarly, the extended S/D 74'-2, 74'-4, and 74'-6 can be coupled as node N by contacts and metal-0 (M0). The extended S/D 74'-4, coupled to N, can have a portion to be used as a fuse defined by contacts 75'-1 and 75'-2 on the extended S/D 74'-4 with contact 75'-2 coupled to node N. The fuse lands on field and runs in parallel to two banks of active areas without any fins underneath. In another embodiment, contact 75'-1 can be multiple contacts, and/or contact 75'-2 can be removed to make fuse (e.g., fuse element) length longer.

FIG. 6(e3) shows a top view of an OTP cell 70" corresponding to the schematic diagram in FIG. 6(e0), according to yet another embodiment. The OTP cell 70" has fins 71"-1 through 71"-6 running vertically and gates 72"-1 through 72"-7 running horizontally. Layer 73" defines an active area. Active area 73' can cover the cross-over between fins 71"-1 to 71"-6 and gates 72"-1 to 72"-7 to form MOS devices. The sources or drains of the MOS form by 71"-1 to 71"-6 and 72"-1 to 72"-7 can be coupled together by using extended S/D 74"-1 through 74"-6. The extended S/D 7"4-1, 74"-3, and 74"-5 can be coupled as VDD by contacts and metal-0 (M0). Similarly, the extended S/D 74"-2, 74"-4, and 74"-6 can be coupled as N by contacts and metal-0 (M0). A fuse can be formed by using a portion of the extended S/D 74"-4. The fuse is defined by contacts 75"-1 and 75"-2 with contact 75"-2 coupled to node N. The gates 72"-4 and 72"-5 can be coupled to VDD to provide isolation for the fuse formed on 74"-4, otherwise the fuse will be shorted to the adjacent nodes. The fuse lands on active area and in parallel to MOS gates with fins underneath so that the fuse runs on a ragged surface. In another embodiment, a gate, such as 72"-4, can be used as a fuse with the nearest S/D, such as 74"-3 and 74"-5, coupled to VDD to provide isolation. A metal-gate fuse can land on field running on flat surface or land on fins running on a ragged surface. In another embodiment, contact 75"-1 can be multiple contacts, and/or contact 75"-2 can be removed to make fuse (e.g., fuse element) length longer.

FIGS. 6(e1)-6(e3) illustrate only a few of many different variations and yet equivalent embodiments. The MOS (MOS device) can be NMOS or PMOS. The number of gates and/or fins can vary. The fuse can have length to wide ratio of between 2 to 8. The fuse can have one contact at one end. The fuse can also have more contacts in one end than in the other end. The fuse can run on flat field or on (or over) ragged surface of fins. The fuse can be an extended S/D fuse between two disabled gates (MOS turned off) which can provide isolation. The fuse can also be a MOS-gate fuse running on field or over fins. The extended S/D can be built with silicide on top of epitaxial silicon. The MOS gate can also be built with polysilicon gate or metal-gate. The metal gate can be a Gate-First metal gate or a Gate-Last (Replacement Metal Gate) metal gate. There can be many variations and yet equivalent embodiments that still fall on the scope of this invention, for those skilled in the arts.

Figure 7:
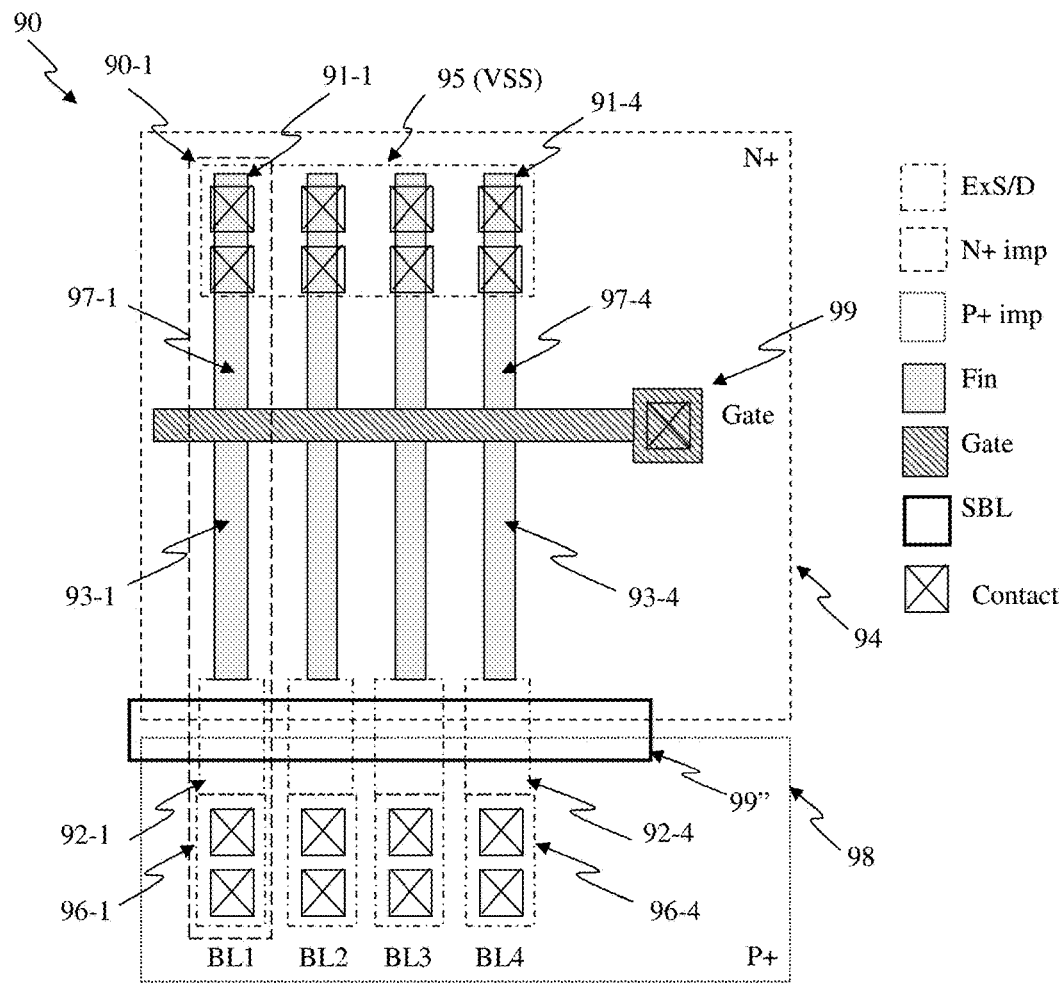
FIG. 7(a1) shows a top view of OTP cells using diodes in extended source/drain regions as program selectors and fin structures as OTP elements, according to another embodiment.
Figure 7:
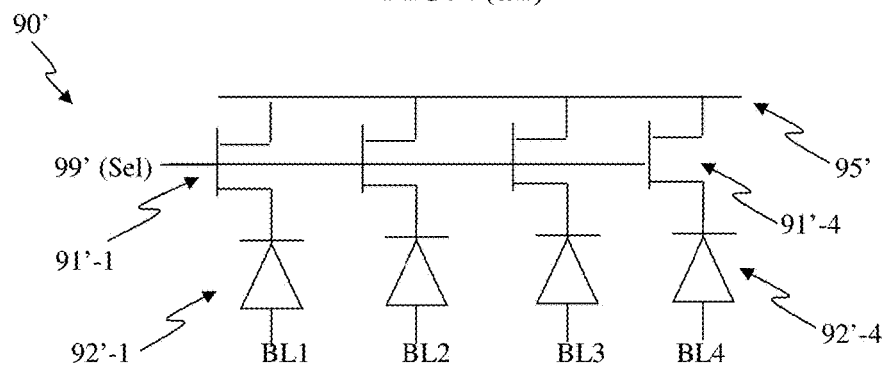

FIG. 7(a1) shows a top view of 1×4 OTP cells 90 using FinFETs as OTP elements and extended source/drain regions as program selectors, respectively, in a FinFET technology, according to one embodiment. The cells 90 can, for example, be used as the programmable resistive cell 30 illustrated in FIG. 4. MOS devices are constructed from fins 91-1,2,3,4 with a gate 99 across to divide the fins into drains 93-1,2,3,4 and sources 97-1,2,3,4 regions, respectively, which are further covered by N+ implant 94 to construct NMOS devices. The NMOS devices 91-1,2,3,4 can be used for breakdown as OTP elements. The regions 93-1,2,3,4 of the fins 91-1,2,3,4 can be built with extended source/drain regions 92-1,2,3,4 as diode program selectors, respectively, with P+ implant 98 in one end and N+ implant 94 in the other end. Alternatively, the diode as program selector can be built as parts of the fin structure in another embodiment. The N+ 94 and P+ 98 layers can be separated with a space and a Silicide Block Layer (SBL) 99" can cover the space and overlap into both regions. The width of the space and the doping level in the space region can be used to adjust the diode's breakdown or leakage current. If there is no silicide on top of the extended source/drain regions, the SBL 99" can be omitted in other embodiment. The diodes 92-1,2,3,4 can be coupled to another extended source/drains 96-1,2,3,4, which are further coupled to bitlines (BL1,2,3,4) through contacts. The BL1,2,3,4 can be coupled to first supply voltages. The regions 97-1,2,3,4 of the fins 91-1,2,3,4 can be built with an extended source/drain region 95, which can be further coupled to a ground line 95 (VSS). The ground line 95 can be coupled to a second supply voltage. The gate 99 can be coupled to a wordline (WL). In one embodiment, the gate 99 can be turned off during programming so that the NMOS FinFETs can be broken down by high voltage. In another embodiment, the gate 99 can be turned on during programming so that the NMOS FinFETs can be broken down by high current. To program this programmable resistive device, suitable voltages can be applied to the first, second supply voltages and wordline to turn on the diodes 92-1,2,3,4 and to conduct a current flowing through the OTP elements. Thus, the OTP elements can be programmed into high or low resistance state, depending on the magnitude and duration of the current. The bitlines and wordlines/ground line can run in the vertical and horizontal directions, respectively, to construct a two-dimensional cell array. If there is no silicide available, the SBL can be omitted in another embodiment. FIG. 7(a2) shows an equivalent circuit corresponding to the cells shown in FIG. 7(a1).

Figure 8:
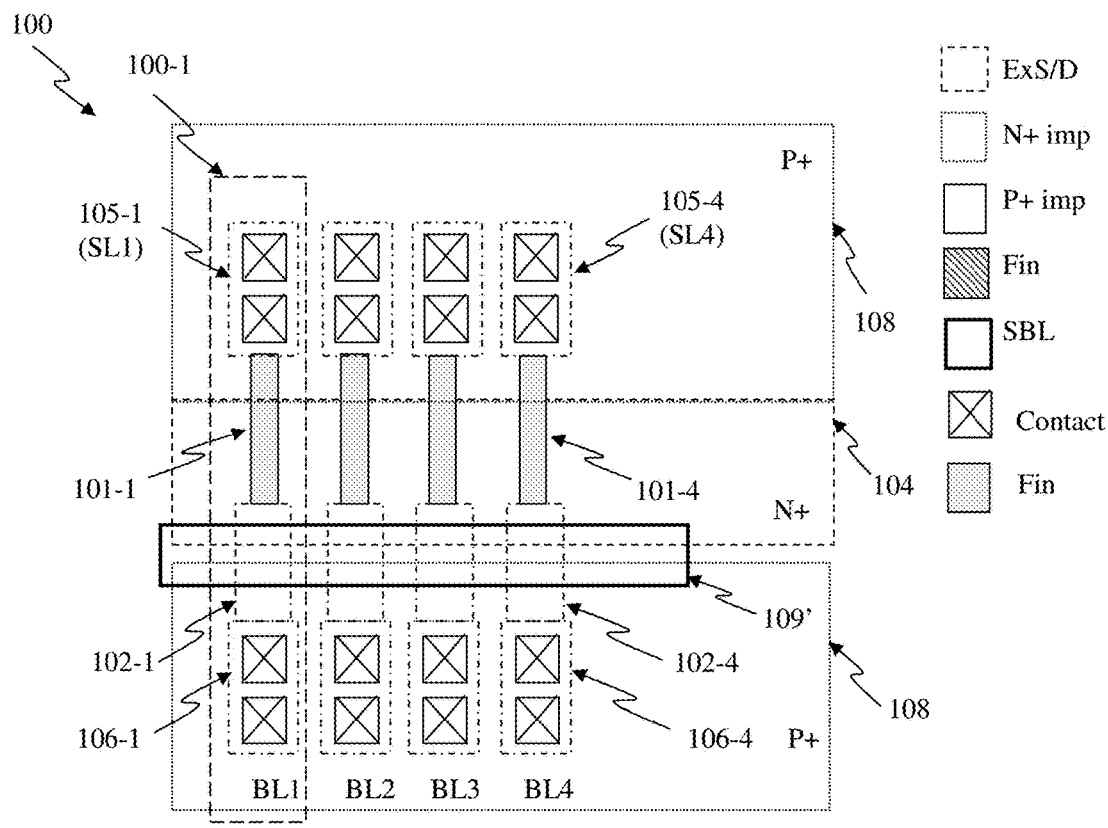
FIG. 8(*a*1) shows a top view of OTP cells using diodes in extended source/drain regions as program selectors and fin structures constructed as diodes for breakdown as OTP elements, according to another embodiment.
Figure 8:
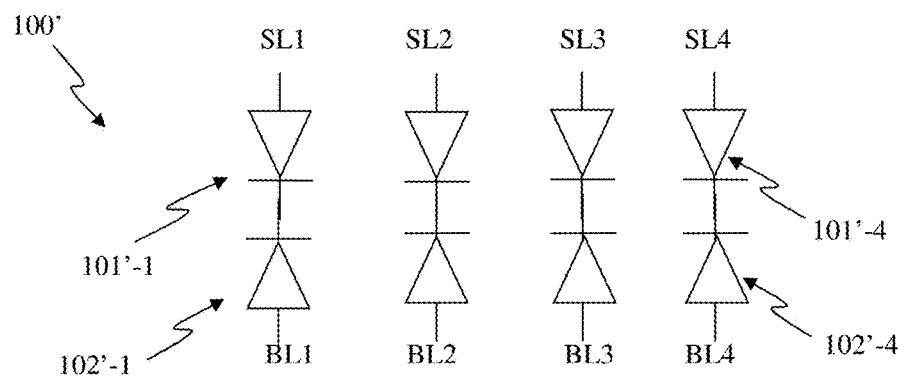

FIG. 8(a1) shows a top view of 1×4 OTP cells 100 using fins 101-1,2,3,4 as OTP elements and extended source/drain regions 102-1,2,3,4 as program selectors, respectively, in a FinFET technology, according to one embodiment. The cells 100 can, for example, be used as the programmable resistive cell 30 illustrated in FIG. 4. The cells 100 are similar to the cells 90 in FIG. 7(a1) except that the fins are constructed as junction diodes, instead of MOS devices, for OTP elements. The cells 100 have back-to-back diodes as OTP elements and program selectors for breakdown. FIG. 8(a2) shows an equivalent circuit corresponding to the cells shown in FIG. 8(a1). In another embodiment, the fins 101-1,2,3,4 can be constructed as diodes using dummy MOS gate such that the OTP cells have back-to-back diodes for breakdown.

Figure 9:
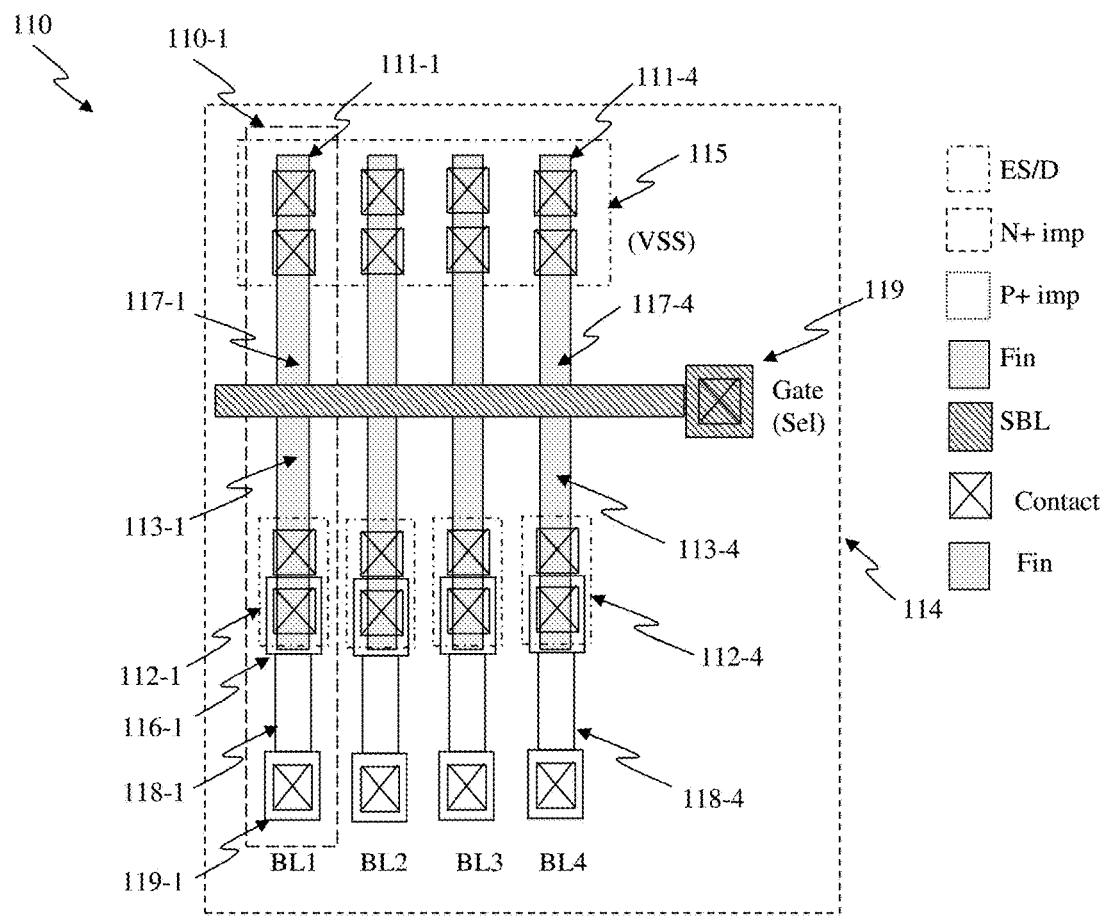
FIG. 9(*a*1) shows a top view of OTP cells using MOS devices in FinFETs as program selectors and interconnects as OTP elements, according to another embodiment.
Figure 9:
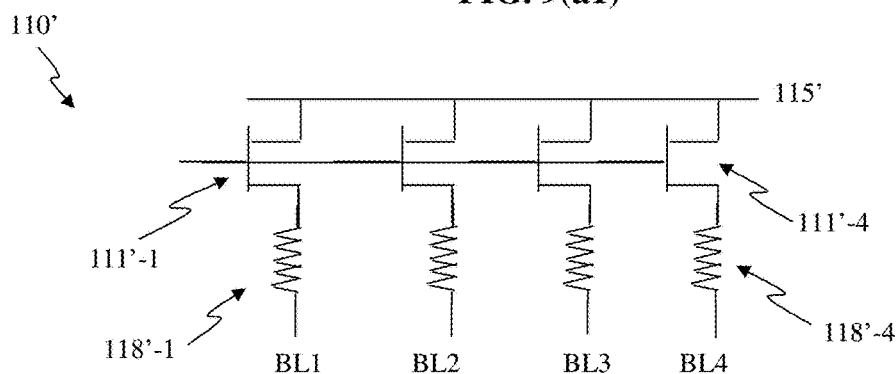
Figure 9:
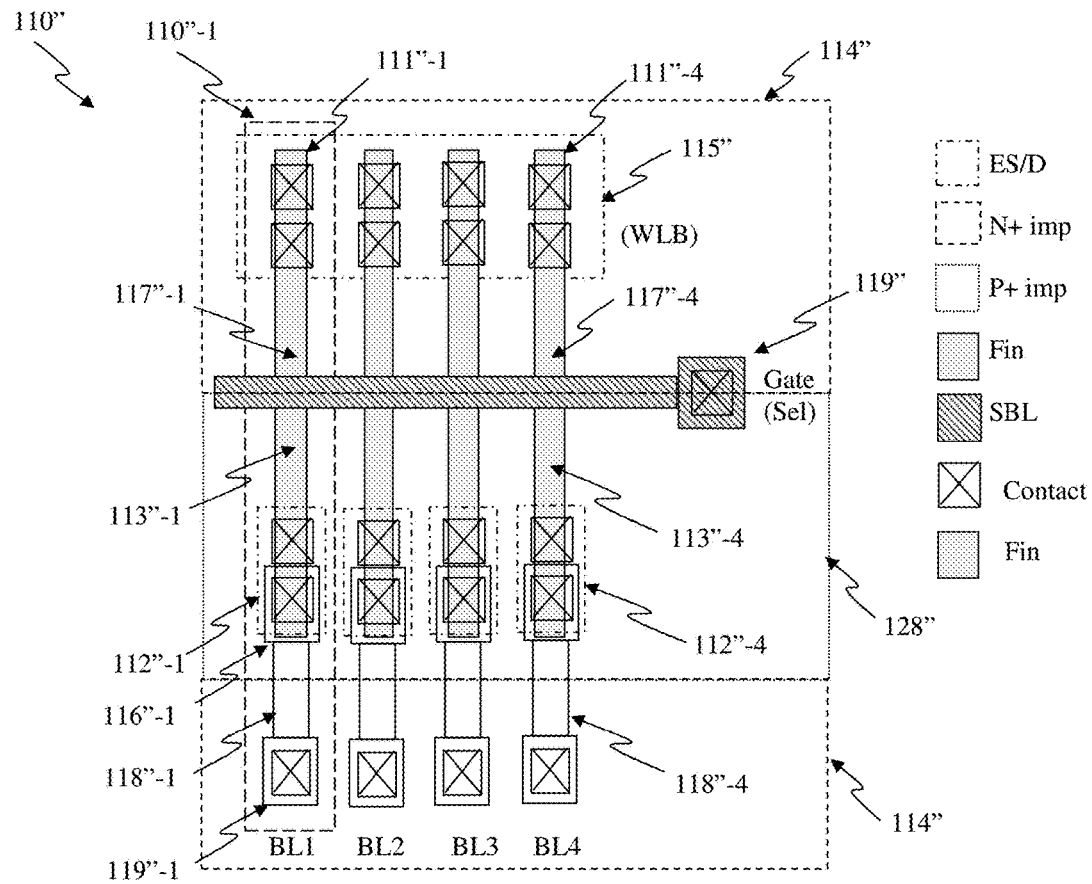
Figure 9:
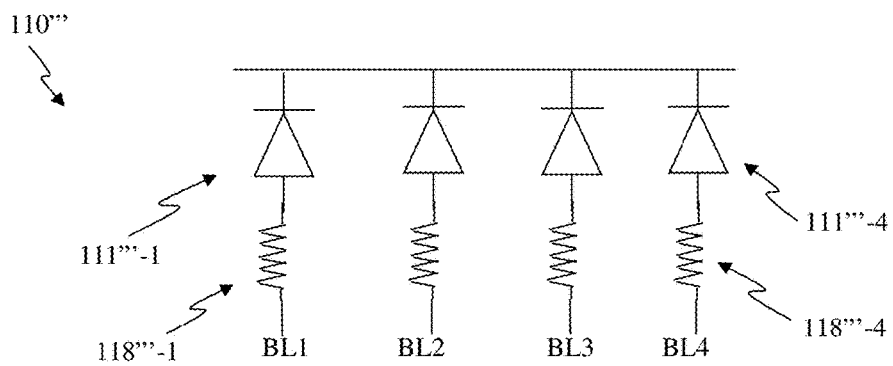
Figure 9:
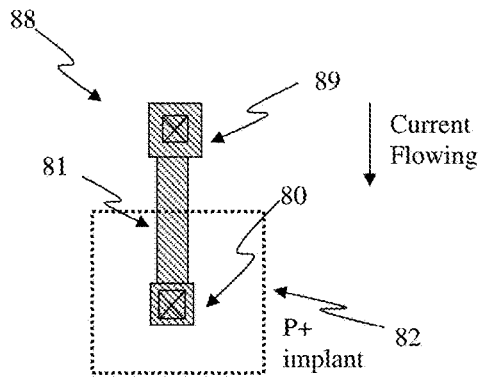
Figure 9:
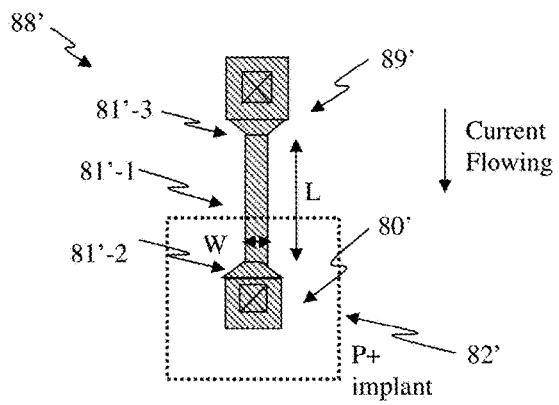
Figure 9:
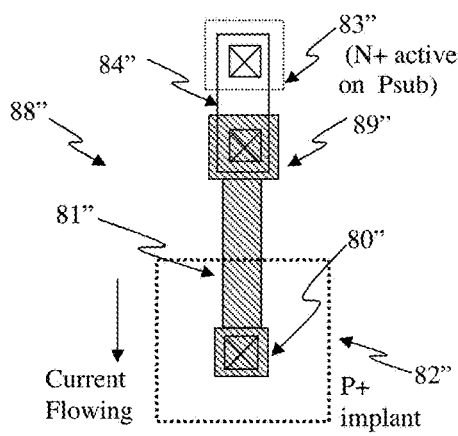
Figure 9:
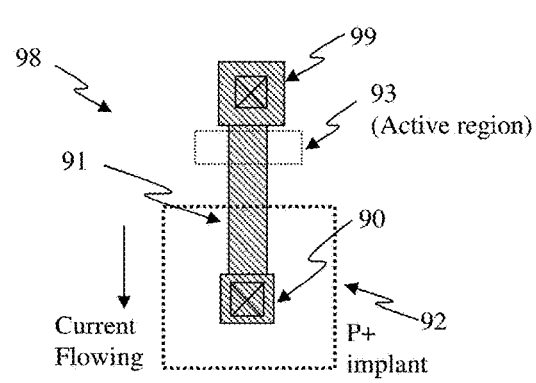
Figure 9:
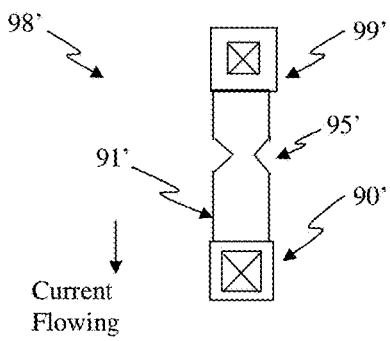
Figure 9:
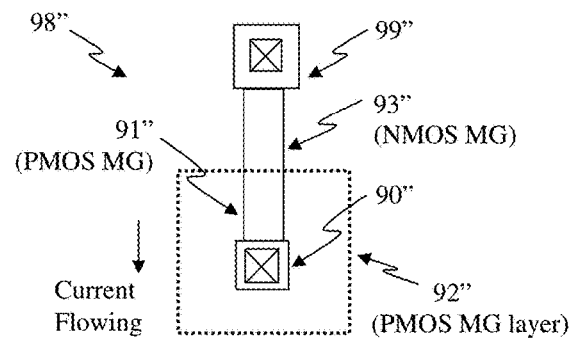
Figure 9:
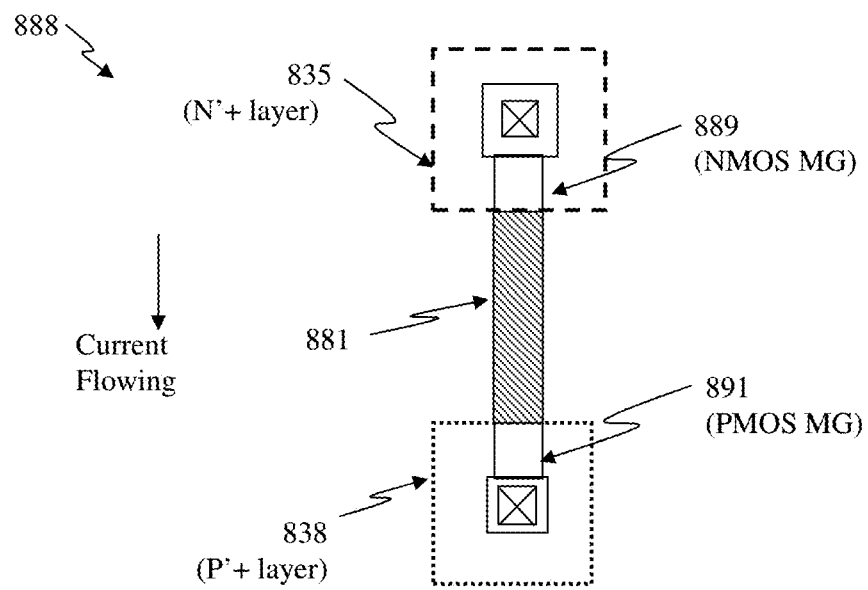
Figure 9:
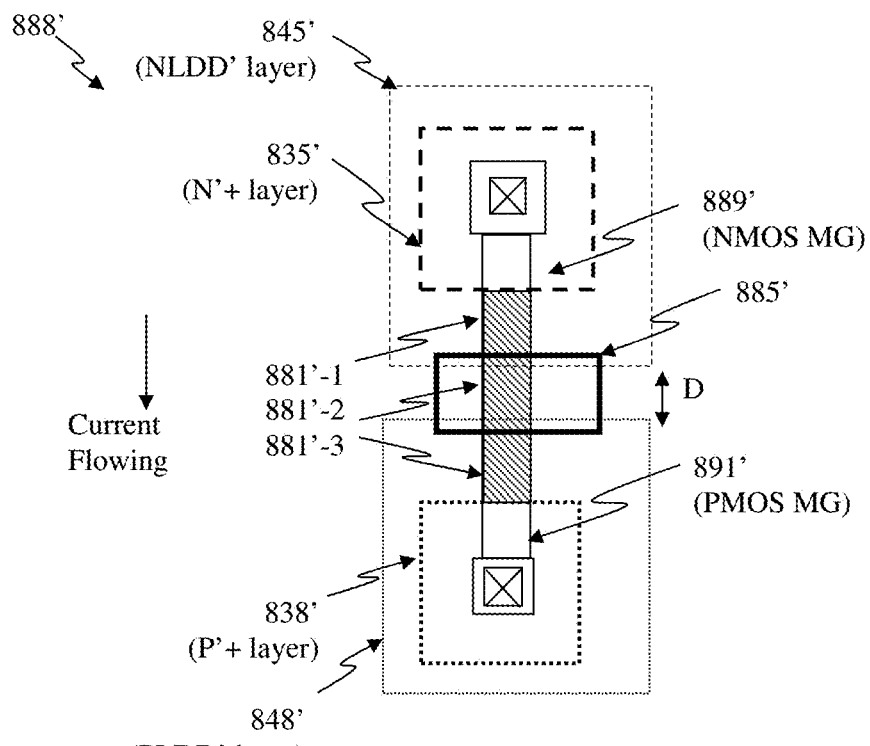

FIG. 9(a1) shows a top view of 1×4 OTP cells 110 using MOS devices in FinFETs as program selectors and interconnects as OTP elements, respectively, in a FinFET technology, according to one embodiment. The cells 110 can, for example, be used as the programmable resistive cell 30 illustrated in FIG. 4. MOS devices are constructed from fins 111-1,2,3,4 with a gate 119 across to divide the fins into drains 113-1,2,3,4 and sources 117-1,2,3,4 regions, respectively, which are further covered by N+ implant 114 to construct NMOS devices. The drain 113-1,2,3,4 regions of the fins 111-1,2,3,4 can be built with extended source/drain regions 112-1,2,3,4 and coupled to interconnects 118-1,2,3,4 through contacts areas 116-1,2,3,4. The interconnects have bodies 118-1,2,3,4 coupled to the metal bitlines BL1,2,3,4 through another contact areas 119-1,2,3,4, respectively. The contact areas 116-1,2,3,4 or 119-1,2,3,4 can be slightly larger to allow a single or plural of contacts for each OTP cell. Alternatively, the width of the bodies 118-1,2,3,4 can be the same as the width of the contact areas 116-1,2,3,4 or 119-1,2,3,4. The length-to-width ratio of the bodies 118-1,2,3,4 can be between 0.5 to 10 for better results. The regions 117-1,2,3,4 of the fins 111-1,2,3,4 can be built with extended source/drain regions 115 and coupled to a ground line (VSS). The gate 119 can be coupled to a wordline (WL). To program this programmable resistive device, suitable voltages can be applied to the bitline, ground line, and wordline to turn on the MOS devices constructed from fins 111-1,2,3,4 and to conduct a current flowing through the interconnects. Thus, the interconnects can be programmed into a high resistance state, depending on the magnitude and duration or the current. The bitlines and wordlines/ground line can run in the vertical and horizontal directions, respectively, to construct a two-dimensional cell array. FIG. 9(a2) shows an equivalent circuit corresponding to the cells shown in FIG. 9(a1).

FIG. 9(b1) shows a top view of 1×4 OTP cells 110" using diodes in FinFETs as program selectors and interconnects as OTP elements, respectively, in a FinFET technology, according to one embodiment. The cells 110" can, for example, be used as the programmable resistive cell 30 illustrated in FIG. 4. Diodes are constructed from fins 111"-1,2,3,4 with a dummy gate 119" across to divide the fins into drain 113"-1,2,3,4 and source 117"-1,2,3,4 regions, respectively, which are further covered by P+ implant 128" and N+ implant 114" to construct the P and N regions of the diodes, respectively. The regions 113"-1,2,3,4 of the fins 111"-1,2,3,4 can be built with extended source/drain regions 112"-1,2,3,4 and coupled to interconnects 118"-1,2,3,4 through contacts areas 116"-1,2,3,4. The interconnects have bodies 118"-1,2,3,4 coupled to the metal bitlines BL1,2,3,4 through another contact areas 119"-1,2,3,4, respectively. The contact areas 116"-1,2,3,4 or 119"-1,2,3,4 can be slightly larger to allow a single or plural of contacts for each OTP cell. Alternatively, the width of the bodies 118"-1,2,3,4 can be the same as the width of the contact areas 116"-1,2,3,4 or 119"-1,2,3,4. The bodies 118"-1,2,3,4 can have a length-to-width ratio of between 0.5 to 10 for better results. The contacts in 116"-1,2,3,4 or 119"-1,2,3,4 can be larger than at least one contact outside of the OTP memory array. The contact enclosures in 116"-1,2,3,4 or 119"-1,2,3,4 can be smaller than at least one contact enclosure outside of the OTP memory array. The regions 117"-1,2,3,4 of the fins 111"-1,2,3,4 can be built with extended source/drain regions 115" and coupled to a wordline bar (WLB). The dummy gate 119" only serves for isolation during fabrication and can be coupled to a fixed voltage supply. To program this programmable resistive device, suitable voltages can be applied to the bitline and wordline bar to turn on the diodes 111"-1,2,3,4 and to conduct a current flowing through the interconnects. Thus, the interconnects can be programmed into a high resistance state, depending on the magnitude and duration of the current. The bitlines and wordline bars can run in the vertical and horizontal directions, respectively, to construct a two-dimensional cell array. FIG. 9(b2) shows an equivalent circuit corresponding to the cells shown in FIG. 9(b1).

The interconnects 118-1,2,3,4 in the FIG. 9(a1) or 9(b1) can include at least a portion of polysilicon, silicided polysilicon, silicide, polymetal, metal, metal alloy, local interconnect, thermally isolated active region, CMOS gate, or combination thereof. A CMOS gate can be an N type, P type, or part N and part P type of polysilicon, silicided polysilicon or silicide in one embodiment. Alternatively a CMOS gate can be a non-aluminum metal gate, which can be metals between barrier or buffer metals, such as TiN or TaN, in another embodiment. Sometimes different metals can be used for NMOS or PMOS gates. A local interconnect is a by-product of a salicide process that can be TiN, TaN, or some kinds of metal nitrides or silicides. In a salicide process, a layer of TiN or TaN can be fabricated during silicidation of source/drain and polysilicon gate of a MOS after spacers are formed. If this layer is not etched away, this layer can be used as interconnect between source/drain and gate and hence called local interconnect. In advanced MOS beyond 28 nm, an local interconnect, also called metal 0, can be used to interconnect source/drain to gate, gate to metal 1, or source/drain to metal 1 in one or two levels of interconnect. Thermally isolated active regions are active regions that are electrically and thermally isolated from the substrate and can be fully isolated from each other as in FinFET SOI or partially isolated from each other as in FinFET bulk technologies. Particularly, the extended source/drain regions in FinFET technologies can be used as thermally isolated active regions, which can also be used as an OTP element or diode as program selector as shown in FIGS. 6(a) to 8(a2). The interconnect can have a single or plural of contacts in one or both ends. The number of contacts is preferably no more than 2 for polysilicon, local interconnect, or isolated active region, or no more than 4 for metals. The contact size can be larger than at least one contact outside of the OTP memory array. The contact enclosure can be smaller than at least one contact enclosure outside of the OTP memory array. The body of the interconnect can be slightly narrower than in the contact areas in one embodiment, or can be the same width of the contact areas in either end in another embodiment. The width of the body can be substantially close to the minimum width of the interconnect. The length to width ratio of the body, excluding the contact areas, of the interconnect is preferably between 0.5 to 10 for non-metals or between 10 to 20 for metals to achieve better results. The above discussions are for illustration purposes. There are many varieties of embodiments and their combinations thereof are considered equivalent and that are still within the scope of this invention for those skilled in the art.

FIG. 9(c1) shows a top view of an electrical fuse element 88 according to one embodiment. The electrical fuse element 88 can, for example, be used as the resistive element 30a illustrated in FIG. 4. The electrical fuse element 88 includes an anode 89, a cathode 80, and a body 81. In this embodiment, the electrical fuse element 88 is a bar shape with a small anode 89 and cathode 80 to reduce area. The anode 89 and cathode 80 may protrude from the body 81 to make contacts. The contact number can be one (1) for both the anode 89 and the cathode 80 so that the area can be very small. The contacts can be larger than at least one contact outside of the memory array in another embodiment. However, the contact area for anode 89 is often made larger so that the anode 89 can resist electro-migration more than the cathode 80. The fuse body 81 can have the length to width ratio of about 0.5-to-10, to optimize cell area and program current. The fuse element 88 has a P+ implant 82 covering part of the body 81 and the cathode 80, while an N+ implant over the rest of area. This embodiment makes the fuse element 88 behave like a reverse biased diode to increase resistance after being programmed, when silicide on top is depleted by electro-migration, ion diffusion, silicide decomposition, and other effects. It is desirable to make the program voltage compatible with the I/O voltages, such as 3.3V, 2.5V, or 1.8V, for ease of use without the need for a charge pump. Moreover, the program voltage pin can also be shared with the standard I/O supply voltage pins. To make the cell small while reducing the contact resistance in the overall conduction path, the number of contacts in the OTP element or diode can be no more than two for polysilicon or local interconnect, or no more than four for metal fuse in a single cell in one embodiment. Similarly, the contact size of the OTP element or diode can be larger than at least one contact outside of the memory array in another embodiment. The contact enclosure can be smaller than at least one contact enclosure outside of the memory array in other embodiments.

FIG. 9(c2) shows a top view of an electrical fuse structure 88' with a small body 81'-1 and slightly tapered structures 81'-2 and 81'-3, according to another embodiment. The electrical fuse element 88' can, for example, be used as the resistive element 30a illustrated in FIG. 4. The electrical fuse element 88' includes an anode 89', a cathode 80', a body 81'-1 and tapered structures 81'-2 and 81'-3 coupled to cathode 80' and anode 89', respectively. The length (L) and width (W) ratio of the body 81'-1 is preferably between 0.5 and 10 for better results. In this embodiment, the electrical fuse element 88' is substantially a bar shape with a small anode 89' and cathode 80' to reduce area. The anode 89' and cathode 80' may protrude from the body 81' to make contacts. The contact number can be one (1) for both the anode 89' and the cathode 80' so that the area can be very small. The contact can be larger than at least one contact outside of the memory array in another embodiment. The contact enclosure can be smaller than at least one contact enclosure outside of the memory array in other embodiments. P+ implant layer 82' covers part of the body and N+ implant layer (the complement of P+) covers the other part so that the bodies 81'-1 can behave like a reverse biased diode to enhance resistance ratio during read, such as when silicide on top is depleted after program.

FIG. 9(c3) shows a top view of an electrical fuse element 88" according to another embodiment. The electrical fuse element 88" is similar to the one shown in FIG. 9(c1) except a heat sink is coupled to the anode. The electrical fuse element 88" can, for example, be used as the resistive element 30a illustrated in FIG. 4. The electrical fuse element 88" includes an anode 89", a cathode 80", a body 81", and an N+ active region 83". The N+ active region 83" on a P type substrate is coupled to the anode 89" through a metal 84". In this embodiment, the N+ active region 83" is electrically isolated from the conduction path (i.e. N+/P sub diode is reverse biased), but thermally conductive to the P substrate. Thus, this embodiment can create a steep temperature gradient to accelerate programming.

FIG. 9(c4) shows a top view of an electrical fuse element 98 according to another embodiment. The electrical fuse element 98 is similar to the one shown in FIG. 9(c1) except a thinner oxide region is created near the anode. The electrical fuse element 98 can, for example, be used as the resistive element 30a illustrated in FIG. 4. The electrical fuse element 98 includes an anode 99, a cathode 90, a body 91, and an active region 93 near the anode 99. The active region 93 underneath the MOS gate 91 makes the oxide thinner in the area than the other (i.e. thin gate oxide instead of thick STI oxide). The thinner oxide above the active region 93 can dissipate heat faster to create a temperature gradient to accelerate programming. This embodiment can be applied to those fuse elements fabricated from MOS gates, such as polysilicon or metal gate.

FIG. 9(c5) shows a top view of an electrical fuse element 98' according to another embodiment. The electrical fuse element 98' is similar to the one shown in FIG. 9(c1) except the fuse element has at least one notch in the body to assist programming. The electrical fuse element 98' can, for example, be used as the resistive element 30a illustrated in FIG. 4. The electrical fuse element 98' includes an anode 99', a cathode 90', and a body 91'. The body 91' has at least a notch 95' so that the fuse element can be easily broken during programming.

FIG. 9(c6) shows a top view of an electrical fuse element 98" according to another embodiment. The electrical fuse element 98" is similar to the one shown in FIG. 9(c1) except the fuse element is part NMOS and part PMOS metal gates. The electrical fuse element 98" can, for example, be used as the resistive element 30a illustrated in FIG. 4. The electrical fuse element 98" includes an anode 99", a cathode 90", and bodies 91" and 93" fabricated from PMOS and NMOS metal gates, respectively. By using different types of metals in the same fuse element, the thermal expansion can create a large stress to rupture the fuse when the temperature is raised during programming.

FIG. 9(c7) shows a top view of an electrical fuse element 888 according to another embodiment. The electrical fuse element 888 is similar to the one shown in FIG. 9(c1) except the fuse element is built with a polysilicon between metal gates. The electrical fuse element 888 can, for example, be used as the resistive element 30a illustrated in FIG. 4. The electrical fuse element 888 includes an NMOS metal gate as anode 889, a PMOS metal gate as cathode 891, and a polysilicon as body 881. In a gate-last or Replacement Metal Gate (RMG) metal-gate process, polysilicon can be provided and used as place holders for CMOS gates. After high temperature cycles of silicidation and source/drain annealing, the polysilicon gates are etched and replaced by metal gates. Different types of metals can be used for NMOS and PMOS metal gates to suite NMOS/PMOS threshold voltage requirements. Since use of polysilicon as gates or interconnects are available before replaced by metal gates, a portion of polysilicon can be preserved by modifying the layout database with layout logic operations. For example, the N+ and P+ implant layers with N well can be used to define NMOS and PMOS in the conventional CMOS. The N+ and P+ layers can be modified with logic operations as N'+ layer 835 and P'+ layer 838, respectively, so that a segment of polysilicon 881 can be preserved. The polysilicon as a fuse body 881 can be implanted by NLDD, PLDD, N+ source/drain, P+ source/drain, or threshold voltage (Vt) adjust implants with minimum masks increment. The OTP can be all N, P, or part N and part P. The OTP element can be breakdown by high voltage or high current. In one embodiment, the polysilicon body can be between the same NMOS or PMOS metal gates. In another embodiment, the polysilicon body is coupled to neither NMOS nor PMOS metal gate.

FIG. 9(c8) shows a top view of a diode 888' according to another embodiment. The diode 888' is similar to the OTP element 888 shown in FIG. 9(c7) except the OTP body is further divided into N type and P type regions to act as a diode. The diode 888' can, for example, be used as the resistive element 30a or program selector 30b illustrated in FIG. 4. The diode 888' includes an NMOS metal gate as anode 889', a PMOS metal gate as cathode 891', and a polysilicon 881' as body. The body 881' is further divided into three regions 881'-1, 888'-3, and 888'-2, covered by modified NLDD' layer 845', modified PLDD' layer 848', and none, respectively. The layers 845' and 848' can be generated from NLDD and PLDD layers with logic operations so that the areas 881'-1 and 881'-3 can receive NLDD and PLDD implants, respectively. The NLDD' 845' and PLDD' 848' can be separated with a space D. The doping concentration in the space region can be slightly N or P, or unintentionally doped. The width of the space and the doping level in the space region can be used to adjust the diode's breakdown or leakage current. A silicide block layer (SBL) 885' can cover the space and overlap into both regions. The SBL 885' can be used to block silicide formation to prevent the bodies 881'-1 and 881'-3 from being shorts in one embodiment. The bodies 881'-1 and 881'-3 are coupled to anode 889' and 891', respectively, which serve as the N and P terminals of a diode. The diode can be used as an OTP element by junction breakdown under forward or reverse bias condition, or as program selector. The NLDD or PLDD as discussed above is for illustration purposes. The dopants to create a diode can be modified NLDD, PLDD, N+, P+, Vt-adjust, or other implants with minimum masks increment.

The fuse elements shown in FIGS. 9(c1)-9(c8) are only to illustrate certain concepts of embodiments of fuse elements. The fuse elements can be built from any interconnects, such as polysilicon, silicided polysilicon, silicide, local interconnect, metal, metal alloy, thermally isolated active region, CMOS gate, or combination thereof. The fuse element can be N type, P type, or part N and part P type, if applicable. The fuse element can have an anode, a cathode, and at least one body. The anode or cathode contacts can be no more than 2 for polysilicon/local interconnect, and can be no more than 4 for metal fuse, preferably. The contact size can be larger than at least one contact outside of the OTP memory array. The contact enclosure can be smaller than at least one contact enclosure outside of the OTP memory array to lower the electromigration threshold. The length to width ratio in the body can be between 0.5-10 for polysilicon/local interconnect/isolated active region, or between 10 to 20 for metal, preferably. There are many variations or combinations of embodiments in part or all that can be considered equivalent embodiments and that are still within the scope of embodiments of the invention.

Polysilicon used to define CMOS gates or as interconnect in a high-K/metal-gate CMOS process can also be used as OTP elements. The fuse element can be P type, N type, or part N and part P type if applicable. Particularly, the after/before resistance ratio can be enhanced for those fuse elements that have P+ and N+ implants to create a diode after being programmed, such as polysilicon, thermally isolated active region, or gate of a high-K/metal-gate CMOS. For example, if a metal-gate CMOS has a sandwich structure of polysilicon between metal alloy layers, the metal alloy layers may be blocked by masks generated from layout database to create a diode in the fuse elements. In SOI or SOI-like processes, a fuse element can also be constructed from a thermally isolated active region such that the fuse element can be implanted with N+, P+, or part N+ and part P+ in each end of the active region. If a fuse element is partly implanted with N+ and P+, the fuse element can behave like a reverse-biased diode, such as when silicide on top is depleted after being programmed. If there is no silicide on top of active regions, an OTP element can be constructed from a thermally isolated active region with part N+ and part P+ to act as a diode for breakdown under forward or reverse bias. Using isolated active region to construct an OTP element, the OTP element can be merged with part of the program-selector diode in one single active island to save area.

In some processing technologies that can offer Local Interconnect (LI), Local interconnect can be used as part or all of an OTP element. Local interconnect, also called as metal-0 (M0), is a by-product of a salicide process that has the capability to interconnect polysilicon or MOS gate with an active region directly. In advanced MOS technologies beyond 28 nm, the scaling along the silicon surface dimensions is much faster than scaling in the height. As a consequence, the aspect ratio of CMOS gate height to the channel length is very large such that making contacts between metal 1 and source/drain or CMOS gate very difficult. Local interconnect can be used as an intermediate interconnect between source/drain to CMOS gate, between CMOS gate to metal1, or between source/drain to metal1 in one or two levels. An OTP element and one terminal of the program-selector diode can be connected directly through local interconnect without needing any contacts to save area. Those skilled in the art understand that the above discussions are for illustration purposes and that there are many variations and equivalents in constructing OTP elements in CMOS processes, The variations, or combination of the variations in part or all are considered equivalent embodiments and that are all within the scope of embodiments of the invention.

Figure 10A:
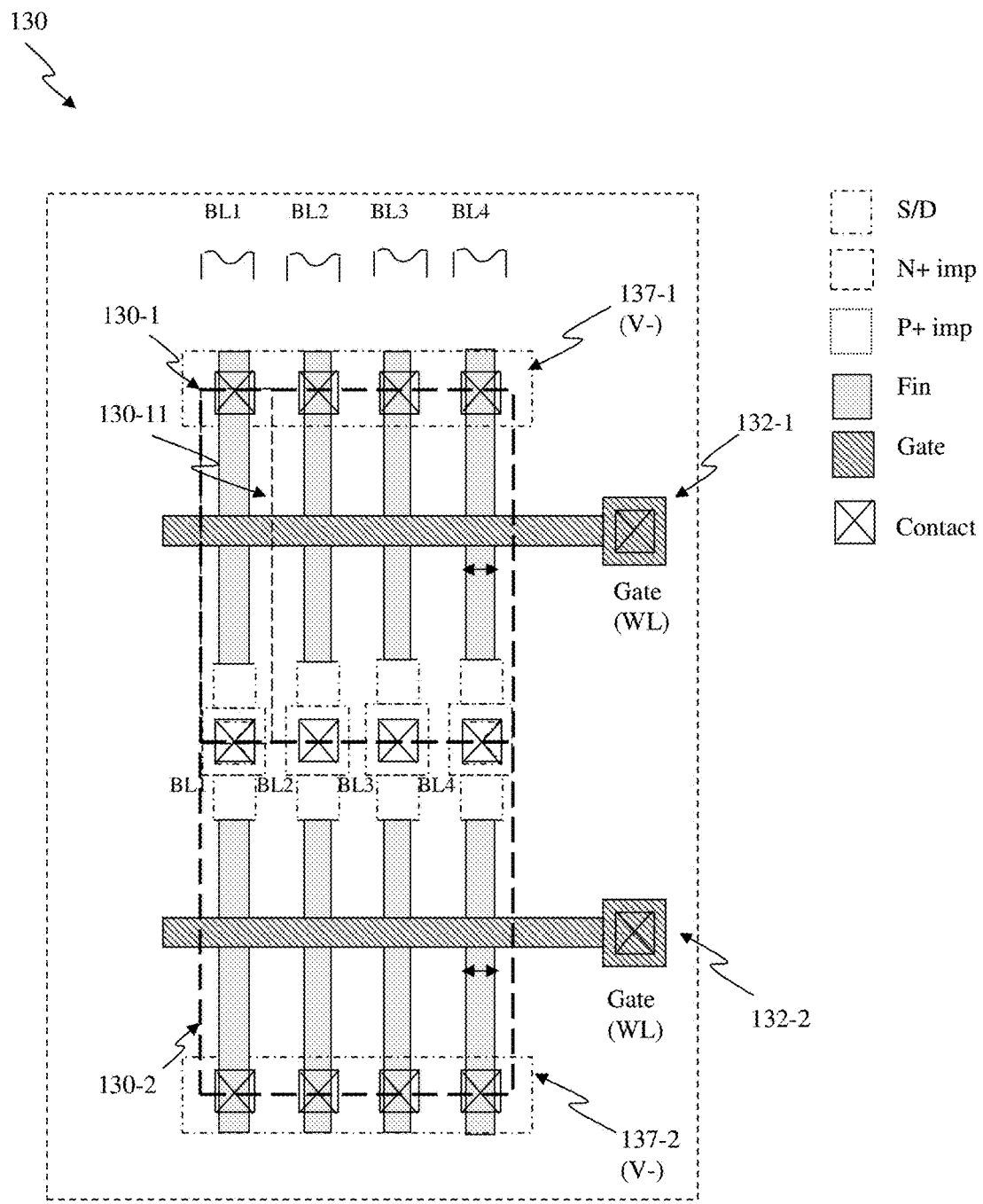
FIG. 10(*a*) shows a top view of 2×4 OTP cell array using MOS devices in FinFETs as program selectors, according to one embodiment.

FIG. 10(a) shows a top view of a 2×4 OTP array 130 comprising two 1×4 OTP cells that can, for example, be the OTP cells in FIGS. 6(a)-8(a2) that use MOS devices as program selectors. The 2×4 OTP array 130 have two 1×4 OTP cells 130-1 and 130-2 that share the same bitline contacts along the column direction. In other embodiment, the extended source/drain region of the bitlines can be separated, but the higher level of interconnect, such as metal, can be shared. In another embodiment, the sources of the MOS 137-1 can be shared with the adjacent cells in the column direction when another 2×4 OTP array 130 is placed above. The construction of multiple-row arrays can be applied to other kinds of programmable resistive devices too.

Figure 10B:
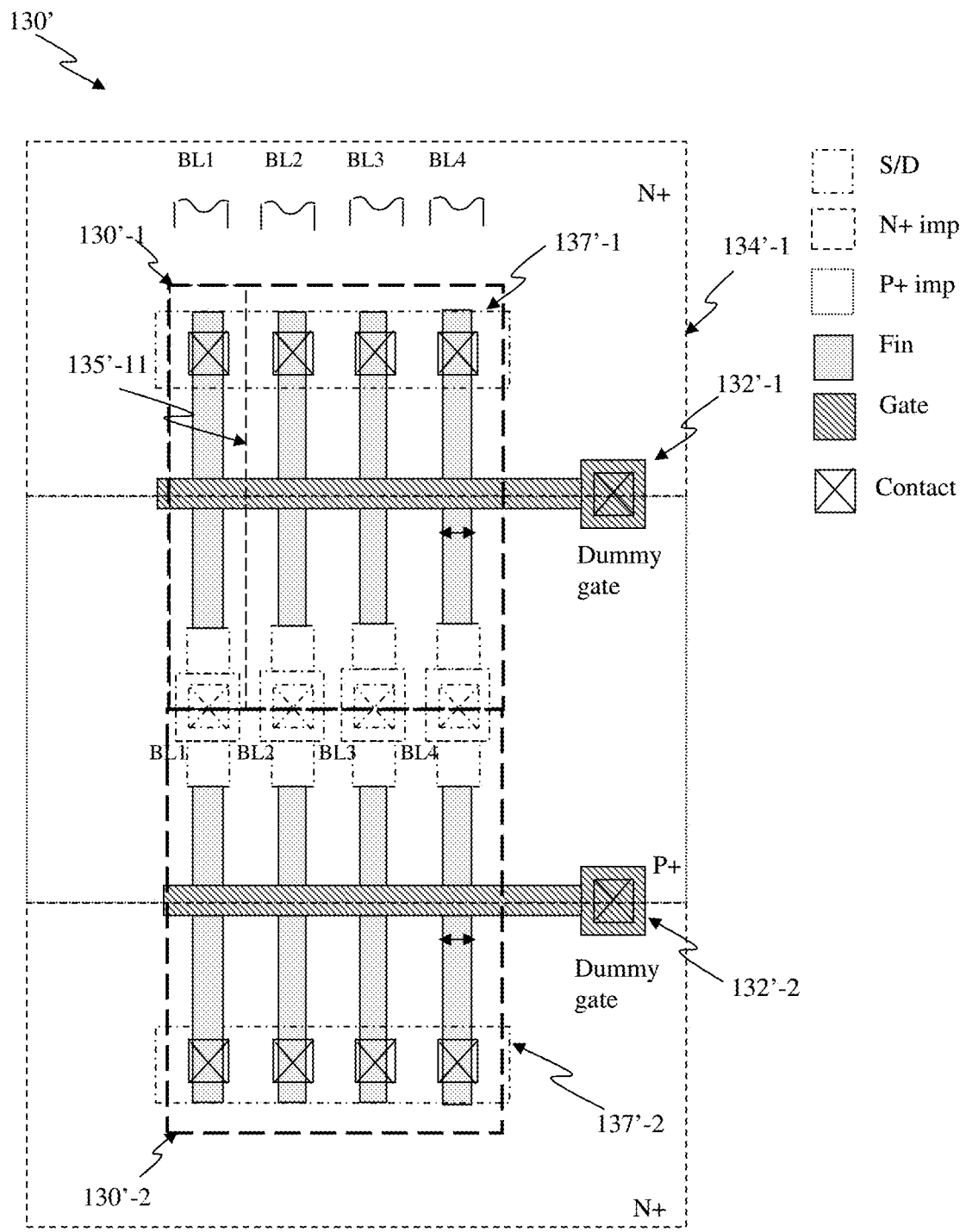

FIG. 10(b) shows a top view of a 2×4 OTP array 130' comprising two 1×4 OTP cells that can, for example, be the OTP cells in FIGS. 6(a)-8(a2) that use diodes as program selectors. FIG. 10(b) is similar to FIG. 10(a) except that diodes are used as program selectors, instead of MOS devices. The 2×4 OTP array 130' have two 1×4 OTP cells 130'-1 and 130'-2 that share the same bitline contacts along the column direction. In other embodiment, the extended source/drain region of the bitlines can be separated, but the higher level of interconnect, such as metal, can be shared. The construction of multiple-row arrays can be applied to other kinds of programmable resistive devices too.

Figure 11:
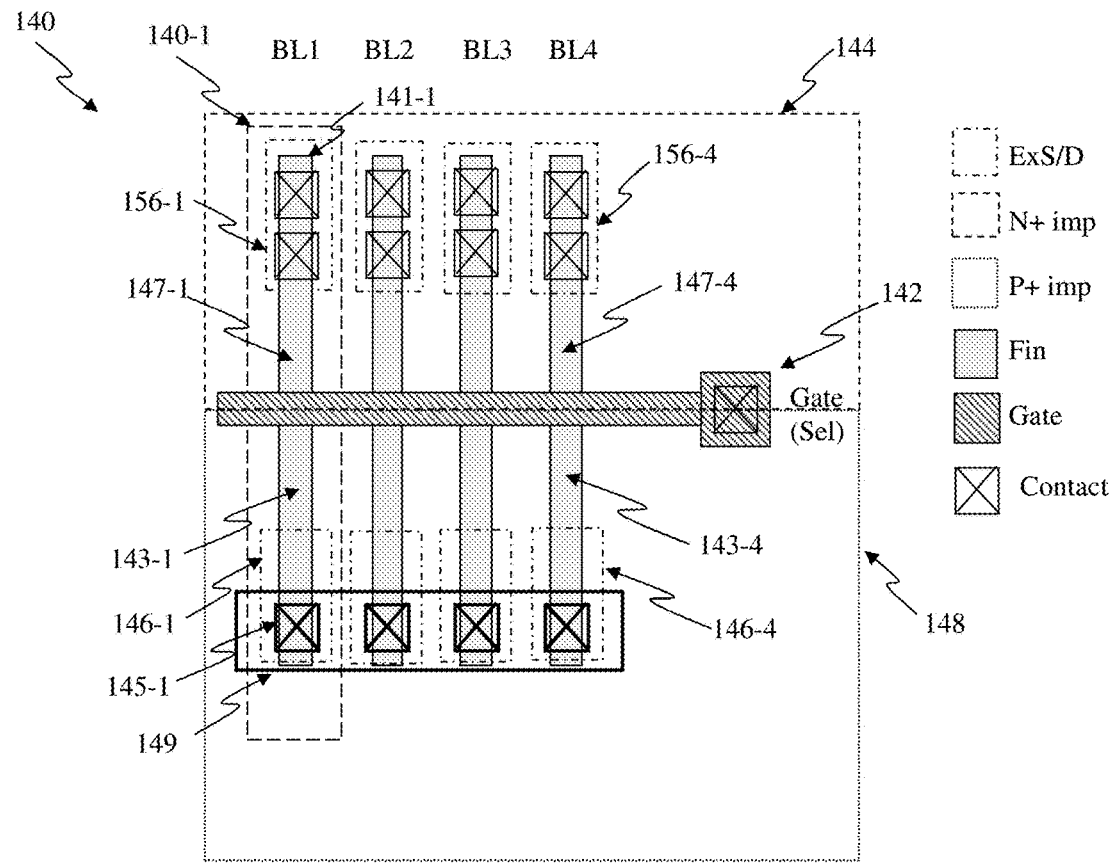
FIG. 11(*a*1) shows a top view of 1×4 reversible programmable resistive cells using diodes as program selectors and phase-change material (PCM) built inside contact holes, according to the present invention.
Figure 11:
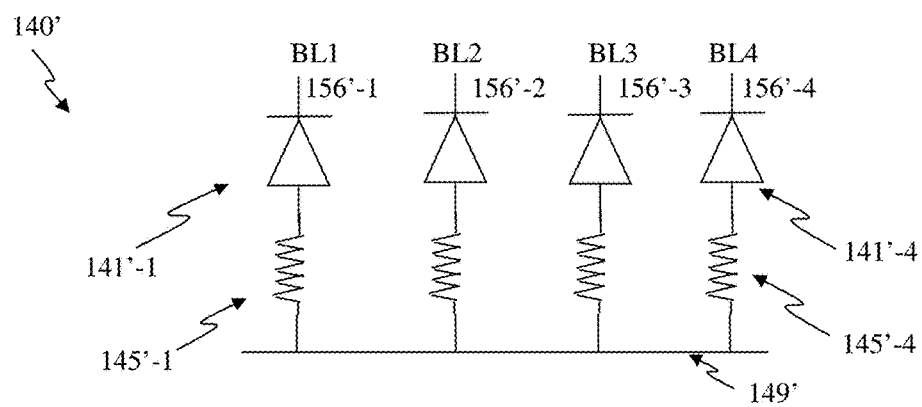
Figure 11:
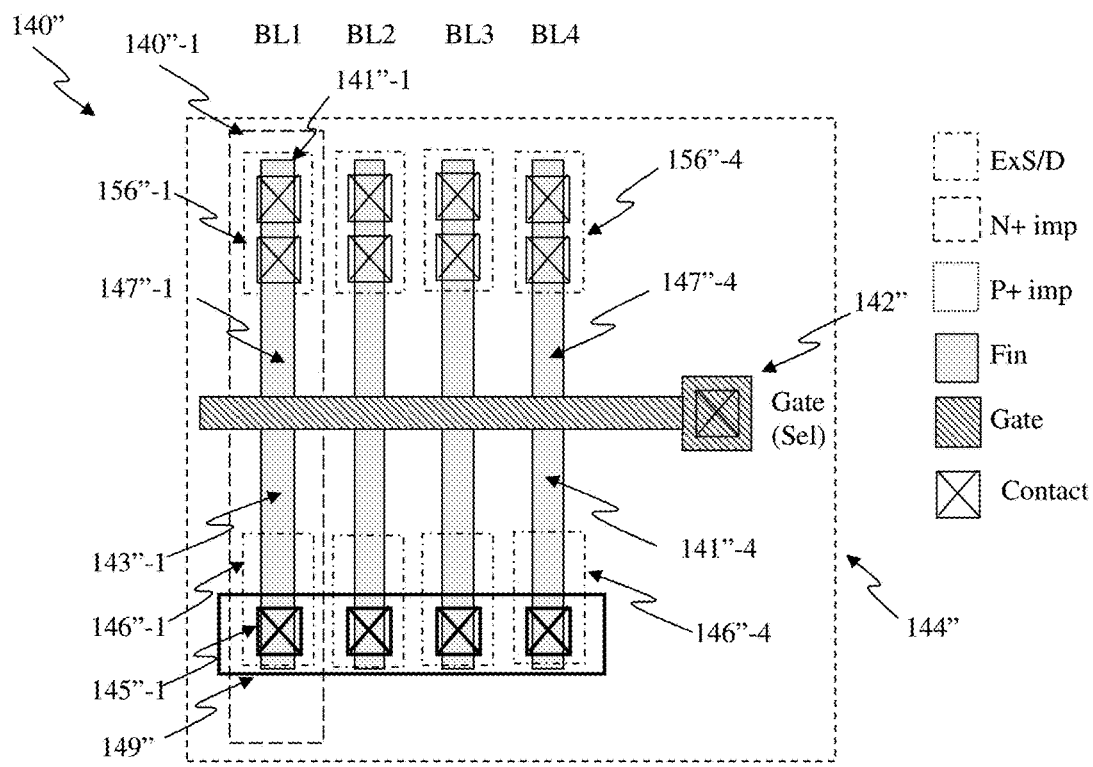
Figure 11:
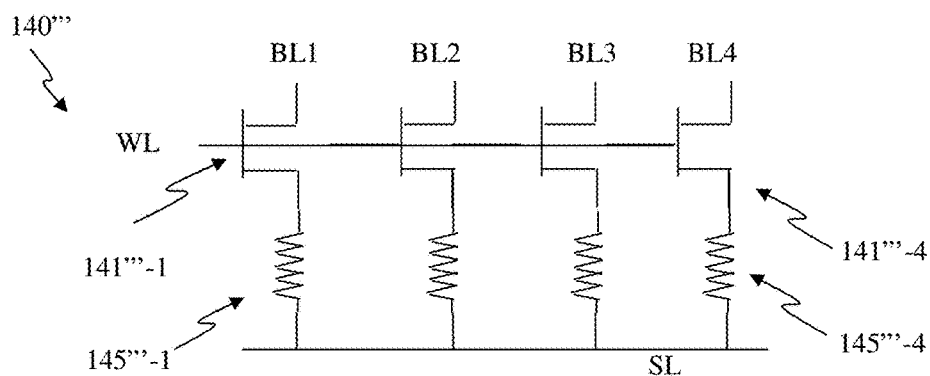

FIG. 11(a1) shows a top view of 1×4 Phase-Change RAM (PCRAM) cells 140 using diodes in FinFETs as program selectors and an phase-change memory film (PCM) as programmable resistive elements in a FinFET technology, according to one embodiment. The PCRAM cells 140 can, for example, be used as the programmable resistive cell 30 illustrated in FIG. 4. Diodes are constructed from fins 141-1,2,3,4 with a dummy gate 142 across to divide the fins into 143-1,2,3,4 and 147-1,2,3,4 regions, respectively, which are further covered by P+ implant 148 and N+ implant 144 to serve as P and N portions of the diodes. The regions 143-1,2,3,4 of the fins 141-1,2,3,4 can be built with extended source/drain regions 146-1,2,3,4 where contacts 145-1,2,3,4 are built, respectively, to coupled to a wordline (WL). A phase-change memory (PCM) film 149 fills the contact holes 145-1,2,3,4 and is also used as an interconnect between cells in a row. The active region of PCM for each cell is only limited to the contact area 145-1,2,3,4 and the rest of PCM is only for connectivity. Another extended source/drains 156-1,2,3,4 can be coupled to the N+ portions of the fin 147-1,2,3,4, respectively, to serve as bitlines (BLs). To program this programmable resistive device, high and low voltages can be applied to the wordline and bitlines, respectively, to conduct a current flowing through the PCM elements. Thus, the PCM elements can be programmed into high or low resistance state, depending on the magnitude, duration, and/or current/voltage limit. The bitlines and wordline can run in the vertical and horizontal directions, respectively, to construct a two-dimensional cell array. FIG. 11(a2) shows an equivalent circuit corresponding to the cells shown in FIG. 11(a1). In another embodiment, the PCM is located in each contact hole only so that wordline can be separated for each cell while the bitlines can be merged into one.

FIG. 11(b1) shows a top view of 1×4 Phase-Change RAM (PCRAM) cells 140" using MOS devices in FinFETs as program selectors and an phase-change memory film (PCM) as programmable resistive elements in a FinFET technology, according to one embodiment. The PCRAM cells 140" can, for example, be used as the programmable resistive cell 30 illustrated in FIG. 4. MOS devices are constructed from fins 141"-1,2,3,4 with a gate 142" (as a wordline) across to divide the fins into 143"-1,2,3,4 and 147"-1,2,3,4 regions, respectively, which are covered by N+ implant 144" to create NMOS. The regions 143"-1,2,3,4 of the fins 141-1,2,3,4 can be built with extended source/drain regions 146"-1,2,3,4 where contacts 145"-1,2,3,4 are built, respectively, and coupled to a source line (SL), respectively. A phase-change memory (PCM) film fills the contact holes 145"-1,2,3,4 and is also used as an interconnect 149" for cells in a row. The active region of PCM for each cell is only limited to the contact area 145"-1,2,3,4 and the rest of PCM is only for connectivity. Another extended source/drains 156"-1,2,3,4 can be coupled to the portions of the fin 147"-1,2,3,4 to serve as bitlines BL1,2,3,4. To program this programmable resistive device, suitable voltages can be applied to the source line, wordline, and bitline to conduct a current flowing through the PCM elements. Thus, the PCM elements can be programmed into high or low resistance state, depending on the magnitude, duration, and/or current/voltage limit. The bitlines, and source line/wordline can run in the vertical and horizontal directions, respectively, to construct a two-dimensional cell array. FIG. 11(b2) shows an equivalent circuit corresponding to the cells shown in FIG. 11(b1). In another embodiment, the PCM is located in each contact hole only so that source line can be separated for each cell while the bitlines can be merged into one.

Figure 12:
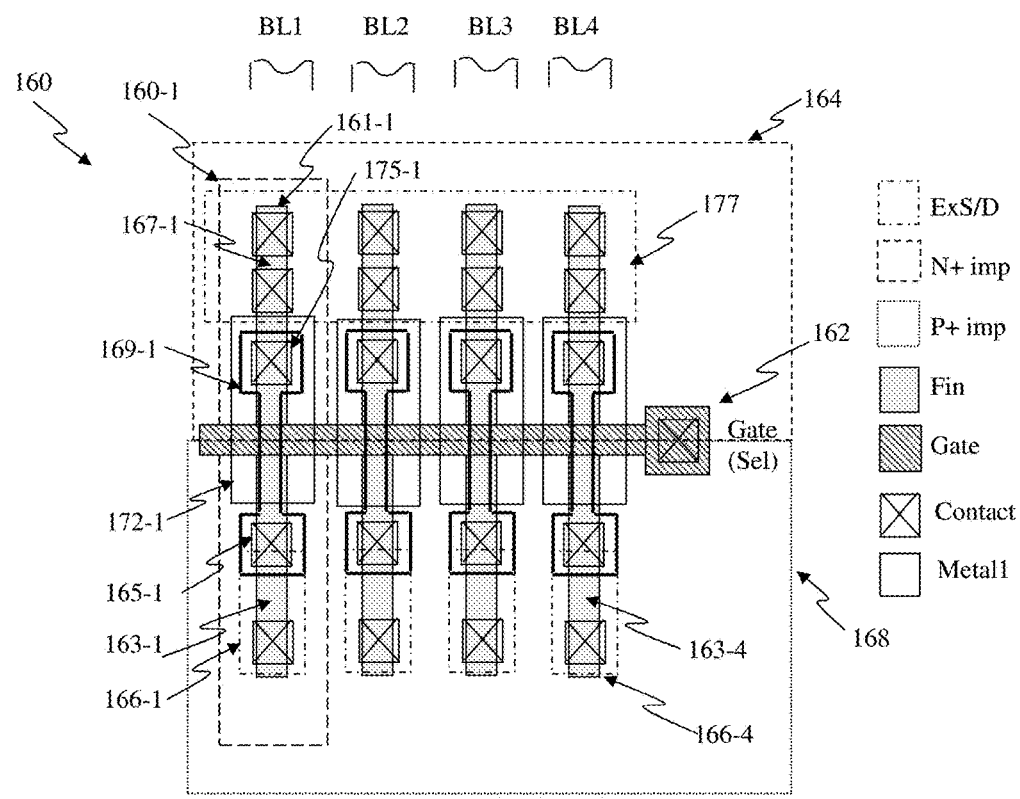
FIG. 12(*a*1) shows a top view of 1×4 reversible programmable resistive cells using diodes as program selectors and planar PCM, according to the present invention.
Figure 12:
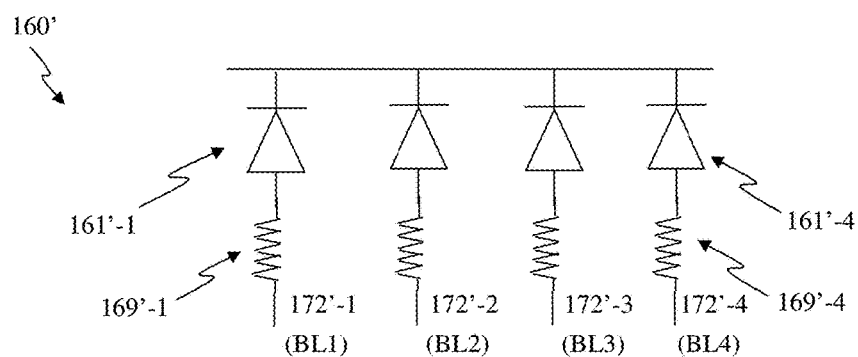
Figure 12:
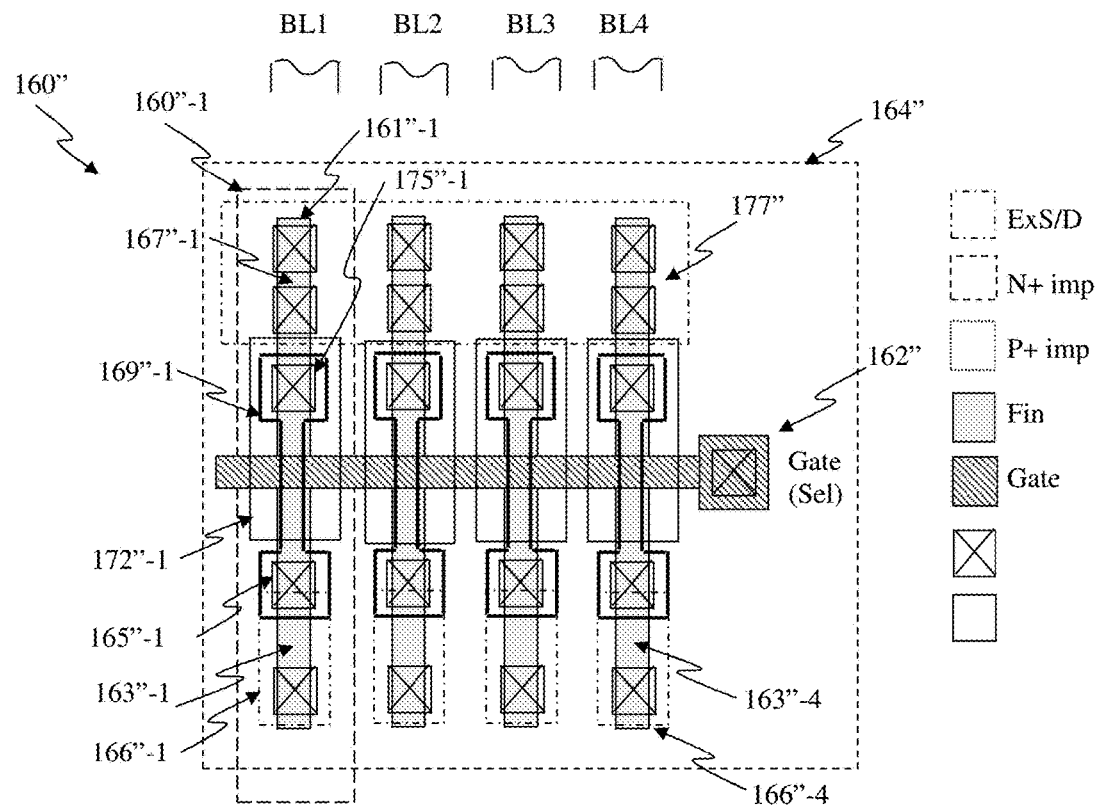
Figure 12:
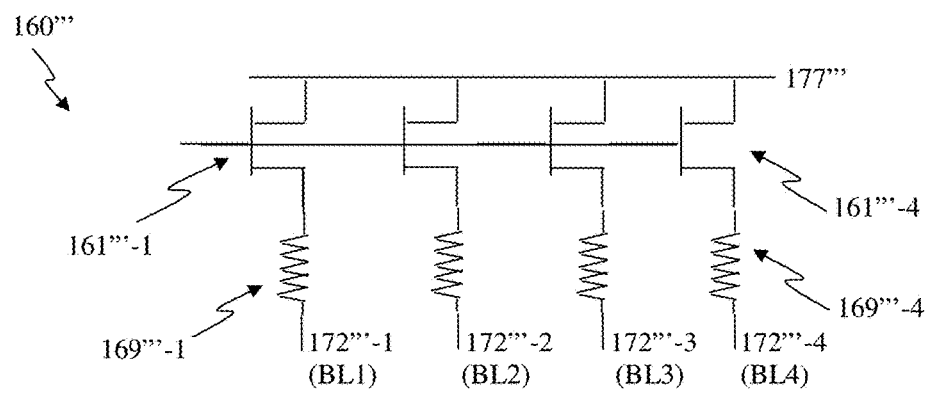

FIG. 12(a1) shows a top view of 1×4 Phase-Change RAM (PCRAM) cells 160 using diodes in FinFETs as program selectors and phase-change memory films (PCMs) as programmable resistive elements in a FinFET technology, according to one embodiment. The PCRAM cells 160-1,2,3,4 can, for example, be used as the programmable resistive cell 30 illustrated in FIG. 4. Diodes are constructed from fins 161-1,2,3,4 with a dummy gate 162 across to divide the fins into 163-1,2,3,4 and 167-1,2,3,4 regions, respectively, which are further covered by P+ implant 168 and N+ implant 164 to serve as P and N portions of the diodes. The regions 163-1,2,3,4 of the fins 161-1,2,3,4 can be built with extended source/drain regions 166-1,2,3,4, which are coupled to PCM 169-1,2,3,4 (through contacts 165-1,2,3,4) and are further coupled to metal bitlines 172-1,2,3,4 (through contact 175-1,2,3,4), respectively. The bitlines 172-1,2,3,4 can run through the cells in the same column. In this embodiment, the PCMs 169-1,2,3,4 are planar structures that can be placed over the program selectors and are separated between cells. Another extended source/drain 177 can be coupled to the N+ portions of the fin 167-1,2,3,4 to serve as the wordline bar (WLB). To program this programmable resistive device, suitable voltages can be applied to the bitline and wordline bar to conduct a current flowing through the PCM elements. Thus, the PCM elements can be programmed into high or low resistance state, depending on the magnitude, duration, and/or current/voltage limit. The bitlines and wordline bar can run in the vertical and horizontal directions, respectively, to construct a two-dimensional cell array. FIG. 12(*a*2) shows an equivalent circuit corresponding to the cells shown in FIG. 12(*a*1).

FIG. 12(*b*1) shows a top view of 1×4 Phase-Change RAM (PCRAM) cells 160" using MOS in FinFETs as program selectors and phase-change memory films (PCMs) as programmable resistive elements in a FinFET technology, according to one embodiment. The PCRAM cells 160"-1,2, 3,4 can, for example, be used as the programmable resistive cell 30 illustrated in FIG. 4. MOS devices are constructed from fins 161"-1,2,3,4 with a gate 162" (as a wordline) across to divide the fins into drains 163"-1,2,3,4 and sources 167"-1,2,3,4 regions, respectively, which are covered by N+ implant 164" to serve as NMOS. The regions 163"-1,2,3,4 of the fins 161"-1,2,3,4 can be built with extended source/drain regions 166"-1,2,3,4, which are coupled to PCMs 169"-1,2, 3,4 (through contacts 165"-1,2,3,4) and are further coupled to metal bitlines 172"-1,2,3,4 (through contact 175"-1,2,3, 4), respectively. The bitlines 172"-1,2,3,4 can run through the cells for the cells in the same column. In this embodiment, the PCMs 169"-1,2,3,4 are planar structures that can be placed over the program selectors and are separated between cells. Another extended source/drain 177" can be coupled to the source portions of the fin 167"-1,2,3,4 to serve as a ground line (VSS). To program this programmable resistive device, suitable voltages can be applied to the bitline, wordline, and ground line to conduct a current flowing through the PCM elements. Thus, the PCM elements can be programmed into high or low resistance state, depending on the magnitude, duration, and/or current/voltage limit. The bitlines and wordline can run in the vertical and horizontal directions, respectively, to construct a two-dimensional cell array. FIG. 12(*b*2) shows an equivalent circuit corresponding to the cells shown in FIG. 12(*b*1).

The programmable resistive elements shown in FIGS. 11(*a*1)-12(*b*2) can be any reversible resistive device that can be programmed into a digital logic value "0" or "1" repetitively and reversibly. The programmable resistive device can be fabricated from phase change material, such as Germanium(Ge), Antimony(Sb), and Tellurium(Te) with composition $Ge_2Sb_2Te_5$ (GST-225) or GeSbTe-like materials including compositions of Indium (In), Tin (Sn), or Selenium (Se). Another phase change film is a chalcogenide material such as AgInSbTe. The phase change material can be programmed into a high resistance amorphous state or a low resistance crystalline state by applying a short and high voltage pulse or a long and low voltage pulse, respectively. Conventionally, to program a phase-change memory to a high resistance state (or reset state) requires about 3V for 50 ns and consumes about 300 uA of current, or to program a phase-change memory to a low resistance state (or set state) requires about 2V for 300 ns and consumes about 100 uA of current.

Another type of reversible resistive device is a class of memory called Resistive RAM (RRAM), which is a normally insulating dielectric, but can be made to conducting through filament, defects, metal migration, etc. The dielectric can be binary transition metal oxides such as NiO or TiO2, perovskite materials such as Sr(Zr)TiO3 or PCMO, organic charge transfer complexes such as CuTCNQ, or organic donor-acceptor systems such as Al AlDCN. One common RRAM has cells fabricated from metal oxides between electrodes, such as Pt/NiO/Pt, TiN/TiOx/HfO2/ TiN, TiN/ZnO/Pt, etc. The resistance states can be changed reversibly and determined by polarity, magnitude, duration, or voltage/current-limit of pulse(s) to generate or annihilate conductive filaments. Another programmable resistive device similar to RRAM is a Conductive Bridge RAM (CBRAM) that is based on electro-chemical deposition and removal of metal ions in a thin solid-state electrolyte film. The electrodes can be an oxidizable anode and an inert cathode and the electrolyte can be Ag- or Cu-doped chalcogenide glass such as GeSe or GeS, etc. The resistance states can be changed reversibly and determined by polarity, magnitude, duration, or voltage/current-limit of pulse(s) to generate or annihilate conductive bridges.

Figure 13:
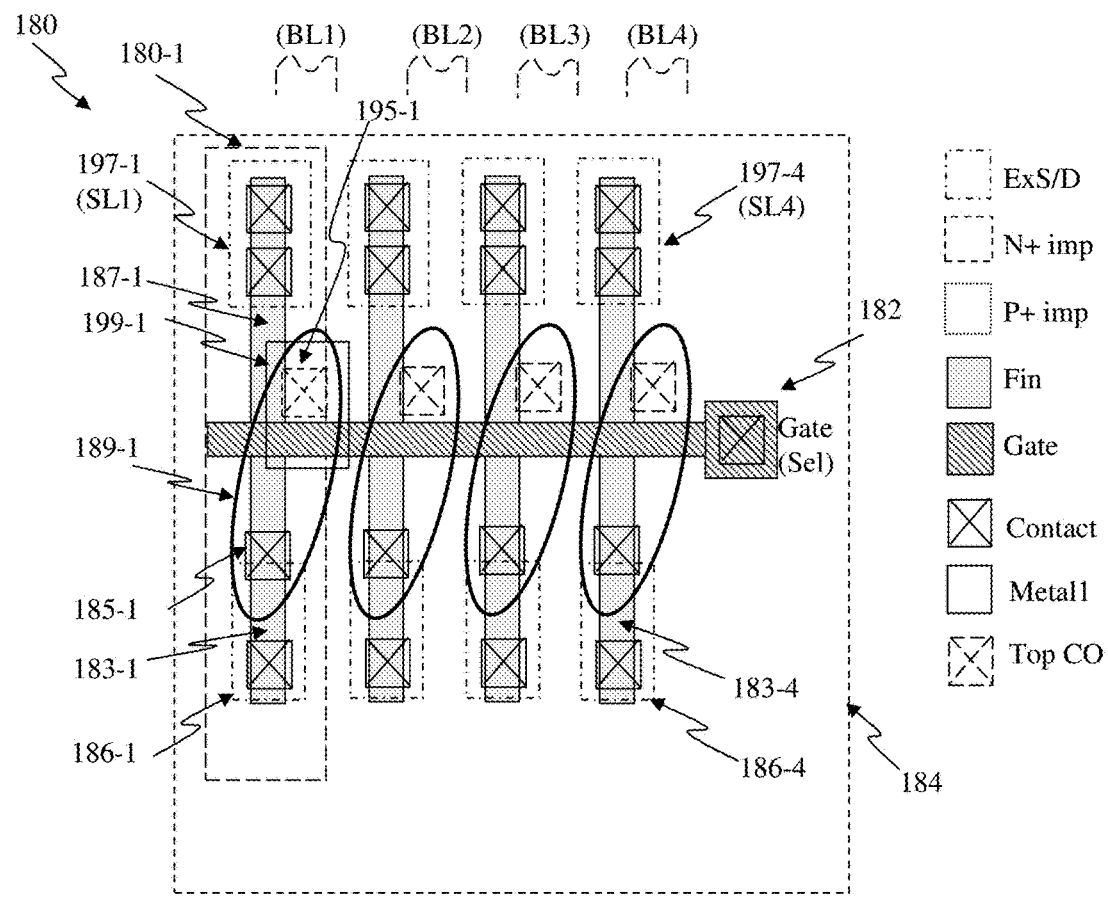
FIG. 13(*a*1) shows a top view of 1×4 MRAM cells using MOS FinFETs as program selectors and Magnetic Tunnel Junctions (MTJs) as resistive elements, according to the present invention.
Figure 13:
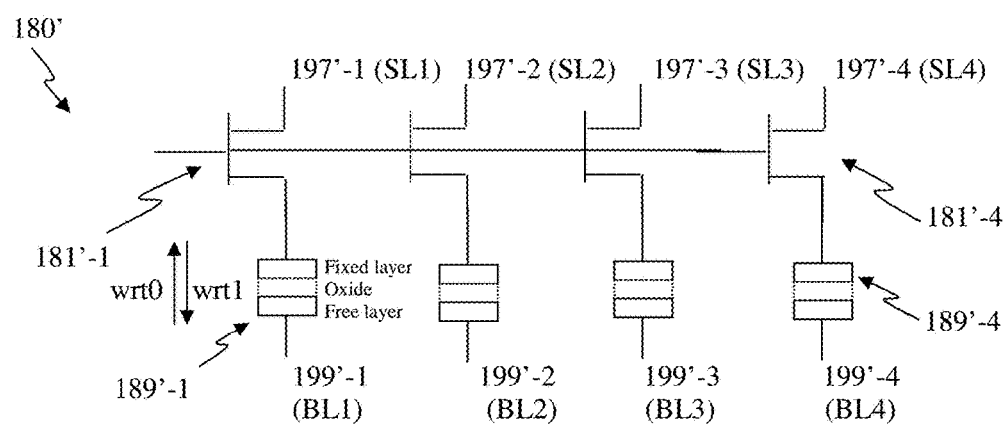
Figure 13:
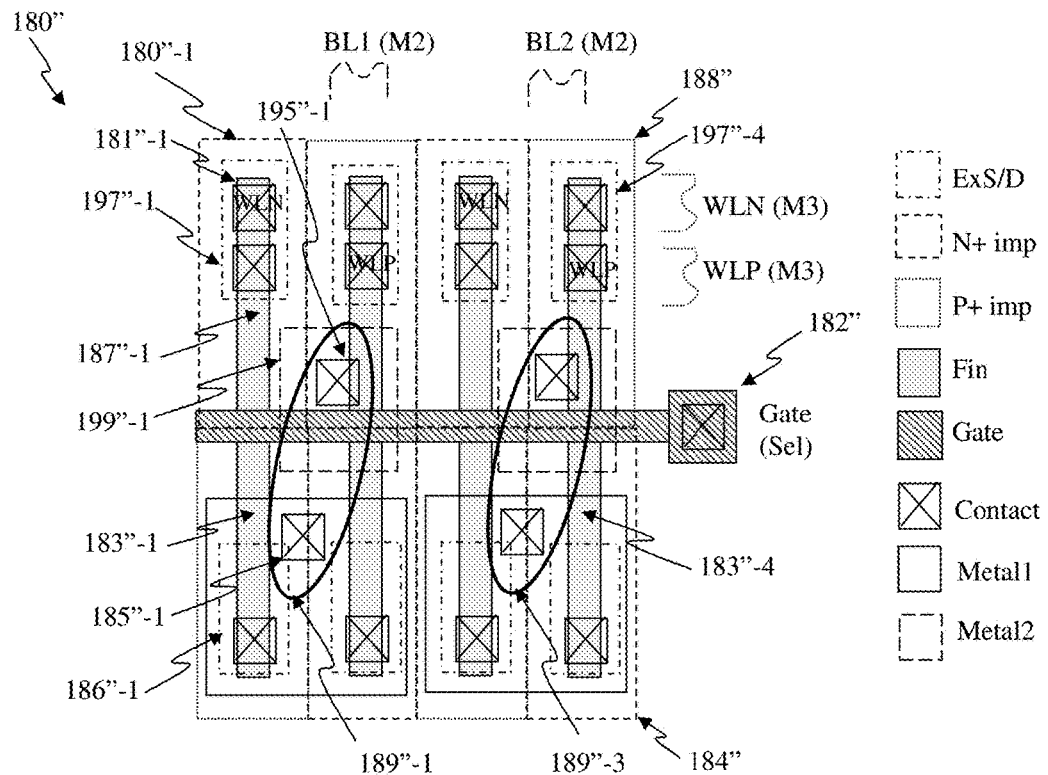
Figure 13:
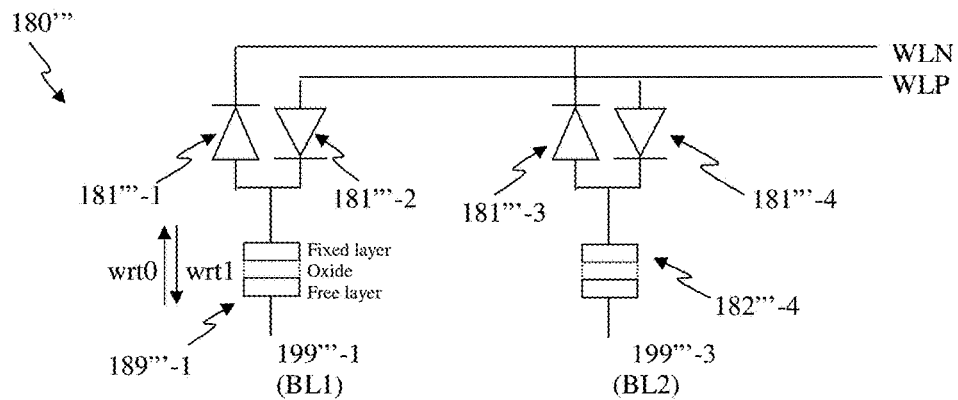

FIG. 13(*a*1) shows a top view of 1×4 Magnetic RAM (MRAM) cells 180 using MOS devices in FinFETs as program selectors and Magnetic Tunnel Junctions (MTJs) as programmable resistive elements in a FinFET technology, according to one embodiment. The MRAM cells 180 can, for example, be used as the programmable resistive cell 30 illustrated in FIG. 4. MOS devices are constructed from fins 181-1,2,3,4 with a gate 182 (as a wordline) across to divide the fins into 183-1,2,3,4 and 187-1,2,3,4 regions, respectively, which are covered by N+ implant 184 to create NMOS. The regions 183-1,2,3,4 of the fins 181-1,2,3,4 can be built with extended source/drain regions 186-1,2,3,4 where contacts 185-1,2,3,4 are built and coupled to MTJs 189-1,2,3,4, respectively. The MTJs 189-1,2,3,4 are further coupled to metals 199-1,2,3,4 through top contacts 195-1, 2,3,4, respectively. The metals 199-1,2,3,4 can run through the cells and serve ad bitlines BL1,2,3,4, respectively. Another extended source/drain 197-1,2,3,4 can be coupled to the portions of the fin 187-1,2,3,4 to serve as source lines (SLs). To program the MRAM into a 0 state, a high and a low voltage can be applied to the bitline, and source line, respectively, to conduct a current flowing through the MTJ, while the wordline is turned on. To program the MRAM into a 1 state, a low and a high voltage can be applied to the bitline and source line, respectively, to conduct a current flowing through the MTJ, while the wordline is turned on. Thus, the MTJs can be programmed into high or low resistance state, depending on the current direction. The bitlines and wordline can run in the vertical and horizontal directions, respectively, to construct a two-dimensional cell array. The FinFETs in a MRAM cell can be single or plural of fin structures in other embodiment. FIG. 13(*a*2) shows an equivalent circuit corresponding to the cells shown in FIG. 13(*a*1).

FIG. 13(*b*1) shows a top view of 1×2 Magnetic RAM (MRAM) cells 180" using diodes in FinFETs as program selectors and Magnetic Tunnel Junctions (MTJs) as programmable resistive elements in a FinFET technology, according to one embodiment. FIG. 13(*b*1) is similar to FIG. 13(*a*1), except that two diodes are used as program selectors in a cell for programming 0 and 1, respectively. The MRAM cells 180" can, for example, be used as the programmable resistive cell 30 illustrated in FIG. 4. Diodes are constructed from fins 181"-1,2,3,4 with a dummy gate 182" across to divide the fins into 183"-1,2,3,4 and 187"-1,2,3,4 regions, respectively, which are further covered by P+ implant 188" and N+ implant 184" to create P and N portions of the diodes 180"-1,2,3,4, respectively. The regions 183"-1,2,3,4 of the fins 181"-1,2,3,4 can be built with extended source/drain regions 186"-1,2,3,4. The P portion of the diode 181"-1 is coupled to the N portion of the diode 181"-2 and they are further coupled to a MTJ 189"-1 through a contact 185"-1. Similarly, the P portion of the diode 181"-3 is coupled to the N portion of the diode 181"-4 and they are further coupled to a MTJ 189"-3 through a contact 185"-3. The MTJs 189"-1,3 are further coupled to metals 199"-1,3 through top contacts 195"-1,3, respectively. The metals 199"-1,3 can run through the cells and serve ad bitlines BL1,2, respectively. Another extended source/drains 197"-1,2,3,4 can be coupled to the portions of the fin 187"-1,2,3,4, respectively. The extended source/drains 197"-1 and 197"-3 are coupled as wordline N (WLN) and the extended source/drains 197"-2 and 197'-4 are coupled as wordline P (WLP). To program this MTJ 180"-1 into 0, a high and a low voltage can be applied to the bitline BL1 and WLN, respectively, to turn on the diode 181"-1 and conduct a current flowing through the MTJ. To program this MTJ 180"-1 into 1, a low and a high voltage can be applied to the bitline BL1 and WLP, respectively, to turn on the diode 181"-2 and conduct a current flowing through the MTJ. Thus, the MTJs can be programmed into high or low resistance state, depending on the current directions. The bitlines and WLN/WLP can run in the vertical and horizontal directions, respectively, to construct a two-dimensional cell array. In some embodiments, the WLN and WLP can be merged as one. FIG. 13(b2) shows an equivalent circuit corresponding to the cells shown in FIG. 13(b1).

The programmable resistive cells in FIG. 13(a1)-13(b2) can be applied to those resistive elements that can be programmed based on current directions. For example, the resistive elements in 13(a1)-13(b2) can be MTJs that have at least one free layer stack, at least one fixed layer stack, and a dielectric in between, The free or fixed layer stacks can include multiple layers of ferromagnetic or anti-ferromagnetic films and the dielectric can be metal oxide, such as $Al_2O_3$ or MgO. By applying a proper current to the MTJ with the proper program selector turned on, the free layer stack can be aligned into magnetic parallel or anti-parallel to the fixed layer stack depending on the current flowing into or out of the fixed layer stack as state 0 or state 1, respectively. Thus, the magnetic states can be programmed and the resultant states can be determined by resistance values, lower resistance for parallel and higher resistance for anti-parallel states. The resistances in MRAM state 0 or 1 are about 5KΩ or 10KΩ, respectively, and the program currents are about +/−100-200 μA. Some kinds of RRAMs or CBRAMs can be programmed based on current directions, and therefore, they can be used as resistive elements in other embodiments.

Figure 14:
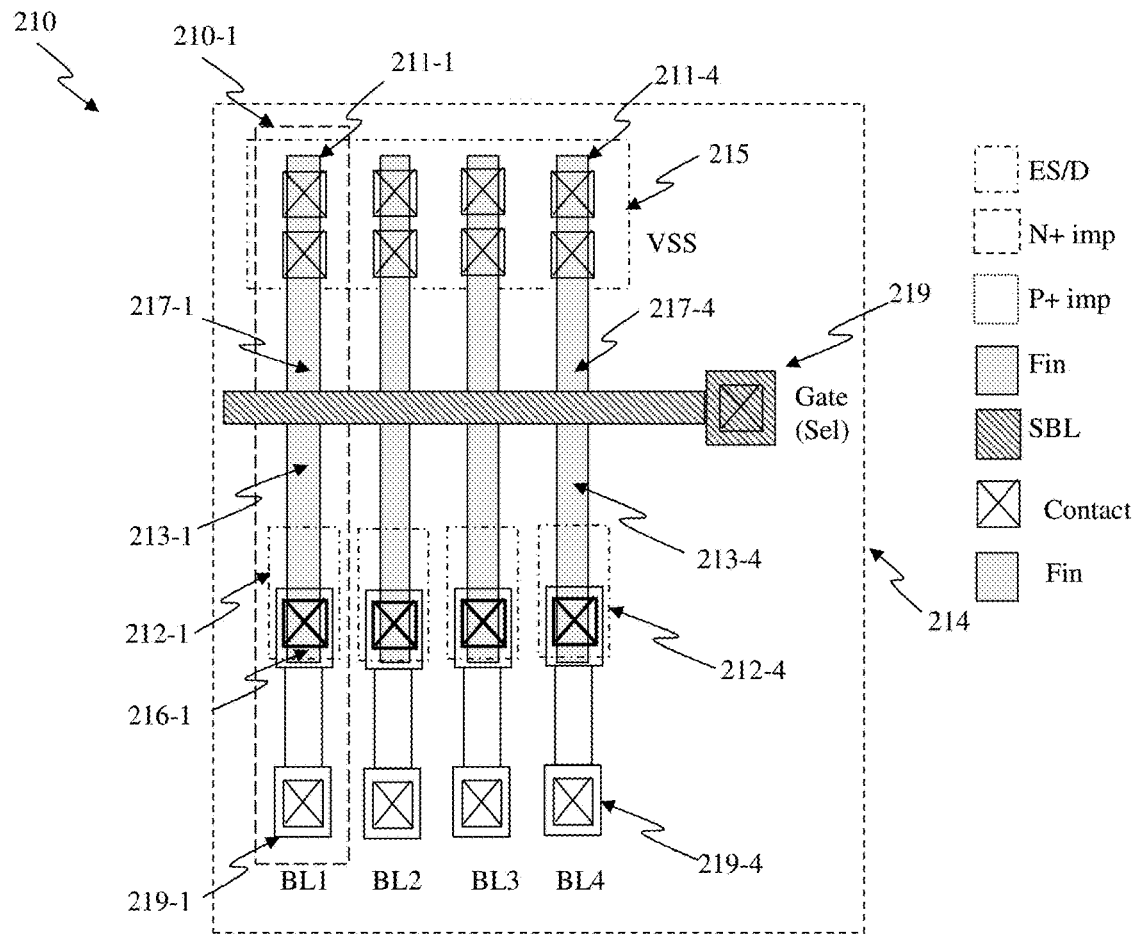
FIG. 14(*a*1) shows a top view of contact-fuse cells using MOS devices in FinFETs as program selectors and contacts as OTP elements, according to another embodiment.
Figure 14:
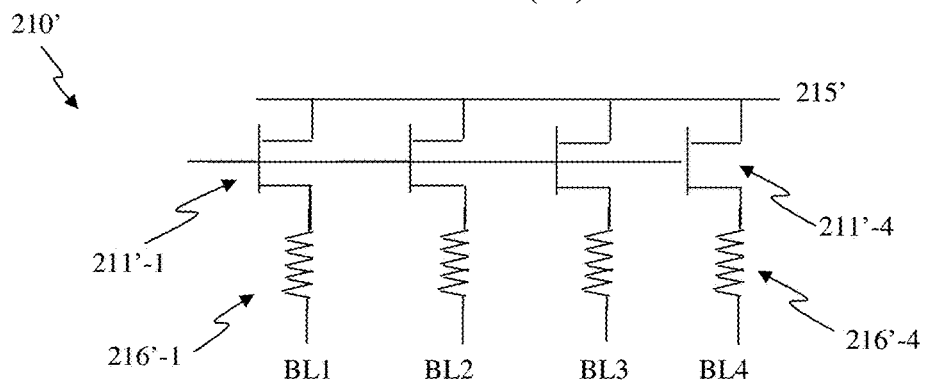
Figure 14:
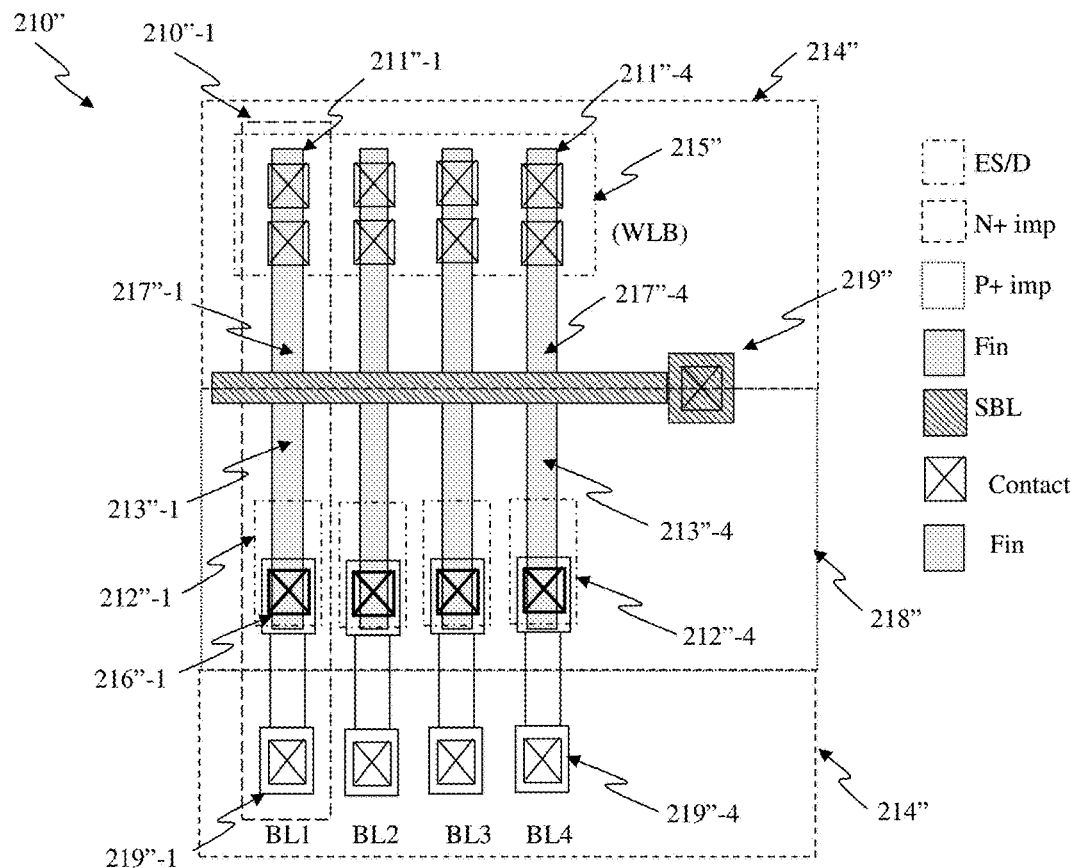
Figure 14:
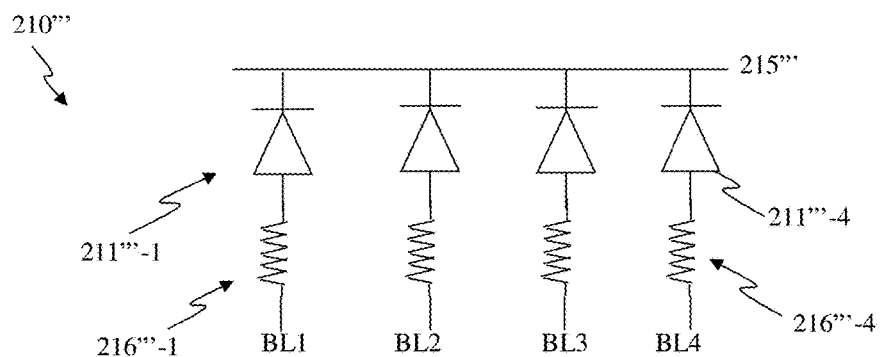

FIG. 14(a1) shows a top view of 1×4 contact-fuse cells 210 using MOS devices in FinFETs as program selectors and conductive contacts as OTP elements, respectively, in a FinFET technology according to one embodiment. The cells 210 can, for example, be used as the programmable resistive cell 30 illustrated in FIG. 4. MOS devices are constructed from fins 211-1,2,3,4 with a gate 219 across to divide the fins into drains 213-1,2,3,4 and sources 217-1,2,3,4 regions, respectively, which are further covered by N+ implant 214 to construct NMOS devices. The regions 213-1,2,3,4 of the fins 211-1,2,3,4 can be built with extended source/drain regions 212-1,2,3,4 and coupled to bitlines 219-1,2,3,4 through contacts 216-1,2,3,4 as OTP elements. The contact 216-1,2,3,4 can be a single or plural of contacts for each OTP cell. The regions 217-1,2,3,4 of the fins 211-1,2,3,4 can be built with an extended source/drain region 215 and coupled to a ground line (VSS). The gate 219 can be coupled to a wordline (WL). To program this programmable resistive device, suitable voltages can be applied to the bitline, ground line, and wordline to turn on the MOS devices 211-1,2,3,4 and to conduct a current flowing through the contacts. Thus, the contacts can be programmed into a high resistance state, depending on the magnitude and duration of the current. The bitlines and wordlines/ground line can run in the vertical and horizontal directions, respectively, to construct a two-dimensional cell array. FIG. 14(a2) shows an equivalent circuit corresponding to the cells shown in FIG. 14(a1). The concept of contact fuse can be applied other types of via fuses, such as via1, via2, or via3, etc. The other contacts/vias in the conductive path can be made larger or more than one to prevent undesirable programming. Similarly, the other interconnects in the conductive path, such as metals, can be wider to prevent undesirable programming.

FIG. 14(b1) shows a top view of 1×4 contact-fuse cells 210" using diodes in FinFETs as program selectors and contacts as OTP elements, respectively, in a FinFET technology, according to one embodiment. The cells 210" can, for example, be used as the programmable resistive cell 30 illustrated in FIG. 4. Diodes are constructed from fins 211"-1,2,3,4 with a dummy gate 219" across to divide the fins into 213"-1,2,3,4 and 217"-1,2,3,4 regions, respectively, which are further covered by P+ implant 218" and N+ implant 214", respectively, to construct the P and N regions of the diodes. The regions 213"-1,2,3,4 of the fins 211"-1, 2,3,4 can be built with extended source/drain regions 212"-1,2,3,4 and coupled to metal bitlines 219"-1,2,3,4 through contacts 216"-1,2,3,4. The contacts 216"-1,2,3,4 can be a single or a plurality of contacts for each OTP cell. The regions 217"-1,2,3,4 of the fins 211"-1,2,3,4 can be built with an extended source/drain region 215" and coupled to a wordline bar (WLB). The dummy gate 219" only serves for isolation during fabrication and can be coupled to a fixed voltage supply. To program this programmable resistive device, suitable voltages can be applied to the bitline, and wordline bar to turn on the diodes 211"-1,2,3,4 and to conduct a current flowing through the contacts. Thus, the contacts can be programmed into a high resistance state, depending on the magnitude and duration of the current. The bitlines and wordline bars can run in the vertical and horizontal directions, respectively, to construct a two-dimensional cell array. FIG. 14(b2) shows an equivalent circuit corresponding to the cells shown in FIG. 14(b1). The concept of contact fuse can be applied to other types of via fuses, such as via1, via2, or via3, etc. The other contacts/vias in the conductive path can be made larger or more than one to prevent undesirable programming. Similarly, the other interconnects in the conductive path, such as metals, can be wider to prevent undesirable programming.

The fin structures drawn above as program selectors are for illustrative purposes only. A MOS or diode can be constructed from a single or a plurality of fins. The fins to build diodes can be N or P type doped. The substrate can be on N well or P well. The substrate can be bulk or SOI. A diode as program selector can be constructed from a single or a plurality of fins. A diode can be constructed from a fin structure by using a dummy gate or silicide block layer across for isolation. A plurality of diode can be constructed from a single fin by using a plurality of dummy gate or silicide block layers across the fin. Similarly, a diode can be constructed from a P+ fin over N well, or N+ fin over P well in other embodiments. There are many variations and equivalent embodiments to construct diodes in fin structures and that are all within the scope of embodiments of the invention.

The discussions above are for illustrative purposes. For example, the program selectors can be MOS or diodes that comprise a single or plural of fin structures. The MOS can be NMOS or PMOS. The polarity of the diodes can be reversed. The contacts can be a single or a plural, and the contact size can be larger than at least one contact outside of the memory array. The contact enclosure can be smaller than at least one contact enclosure outside of the memory array. The metal scheme can be different. The directions of the wordlines, bitlines, or source lines/ground line can be different. The row and column directions can be interchangeable. The number of the cells in a row, column, or array can be different. There are various and equivalent schemes and their combinations in part or all can be considered as different embodiments and that are within the scope of this invention for those skilled in the art.

Programming a phase-change memory (PCM), such as a phase-change film, depends on the physical properties of the phase-change film, such as glass transition and melting temperatures. To reset, the phase-change film needs to be heated up beyond the melting temperature and then quenched. To set, the phase-change film needs to be heated up between melting and glass transition temperatures and then annealed. A typical PCM film has glass transition temperature of about 200° C. and melting temperature of about 600° C. These temperatures determine the operation temperature of a PCM memory because the resistance state may change after staying in a particular temperature for a long time. However, most applications require retaining data for 10 years for the operation temperature from 0 to 85° C. or even from −40 to 125° C. To maintain cell stability over the device's lifetime and over such a wide temperature range, periodic reading and then writing back data into the same cells can be performed. The refresh period can be quite long, such as longer than a second (e.g., minutes, hours, days, weeks, or even months). The refresh mechanism can be generated inside the memory or triggered from outside the memory. The long refresh period to maintain cell stability can also be applied to other emerging memories such as RRAM, CBRAM, and MRAM, etc.

Figure 15:
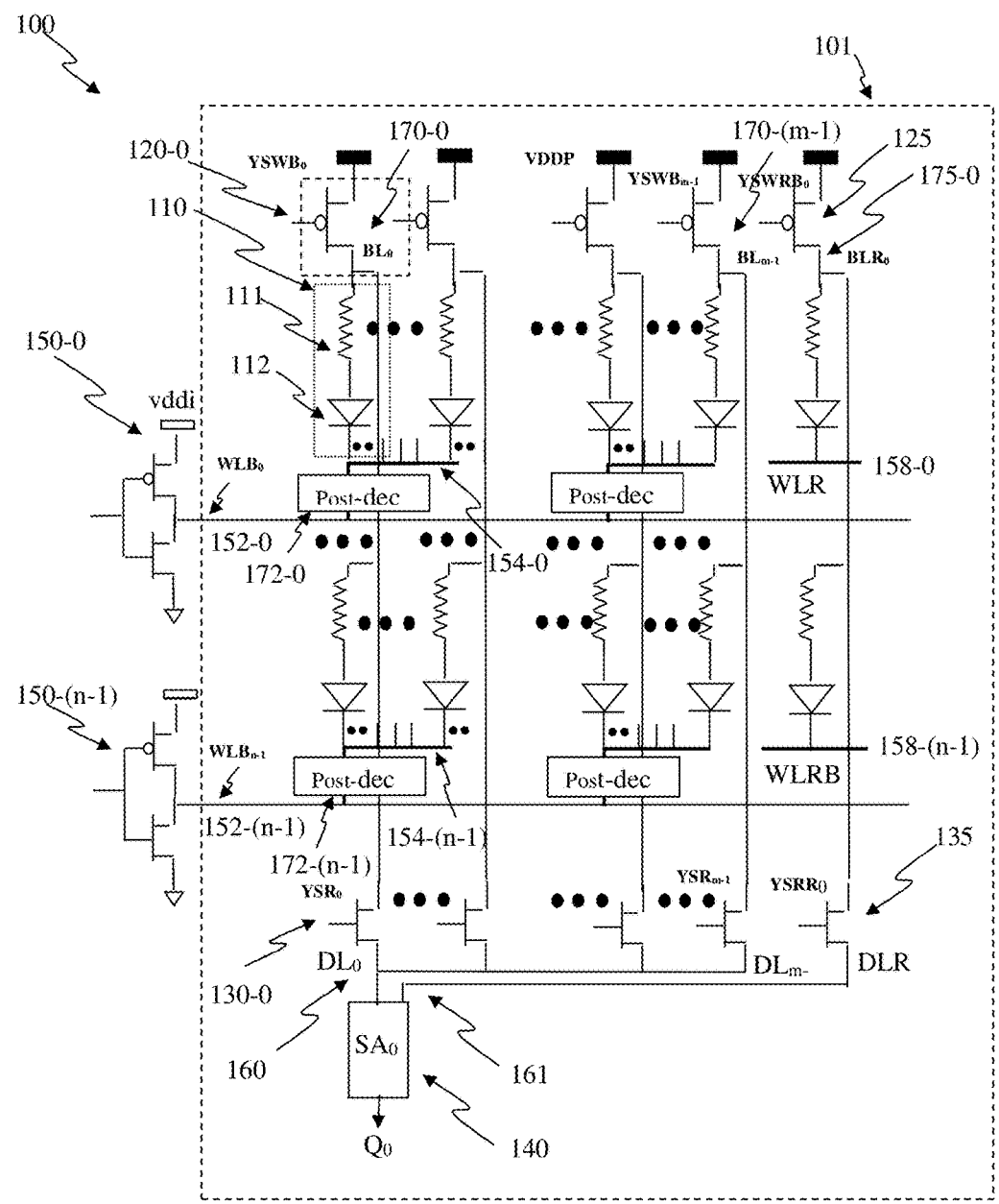
FIG. 15 shows a portion of a programmable resistive memory constructed by an array of n-row by (m+1)-column single-diode-as-program-selector cells and n wordline drivers in accordance with one embodiment.

The programmable resistive devices can be used to construct a memory in accordance with one embodiment. FIG. 15 shows a portion of a programmable resistive memory 100 constructed by an array 101 of n-row by (m+1)-column single-diode-as-program-selector cells 110 and n wordline drivers 150-$i$, where i=0, 1, . . . , n−1, in accordance with one embodiment. The memory array 101 has m normal columns and one reference column for one shared sense amplifier 140 for differential sensing. Each of the memory cells 110 has a resistive element 111 coupled to the P terminal of a diode 112 as program selector and to a bitline BLj 1701 (j=0, 1, . . . m−1) or reference bitline BLR0 175-0 for those of the memory cells 110 in the same column. The N terminal of the diode 112 is coupled to a wordline WLBi 152-$i$ through a local wordline LWLBi 154-$i$, where i=0, 1, . . . , n−1, for those of the memory cells 110 in the same row. Each wordline WLBi is coupled to at least one local wordline LWLBi, where i=0, 1, . . . , n−1. The LWLBi 154-$i$ is generally constructed by a high resistivity material, such as N well, polysilicon, polymetal, active region, extended source/drain, local interconnect, or metal gate, to connect cells, and then coupled to the WLBi (e.g., a low-resistivity metal WLBi) through conductive contacts or vias, buffers, or post-decoders 172-$i$, where i=0, 1, . . . , n−1. Buffers or post-decoders 172-$i$ may be needed when using diodes as program selectors because there are currents flowing through the WLBi, especially when one WLBi drives multiple cells for program or read simultaneously in other embodiments. The wordline WLBi is driven by the wordline driver 150-$i$ (i=0, 1, 2, . . . , n−1) with a supply voltage vddi that can be switched between different voltages for program and read. Each BLj 170-$j$ or BLR0 175-0 is coupled to a supply voltage VDDP through a Y-write pass gate 120-$j$ or 125 for programming, where each BLj 170-$j$ or BLR0 175-0 is selected by YSWBj (j=0, 1, . . . , m−1) or YSWRB0, respectively. The Y-write pass gate 120-$j$ (j=0, 1, . . . , m−1) or 125 can be built by PMOS, though NMOS, diode, or bipolar devices can be employed in some embodiments. Each BLj or BLR0 is coupled to a dataline DLj or DLR0 through a Y-read pass gate 130-$j$ or 135 selected by YSRj (j=0, 1, . . . , m−1) or YSRR0, respectively. In this portion of memory array 101, m normal datalines DLj (j=0, 1, . . . , m−1) are connected to an input 160 of a sense amplifier 140. The reference dataline DLR0 provides another input 161 for the sense amplifier 140 (no multiplex is generally needed in the reference branch). The output of the sense amplifiers 140 is Q0. FIG. 15 can be readily applied to the programmable resistive cells that use MOS as program selector. The MOS program selectors in the cells can have the drains coupled to BLj, the gates coupled to LWLi and sources coupled to a ground line (VSS). The WLBi and LWLBi can be replaced by WLi and LWLi with polarity reversed, respectively, where i=0, 1, 2, . . . , n−1. The wordline and post-wordline drivers have the polarity reversed accordingly. The same can be applied to the reference cells, wordlines, or bitline.

To program a cell, the specific WLBi and YSWBj are turned on and a high voltage is supplied to VDDP, where i=0, 1, . . . n−1 and j=0, 1, . . . , m−1. In some embodiments, the reference cells can be programmed to 0 or 1 by turning on WLRBi, and YSWRB0, where i=0, 1, . . . , n−1. To read a cell, a data column 160 can be selected by turning on the specific WLBi and YSRj, where i=0, 1, . . . , n−1, and j=0, 1, . . . , m−1, and a reference cell coupled to the reference dataline DLR0 161 can be selected for the sense amplifier 140 to sense and compare the resistance difference between normal/reference BLs and ground, while disabling all YSWBj and YSWRB0 where j=0, 1, . . . , m−1.

Figure 16A:
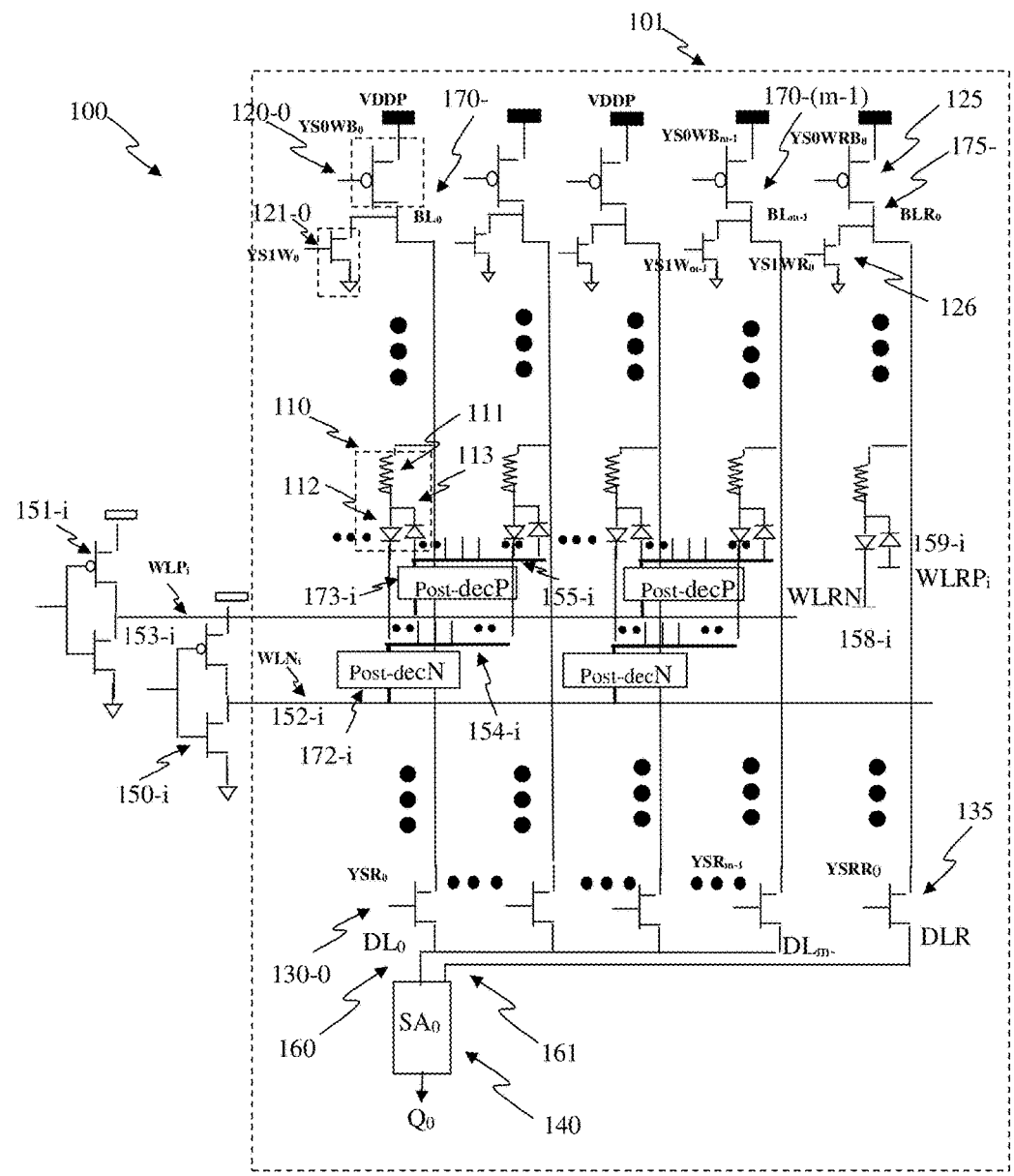
FIG. 16(*a*) shows a portion of a programmable resistive memory constructed by an array of 3-terminal MRAM cells according to one embodiment.

The programmable resistive devices can be used to construct a memory in accordance with one embodiment. FIG. 16(a) shows a portion of a programmable resistive memory 100 constructed by an array 101 of 3-terminal MRAM cells 110 in n rows and m+1 columns with n pairs of wordline drivers 150-$i$ and 151-$i$, where i=0, 1, . . . , n−1, according to one embodiment. The memory array 101 has m normal columns and one reference column for one shared sense amplifier 140 for differential sensing. Each of the memory cells 110 has a resistive element 111 coupled to the P terminal of a program-0 diode 112 and N terminal of a program-1 diode 113. The program-0 diode 112 and the program-1 diode 113 serve as program selectors. Each resistive element 111 is also coupled to a bitline BLj 1701 (j=0, 1, . . . m−1) or reference bitline BLR0 175-0 for those of the memory cells 110 in the same column. The N terminal of the diode 112 is coupled to a wordline WLNi 152-$i$ through a local wordline LWLNi 154-$i$, where i=0, 1, . . . , n−1, for those of the memory cells 110 in the same row. The P terminal of the diode 113 is coupled to a wordline WLPi 153-$i$ through a local wordline LWLPi 155-$i$, where i=0, 1, . . . , n−1, for those cells in the same row. Each wordline WLNi or WLPi is coupled to at least one local wordline LWLNi or LWLPi, respectively, where i=0, 1, ..., n−1. The LWLNi 154-*i* and LWLPi 155-*i* are generally constructed by a high resistivity material, such as N well, polysilicon, local interconnect, active region, extended source/drain, or metal gate to connect cells, and then coupled to the WLNi or WLPi (e.g., low-resistivity metal WLNi or WLPi) through conductive contacts or vias, buffers, or post-decoders 172-*i* or 173-*i* respectively, where i=0, 1, ..., n−1. Buffers or post-decoders 172-*i* or 173-*i* may be needed when using diodes as program selectors because there are currents flowing through WLNi or WLPi, especially when one WLNi or WLPi drivers multiple cells for program or read simultaneously in some embodiments. The wordlines WLNi and WLPi are driven by wordline drivers 150-*i* and 151-*i*, respectively, with a supply voltage vddi that can be switched between different voltages for program and read. Each BLj 170-*j* or BLR0 175-0 is coupled to a supply voltage VDDP through a Y-write-0 pass gate 120-*j* or 125 to program 0, where each BLj 170-*j* or BLR0 175-0 is selected by YS0WBj (j=0, 1, ..., m−1) or YS0WRB0, respectively. Y-write-0 pass gate 120-*j* or 125 can be built by PMOS, though NMOS, diode, or bipolar devices can be employed in other embodiments. Similarly, each BLj 170-*j* or BLR0 175-0 is coupled to a supply voltage 0V through a Y-write-1 pass gate 121-*j* or 126 to program 1, where each BLj 1701 or BLR0 175-0 is selected by YS1Wj (j=0, 1, ..., m−1) or YS1WR0, respectively. Y-write-1 pass gate 121-*j* or 126 can be built by NMOS, though PMOS, diode, or bipolar devices can be employed in other embodiments. Each BLj or BLR0 is coupled to a dataline DLj or DLR0 through a Y-read pass gate 1301 or 135 selected by YSRj (j=0, 1, ..., m−1) or YSRR0, respectively. In this portion of memory array 101, m normal datalines DLj (j=0, 1, ..., m−1) are connected to an input 160 of a sense amplifier 140. Reference dataline DLR0 provides another input 161 for the sense amplifier 140, except that no multiplex is generally needed in a reference branch. The output of the sense amplifier 140 is Q0.

To program a 0 into a cell, the specific WLNi, WLPi, and BLj are selected by wordline drivers 150-*i* and 151-*i*, and Y-pass gate 120-*j* (by YS0WBj), respectively, where i=0, 1, ... n−1 and j=0, 1, ..., m−1, while the other wordlines and bitlines are properly set. A high voltage is applied to VDDP. In some embodiments, the reference cells can be programmed into 0 by setting proper voltages to WLRNi 158-*i*, WLRPi 159-*i* and YS0WRB0, where i=0, 1, ..., n−1. To program a 1 to a cell, the specific WLNi, WLPi and BLj are selected by wordline drivers 150-*i*, 151-*i*, and Y-pass gate 121-*j* (by YS1Wj), respectively, where i=0, 1, ... n−1 and j=0, 1, ..., m−1, while the other wordlines and bitlines are also properly set. In some embodiments, the reference cells can be programmed to 1 by setting proper voltages to WLRNi 158-*i*, WLRPi 159-*i* and YS1WR0, where i=0, 1, ..., n−1. To read a cell, a data column 160 can be selected by turning on the specific WLNi, WLPi and YSRj, where i=0, 1, ..., n−1, and j=0, 1, ..., m−1, and a reference cell coupled to the reference dataline DLR 161 for the sense amplifier 140 to sense and compare the resistance difference between normal/reference BLs and ground, while disabling all YS0WBj, YS0WRB0, YS1Wj and YS1WR0, where j=0, 1, ..., m−1.

Figure 16B:
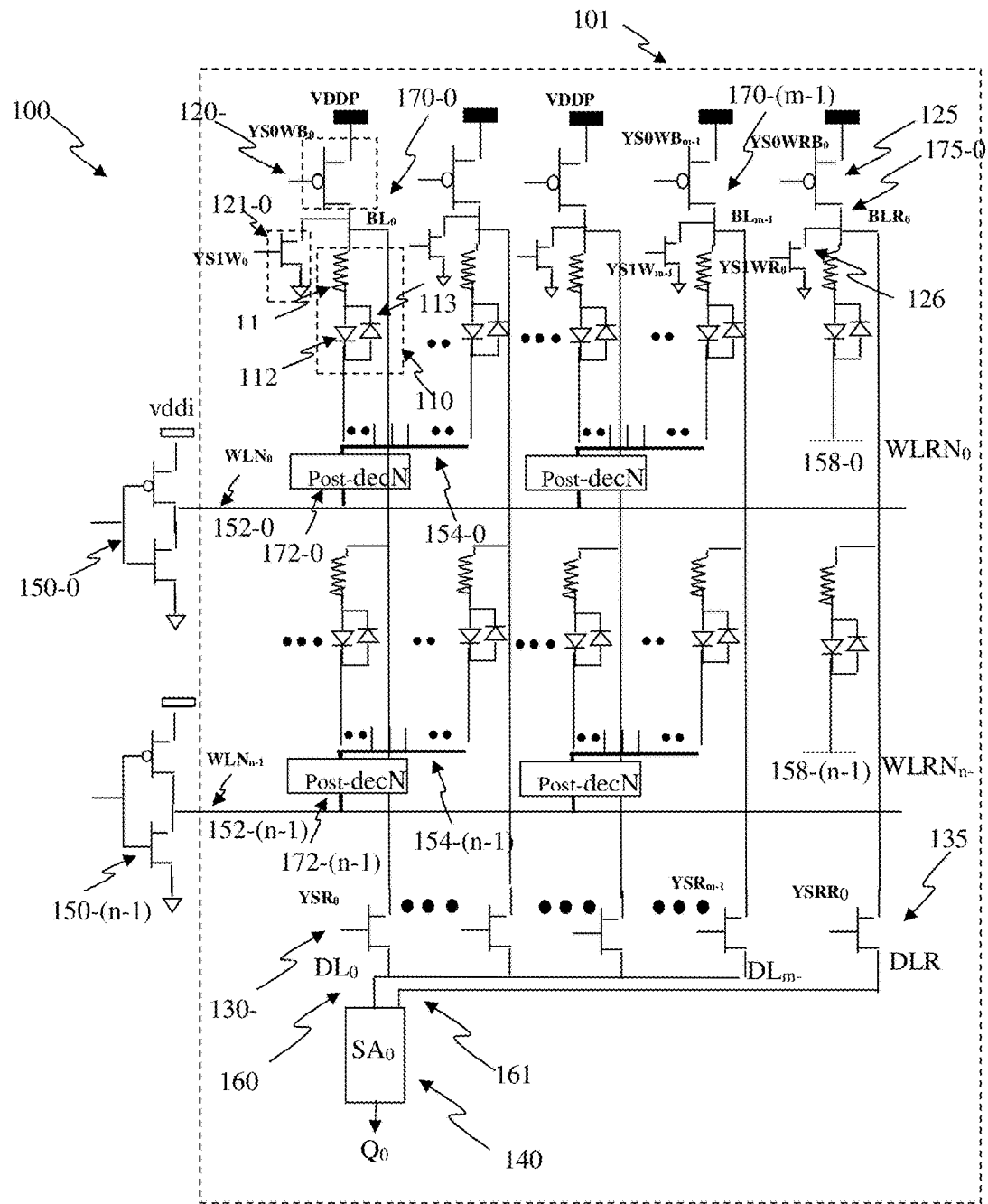

Another embodiment of constructing an MRAM memory with 2-terminal MRAM cells is shown in FIG. 16(*b*), provided the voltage difference between high and low states VDDP, is no more than twice of the diode's threshold voltage Vd, i.e., VDDP<2*Vd. As shown in FIG. 16(*b*), two wordlines per row WLNi 152-*i* and WLPi 153-*i* in FIG. 16(*a*) can be merged into one wordline driver WLNi 152-*i*, where i=0, 1, ..., n−1. Also, the local wordlines LWLNi 154-*i* and LWLP 155-*i* per row in FIG. 16(*a*) can be merged into one local wordline LWLNi 154-*i*, where i=0, 1, ..., n−1, as shown in FIG. 16(*b*). Still further, two wordline drivers 150-*i* and 151-*i* in FIG. 16(*a*) can be merged into one, i.e., wordline driver 150-*i*. The BLs and WLNs of the unselected cells can be applied with suitable supply voltages. Since half of wordlines, local wordlines, and wordline drivers can be eliminated in this embodiment, cell and macro areas can be reduced substantially.

FIGS. 16(*a*) and 16(*b*) can be readily applied to the MRAM cells that use MOS as program selectors. Two diodes as program selectors in the cells in FIGS. 16(*a*) and 16(*b*) can be replaced by at least one fin structure of a single MOS device with the drain and source replacing the P and N terminals of the program-0 diode, respectively. Program-1 diode can be omitted. Local wordlines WLPi (i=0, 1, 2, ..., n−1) are coupled to the gates of MOS devices in the same row. Using MOS as program selector, only one program selector is needed for bi-directional programming, though a plurality of fin structures may be needed because MOS may have lower driving capabilities than diodes.

Figure 17A:
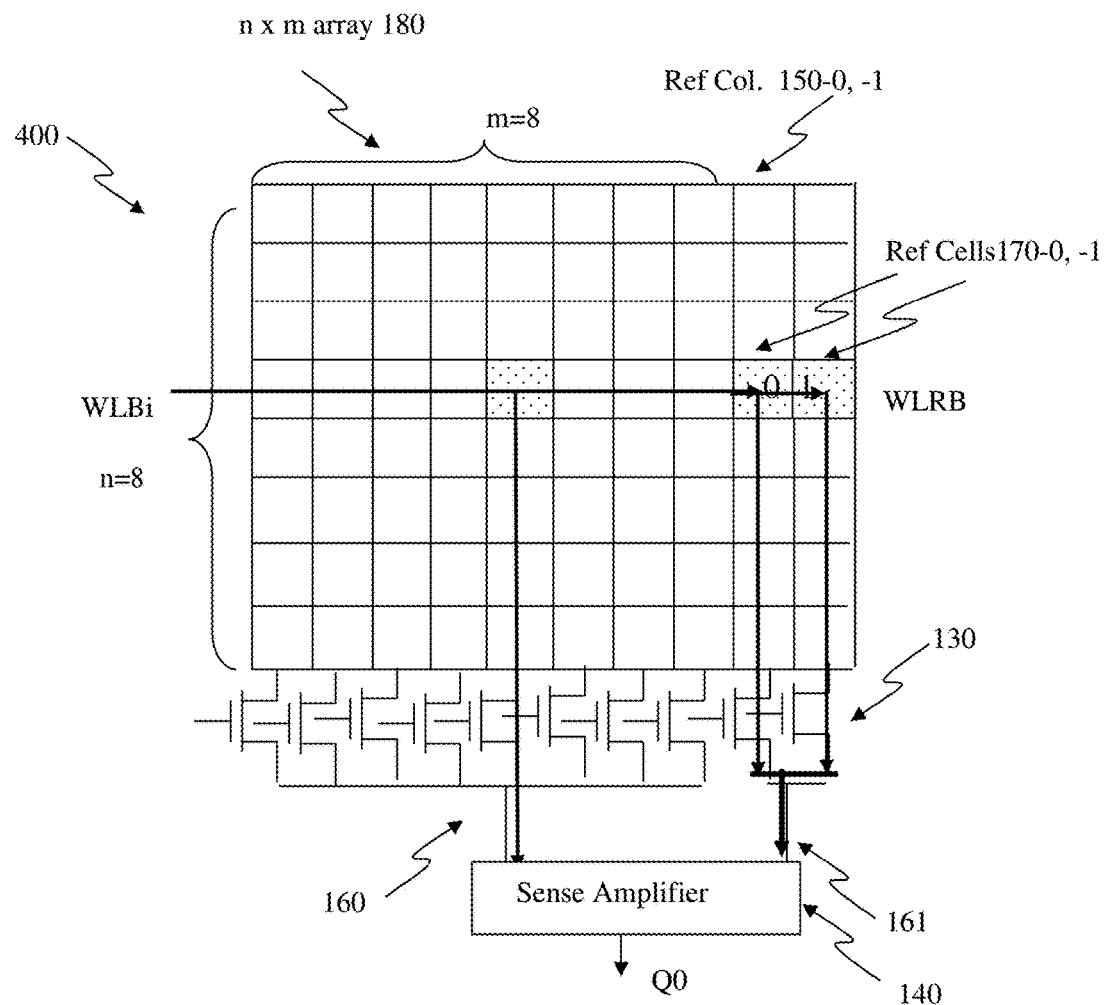
FIGS. 17(*a*), 17(*b*), and 17(*c*) show three other embodiments of constructing reference cells for differential sensing.
Figure 17B:
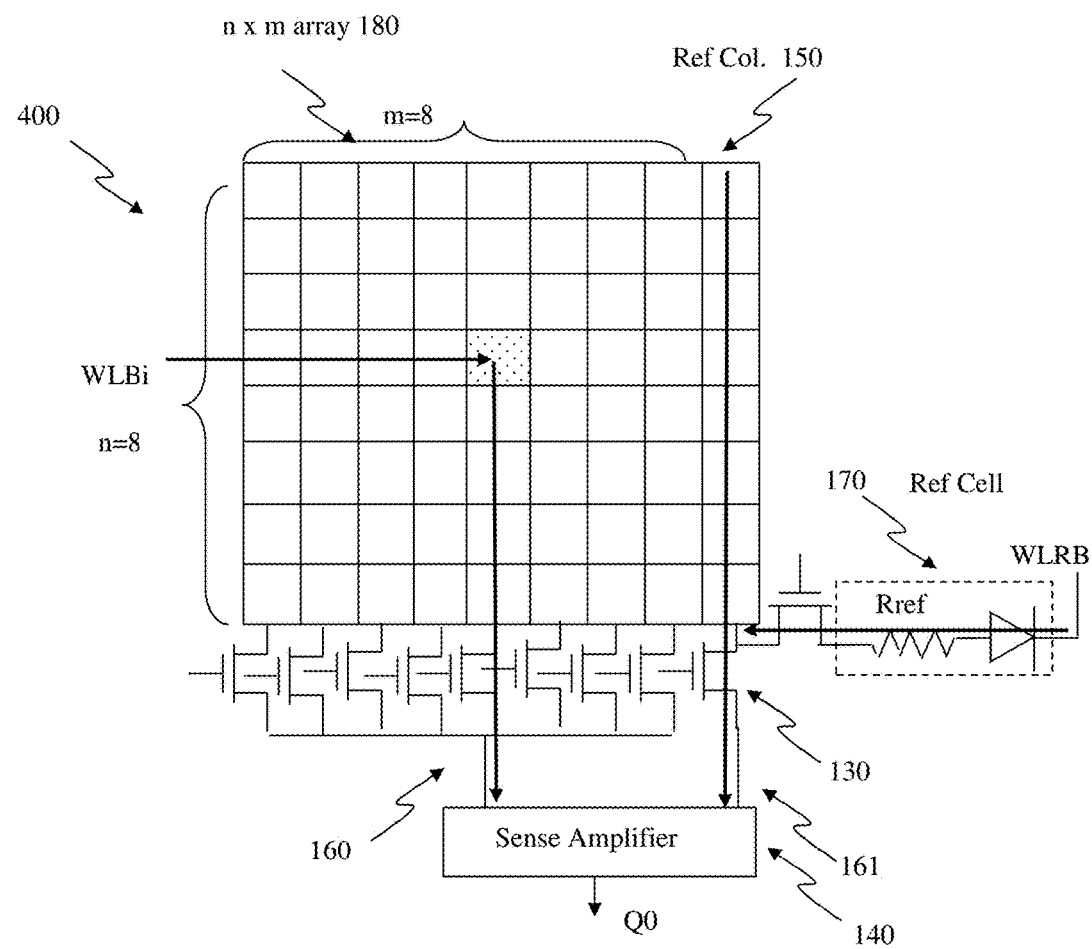
Figure 17C:
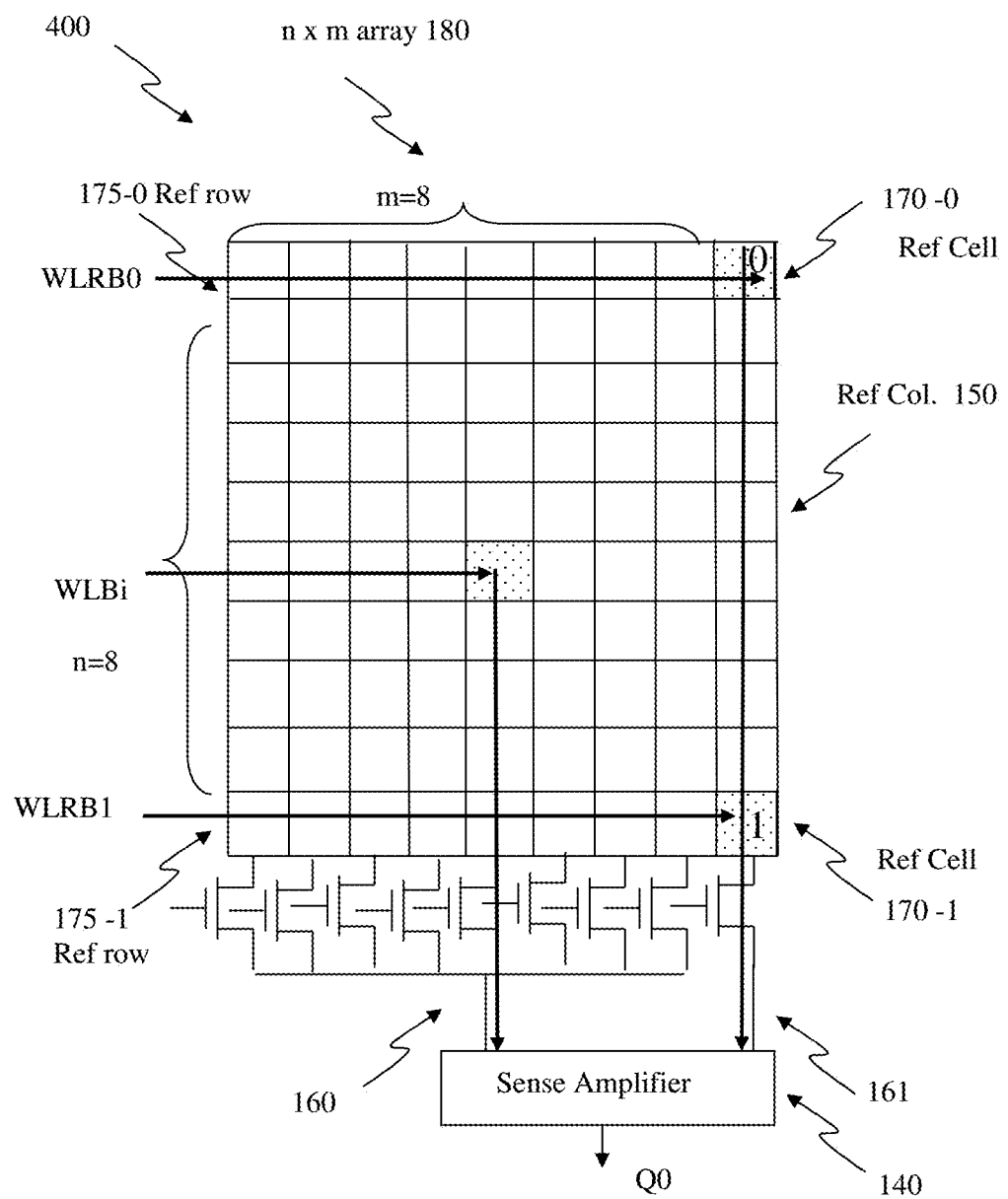

Differential sensing is a common for programmable resistive memory, though single-end sensing can be used in other embodiments. FIGS. 17(*a*), 17(*b*), and 17(*c*) show three other embodiments of constructing reference cells for differential sensing. In FIG. 17(*a*), a portion of memory 400 has a normal array 180 of n×m cells, two reference columns 150-0 and 150-1 of n×1 cells each storing all data 0 and 1 respectively, m+1 Y-read pass gates 130, and a sense amplifier 140. As an example, n=8 and m=8 are used to illustrate the concept. There are n wordlines WLBi and n reference wordlines WLRBi for each column, where i=0, 1, ..., n−1. When a wordline WLBi is turned on to access a row, a corresponding reference wordline WLRBi (i=0, 1, ..., n−1) is also turned on to activate two reference cells 170-0 and 170-1 in the same row to provide mid-level resistance after proper scaling in the sense amplifier. The selected dataline 160 along with the reference dataline 161 are input to a sense amplifier 140 to generate an output Q0. In this embodiment, each WLRBi and WLBi (i=0, 1, ..., n−1) are hardwired together and every cells in the reference columns need to be pre-programmed before read.

FIG. 17(*b*) shows another embodiment of using a reference cell external to a reference column. In FIG. 17(*b*), a portion of memory 400 has a normal array 180 of n×m cells, a reference column 150 of n×1 cells, m+1 Y-read pass gates 130, and a sense amplifier 140. When a wordline WLBi (i=0, 1, ..., n−1) is turned on, none of the cells in the reference column 150 are turned on. An external reference cell 170 with a pre-determined resistance is turned on instead by an external reference wordline WLRB. The selected dataline 160 and the reference dataline 161 are input to a sense amplifier 140 to generate an output Q0. In this embodiment, all internal reference wordlines WLRBi (i=0, 1, ..., n−1) in each row can be disabled. The reference column 150 provides a loading to match with that of the normal columns. In other embodiment, the reference column 150 can be omitted.

FIG. 17(*c*) shows another embodiment of constructing reference cells for differential sensing. In FIG. 17(*c*), a portion of memory 400 has a normal array 180 of n×m cells, one reference column 150 of n×1, two reference rows 175-0 and 175-1 of 1×m cells, m+1 Y-read pass gates 130, and a sense amplifier 140. As an example, n=8 and m=8 are used to illustrate the approach. There are n wordlines WLBi and 2 reference wordlines WLRB0 175-0 and WLRB1 175-1 on top and bottom of the array, where i=0, 1, . . . , n−1. When a wordline WLBi (i=0, 1, . . . , n−1) is turned on to access a row, the reference wordline WLRB0 and WLRB1 are also turned on to activate two reference cells 170-0 and 170-1 in the upper and lower right corners of the array 180, which store data 0 and 1 respectively. The selected dataline 160 along with the reference dataline 161 are input to a sense amplifier 140 to generate an output Q0. In this embodiment, all cells in the reference column 150 are disabled except that the cells 170-0 and 170-1 on top and bottom of the reference column 150. Only two reference cells are used for the entire n×m array that needs to be pre-programmed before read.

For those programmable resistive devices that have a very small resistance ratio between states 1 and 0, such as 2:1 ratio in MRAM, FIGS. 17(*a*) and 17(*c*) are desirable embodiments, depending on how many cells are suitable for one pair of reference cells. Otherwise, FIG. 17(*b*) is a desirable embodiment for electrical fuse or PCM that has resistance ratio of more than about 10.

FIGS. 15, 16(*a*), 16(*b*), 17(*a*), 17(*b*), and 17(*c*) show only a few embodiments of a portion of programmable resistive memory in a simplified manner. The memory array 101 in FIGS. 15, 16(*a*), and 16(*b*) can be replicated s times to read or program s-cells at the same time. In the case of differential sensing, the number of reference columns to normal columns may vary and the physical location can also vary relative to the normal data columns. Rows and columns are interchangeable. The numbers of rows, columns, or cells likewise may vary. For those skilled in the art understand that the above descriptions are for illustrative purpose. Various embodiments of array structures, configurations, and circuits are possible and are still within the scope of this invention.

The portions of programmable resistive memories shown in FIGS. 15, 16(*a*), 16(*b*), 17(*a*), 17(*b*) and 17(*c*) can include different types of resistive elements. The resistive element can be an electrical fuse including a fuse fabricated from an interconnect, contact/via fuse, contact/via anti-fuse, or gate oxide breakdown anti-fuse. Particularly, anti-fuse based on dielectric, junction, source/drain breakdown, or source/drain punch-through can be embodied easily in FinFET technologies. The interconnect fuse can be formed from silicide, polysilicon, silicided polysilicon, metal, metal alloy, local interconnect, thermally isolated active region, or some combination thereof, or can be constructed from a CMOS gate. The resistive element can also be fabricated from the elements in PCRAM, RRAM, CBRAM, or MRAM cells, etc. For the electrical fuse fabricated from an interconnect, contact, or via fuse, programming requirement is to provide a sufficiently high current, about 4-20 mA range, for a few microseconds to blow the fuse by electro-migration, heat, ion diffusion, or some combination thereof. For anti-fuse, programming requirement is to provide a sufficiently high voltage to breakdown the dielectric, junction, gate oxide, or source/drain between two ends of a contact, via, diode, CMOS gate/body, or CMOS source/drain. The required voltage is about 6-7V for a few millisecond to consume about 100 uA of current in today's technologies. Another type of anti-fuse can be applying a few milliamps of high current to punch-through the source/drain of a MOS. Programming Phase-Change Memory (PCM) requires different voltages and durations for 0 and 1. Programming to a 1 (or to reset) requires a high and short voltage pulse applied to the phase-change film. Alternatively, programming to a 0 (or to set) requires a low and long voltage pulse applied to the phase change film. The reset needs about 3V for 50 ns and consumes about 300 uA, while set needs about 2V for 300 ns and consumes about 100 uA. For MRAM, the high and low program voltages are about 2-3V and 0V, respectively, and the current is about +/−100-200 uA.

Figure 18A:
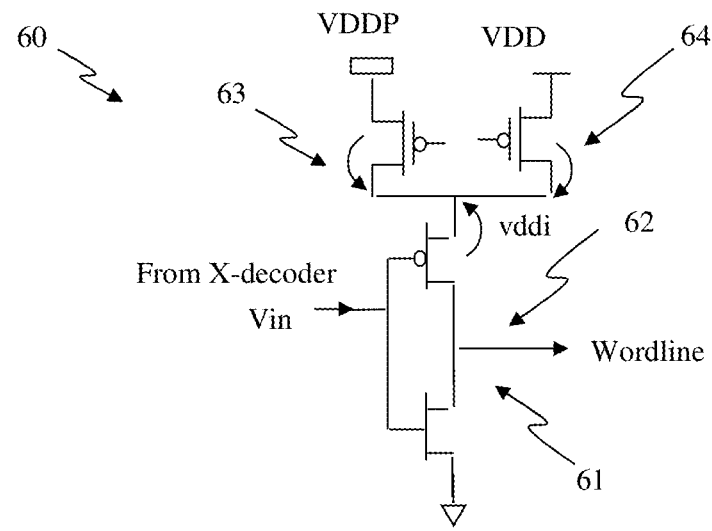
FIG. 18(*a*) shows a schematic of a wordline driver circuit according to one embodiment.
Figure 18B:
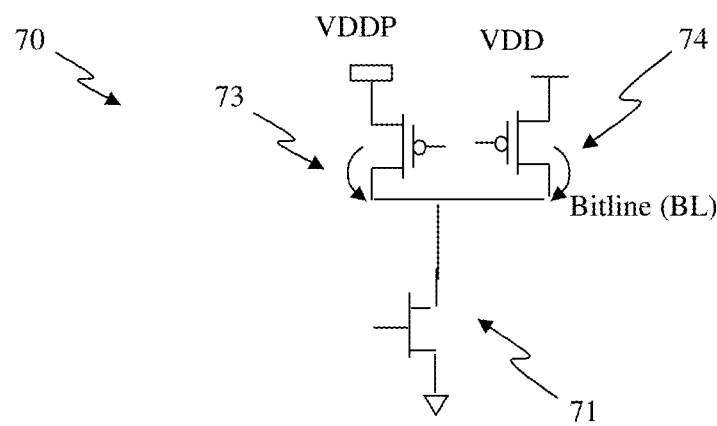
Figure 18C:
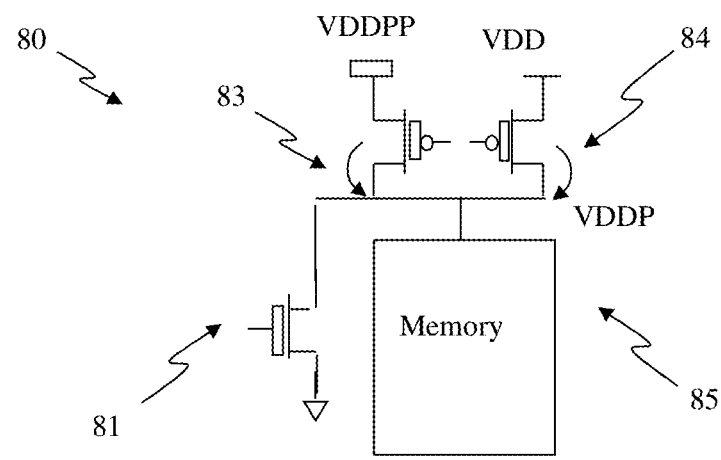

Most programmable resistive devices have a higher voltage VDDP (~2-3V) for programming than the core logic supply voltage VDD (~1.0V) for reading. FIG. 18(*a*) shows a schematic of a wordline driver circuit 60 according to one embodiment. The wordline driver includes devices 62 and 61, as shown as the wordline driver 150 in FIGS. 15, 16(*a*) and 16(*b*). The supply voltage vddi is further coupled to either VDDP or VDD through power selectors 63 and 64 (e.g., PMOS power selectors) respectively. The input of the wordline driver Vin is from an output of an X-decoder. In some embodiments, the power selectors 63 and 64 are implemented as thick oxide I/O devices to sustain high voltage. The bodies of power selector 63 and 64 can be tied to vddi to prevent latchup.

Similarly, bitlines tend to have a higher voltage VDDP (~2-3V) for programming than the core logic supply voltage VDD (~1.0V) for reading. FIG. 18(*b*) shows a schematic of a bitline circuit 70 according to one embodiment. The bitline circuit 70 includes a bitline (BL) coupled to VDDP and VDD through power selectors 73 and 74 (e.g., PMOS power selectors), respectively. If the bitline needs to sink a current such as in an MRAM, an NMOS pulldown device 71 can be provided. In some embodiments, the power selectors 73 and 74 as well as the pulldown device 71 can be implemented as thick-oxide I/O devices to sustain high voltage. The bodies of power selector 73 and 74 can be tied to vddi to prevent latchup.

Using junction diodes as program selectors may have high leakage current if a memory size is very large. Power selectors for a memory can help reducing leakage current by switching to a lower supply voltage or even turning off when a portion of memory is not in use. FIG. 18(*c*) shows a portion of memory 85 with an internal power supply VDDP coupled to an external supply VDDPP and a core logic supply VDD through power selectors 83 and 84. VDDP can even be coupled to ground by an NMOS pulldown device 81 to disable this portion of memory 85, if this portion of memory is temporarily not in use.

FIG. 19(*a*) shows one embodiment of a schematic of a pre-amplifier 100 according to one embodiment. The pre-amplifier 100 needs special considerations because the supply voltage VDD for core logic devices is about 1.0V that does not have enough head room to turn on a diode to make sense amplifiers functional, considering a diode's threshold is about 0.7V. One embodiment is to use another supply VDDR, higher than VDD, to power at least the first stage of sense amplifiers. The programmable resistive cell 110 shown in FIG. 19(*a*) has a resistive element 111 and a diode 112 as program selector, and can be selected for read by asserting YSR' to turn on a gate of a MOS 130 and wordline bar WLB. The MOS 130 is Y-select pass gate to select a signal from one of the at least one bitline(s) (BL) coupled to cells to a dataline (DL) for sensing. The pre-amplifier 100 also has a reference cell 115 including a reference resistive element 116 and a reference diode 117. The reference cell 115 can be selected for differential sensing by asserting YSRR' to turn on a gate of a MOS 131 and reference wordline WLRB. The MOS 131 is a reference pass gate to pass a signal from a reference bitline (BLR) to a reference dataline (DLR) for sensing. YSRR' is similar to YSR' to turn on a reference cell rather than a selected cell, except that the reference branch typically has only one reference bitline (BLR). The resistance Ref of the reference resistive element 116 can be set at a resistance approximately half-way between the minimum of state 1 and maximum of state 0 resistance. MOS 151 is for pre-charging DL and DLR to the same voltage before sensing by a pre-charge signal Vpc. Alternatively, the DL or DLR can be pre-charged to ground or to a diode voltage above ground in other embodiments. The YSR' and YSRR' can share the same signal in other embodiment. The reference resistor 116 can be a plurality of resistors for selection to suit different cell resistance ranges in another embodiment.

The drains of MOS 130 and 131 are coupled to sources of NMOS 132 and 134, respectively. The gates of 132 and 134 are biased at a fixed voltage Vbias. The channel width to length ratios of NMOS 132 and 134 can be relatively large to clamp the voltage swings of dataline DL and reference dataline DLR, respectively. The drains of NMOS 132 and 134 are coupled to drains of PMOS 170 and 171, respectively. The drain of PMOS 170 is coupled to the gate of PMOS 171 and the drain of PMOS 171 is coupled to the gate of PMOS 170. The outputs V+ and V− of the pre-amplifier 100 are the drains of PMOS 170 and PMOS 171, respectively. The sources of PMOS 170 and PMOS 171 are coupled to a read supply voltage VDDR. The outputs V+ and V− are pulled up by a pair of PMOS 175 to VDDR when the pre-amplifier 100 is disabled. VDDR is about 2-3V (which is higher than about 1.0V VDD of core logic devices) to turn on the diode selectors 112 and 117 in the programmable resistive cell 110 and the reference cell 115, respectively. The CMOS 130, 131, 132, 134, 170, 171, and 175 can be embodied as thick-oxide I/O devices to sustain high voltage VDDR. The NMOS 132 and 134 can be native NMOS (i.e. the threshold voltage is ~0V) to allow operating at a lower VDDR. In another embodiment, the read selectors 130 and 131 can be PMOS devices. In another embodiment, the sources of PMOS 170 and 171 can be coupled to the drain of a PMOS pullup (an activation device not shown in FIG. 19(a)), whose source is then coupled to VDDR. This sense amplifier can be activated by setting the gate of the PMOS pullup low after turning on the reference and Y-select pass gates.

Figure 19A:
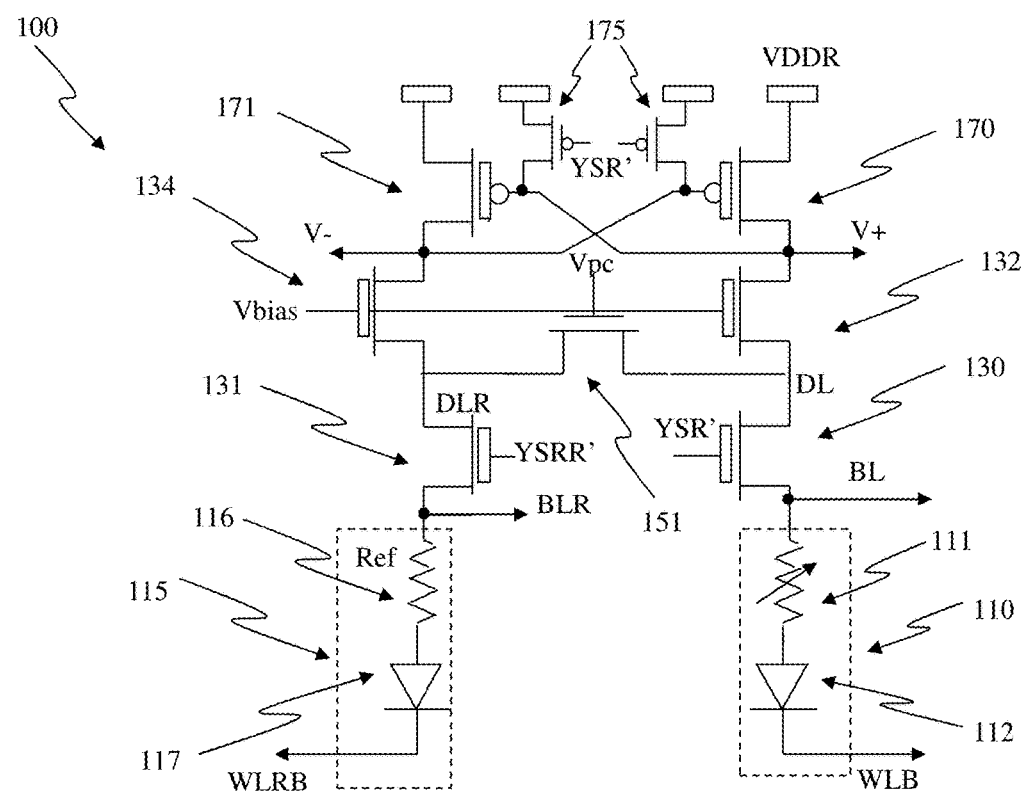
FIG. 19(*a*) shows one embodiment of a schematic of a pre-amplifier according to one embodiment.
Figure 19B:
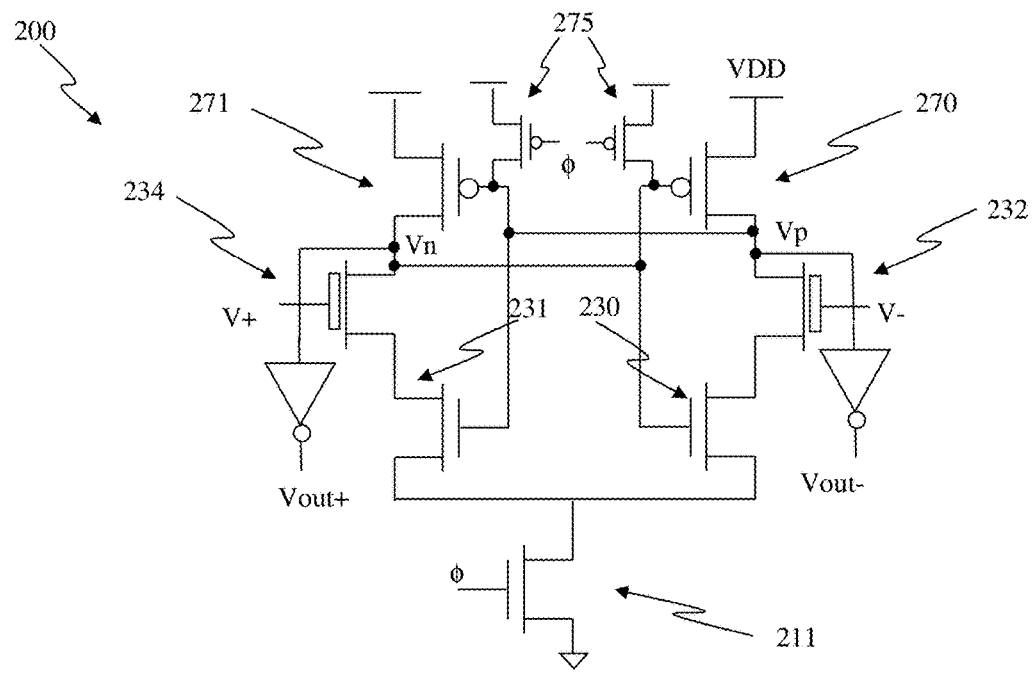

FIG. 19(b) shows one embodiment of a schematic of an amplifier 200 according to one embodiment. In another embodiment, the outputs V+ and V− of the pre-amplifier 100 in FIG. 19(a) can be coupled to gates of NMOS 234 and 232, respectively, of the amplifier 200. The NMOS 234 and 232 can be relatively thick oxide I/O devices to sustain the high input voltage V+ and V− from a pre-amplifier. The sources of NMOS 234 and 232 are coupled to drains of NMOS 231 and 230, respectively. The sources of NMOS 231 and 230 are coupled to a drain of an NMOS 211. The gate of NMOS 211 is coupled to a clock ϕ to turn on the amplifier 200, while the source of NMOS 211 is coupled to ground. The drains of NMOS 234 and 232 are coupled to drains of PMOS 271 and 270, respectively. The sources of PMOS 271 and 270 are coupled to a core logic supply VDD. The gates of PMOS 271 and NMOS 231 are connected and coupled to the drain of PMOS 270, as a node Vp. Similarly, the gates of PMOS 270 and NMOS 230 are connected and coupled to the drain of PMOS 271, as a node Vn. The nodes Vp and Vn are pulled up by a pair of PMOS 275 to VDD when the amplifier 200 is disabled when ϕ goes low. The output nodes Vout+ and Vout− are coupled to nodes Vn and Vp, respectively, through a pair of inverters as buffers.

Figure 19C:
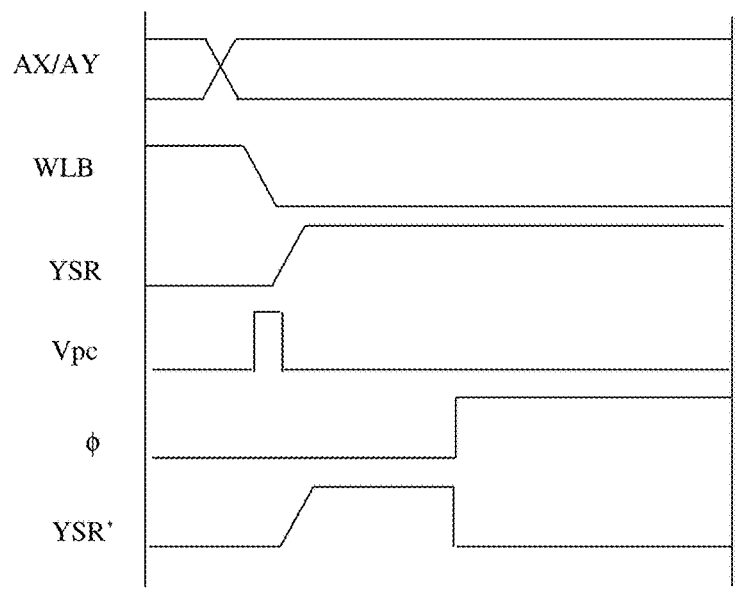

FIG. 19(c) shows a timing diagram of the pre-amplifier 100 and the amplifier 200 in FIGS. 19(a) and 19(b), respectively. The X- and Y-addresses AX/AY are selected to read at least one cell. After some propagation delays, at least one cell is selected for read by turning WLB low and YSR high to thereby select a row and at least one column, respectively. Before activating the pre-amplifier 100, a pulse Vpc can be generated to precharge DL and DLR to ground, to a diode voltage above ground, or to each other. The pre-amplifier 100 would be very slow if the DL and DLR voltages are high enough to turn off the cascode devices (e.g., NMOS 132 and 134). After the pre-amplifier outputs V+ and V− are stabilized, the clock ϕ is set high to turn on the amplifier 200 and to amplify the final output Vout+ and Vout− into full logic levels.

Figure 20A:
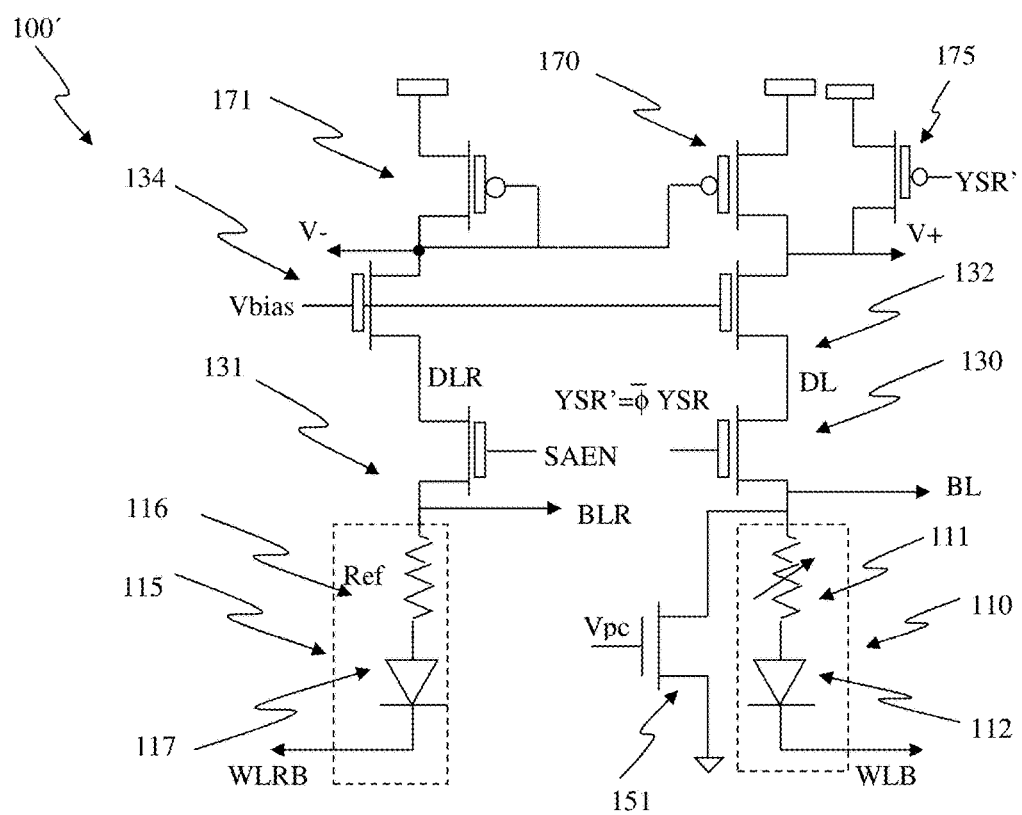
FIG. 20(*a*) shows another embodiment of a pre-amplifier, similar to the pre-amplifier in FIG. 18(*a*).

FIG. 20(a) shows another embodiment of a pre-amplifier 100', similar to the pre-amplifier 100 in FIG. 19(a), with PMOS pull-ups 171 and 170 configured as current mirror loads. The reference branch can be turned on by a level signal, Sense Amplifier Enable (SAEN), to enable the pre-amplifier, or by a cycle-by-cycle signal YSRR' as in FIG. 19(a). MOS 151 is for pre-charging DL to ground or to DLR before sensing by a pre-charge signal Vpc. Alternatively, the DL or DLR can be pre-charged to a diode voltage above ground or each other in other embodiments. The precharge scheme can be omitted in other embodiment. In this embodiment, the number of the reference branches can be shared between different pre-amplifiers at the expense of increasing power consumption. The reference resistor 116 can be a plurality of resistors for selection to suit different cell resistance ranges in another embodiment.

Figure 20B:
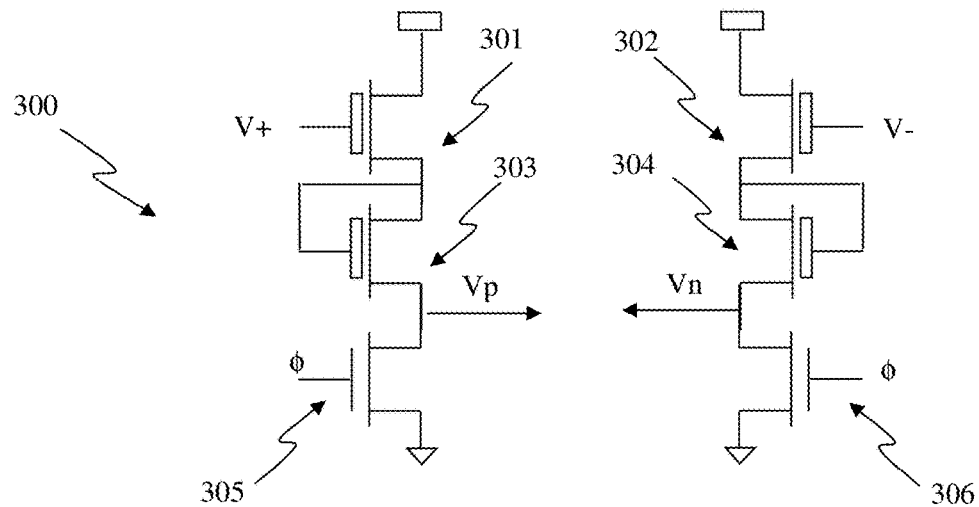

FIG. 20(b) shows level shifters 300 according to one embodiment. The V+ and V− from the pre-amplifier 100, 100' outputs in FIG. 19(a) or FIG. 20(a) are coupled to gates of NMOS 301 and 302, respectively. The drains of NMOS 301 and 302 are coupled to a supply voltage VDDR. The sources of NMOS 301 and 302 are coupled to drains of NMOS 303 and 304, respectively, which have gates and drains connected as diodes to shift the voltage level down by one Vtn, the threshold voltage of an NMOS. The sources of NMOS 303 and 304 are coupled to the drains of pulldown devices NMOS 305 and 306, respectively. The gates of NMOS 305 and 306 can be turned on by a clock ϕ. The NMOS 301, 302, 303 and 304 can be thick-oxide I/O devices to sustain high voltage VDDR. Alternatively, the NMOS 301, 302, 303, and 304 can be embodied as core devices as long as the voltage drop on each device is within the voltage limit. The NMOS 303 and 304 can be cascaded more than once to shift V+ and V− further to proper voltage levels Vp and Vn. In another embodiment, the level shifting devices 303 and 304 can be built using PMOS devices.

Figure 20C:
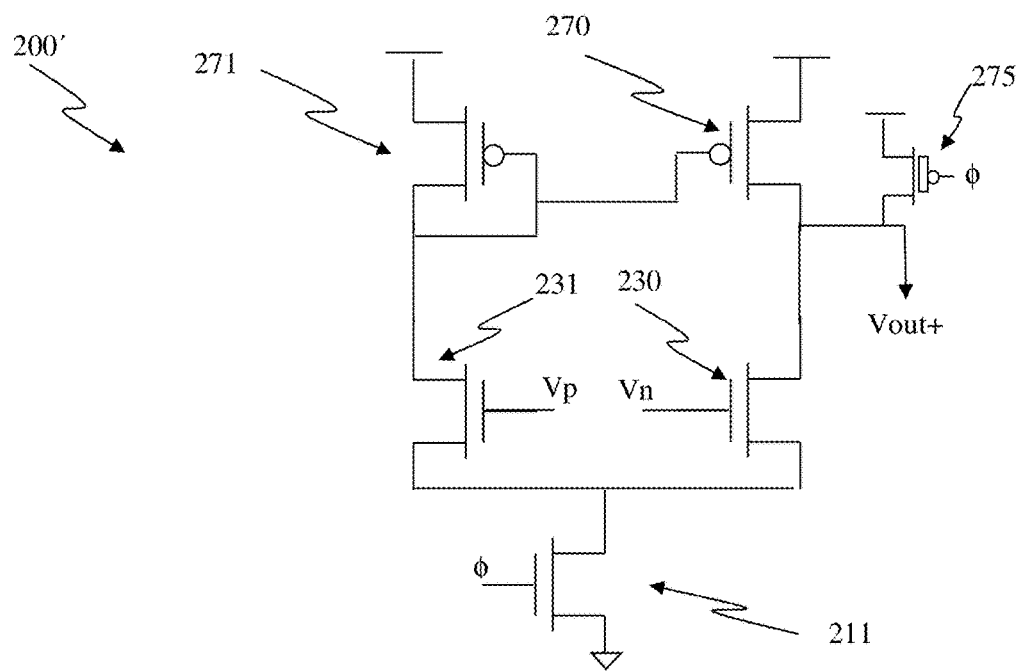

FIG. 20(c) shows another embodiment of an amplifier 200' with current-mirror loads having PMOS 270 and 271 as loads. The inputs Vp and Vn of the amplifier 200' are from the outputs Vp and Vn of the level shifter 300 in FIG. 20(b) that can be coupled to gates of NMOS 231 and 230, respectively. The drains of NMOS 231 and 230 are coupled to drains of PMOS 271 and 270, respectively, which provide current-mirror loads. The drain and gate of PMOS 271 are connected and coupled to the gate of PMOS 270. The sources of NMOS 231 and 230 are coupled to the drain of an NMOS 211, which has the gate coupled to a clock signal ϕ and the source to ground. The clock signal ϕ enables the amplifier 200'. The drain of PMOS 270 provides an output Vout+. The PMOS pullup 275 keeps the output Vout+ at logic high level when the amplifier 200' is disabled.

Figure 20D:
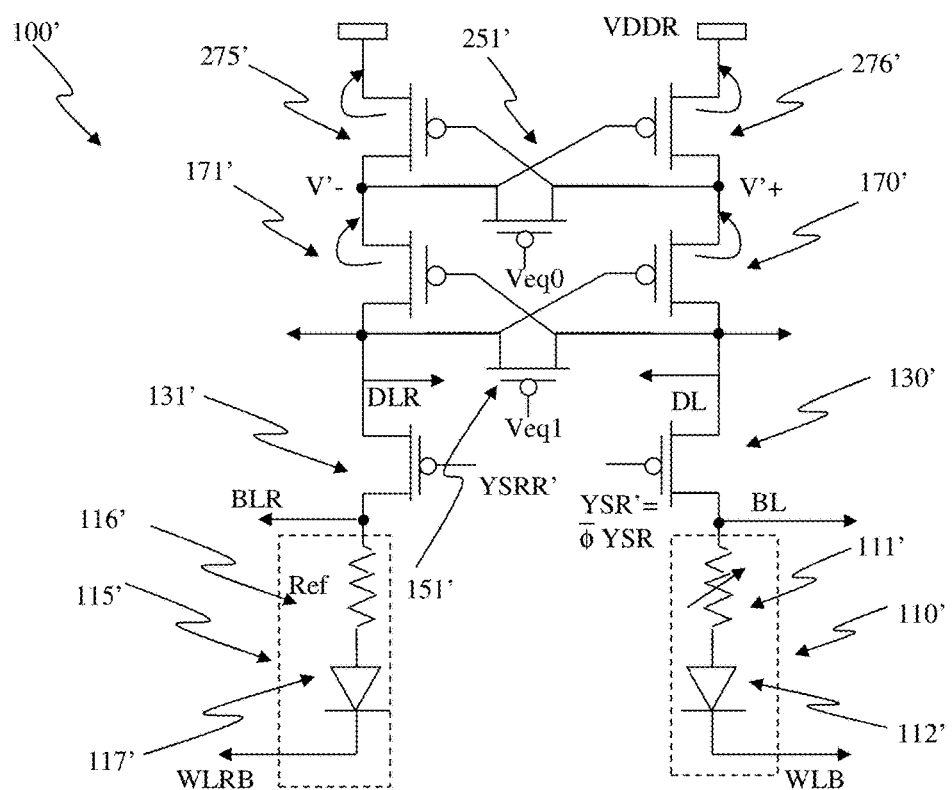

FIG. 20(d) shows one embodiment of a pre-amplifier 100' based on all core devices according to one embodiment. The programmable resistive cell 110' has a resistive element 111' and a diode 112' as program selector that can be selected for read by asserting YSR' to turn on a gate of a MOS 130' and wordline bar WLB. The MOS 130' is Y-select pass gate to select a signal from one of the at least one bitline(s) (BL) coupled to cells to a dataline (DL) for sensing. The pre-amplifier 100' also has a reference cell 115' including a reference resistive element 116' and a reference diode 117'. The reference cell 115' can be selected for differential sensing by asserting YSRR' to turn on a gate of a MOS 131' and reference wordline WLRB. The MOS 131' is a reference pass gate to pass a signal from a reference bitline (BLR) to a reference dataline (DLR) for sensing. YSRR' is similar to YSR' to turn on a reference cell rather than a selected cell, except that the reference branch typically has only one reference bitline (BLR). The drains of MOS 130' and 131' are coupled to drains of PMOS 170' and 171', respectively. The gate of 170' is coupled to the drain of 171' and the gate of 171' is coupled to the drain of 170'. The sources of MOS 170' and 171' are coupled to drains of MOS 276' and 275', respectively. The gate of 275' is coupled to the drain of 276' and the gate of 276' is coupled to the drain of 275'. The drains of 170' and 171' are coupled by a MOS equalizer 151' with a gate controlled by an equalizer signal Veq1. The drains of 276' and 275' are coupled by a MOS equalizer 251' with a gate controlled by an equalizer signal Veq0. The equalizer signals Veq0 and Veq1 can be dc or ac signals to reduce the voltage swing in the drains of 170', 171' and 275', 276', respectively. By reducing the voltage swings of the PMOS devices in the pullup and by stacking more than one level of cross-coupled PMOS, the voltage swings of the 170', 171', 275', and 276' can be reduced to VDD range so that core logic devices can be used. For example, the supply voltage of the sense amplifier VDDR is about 2.5V, while the VDD for core logic devices is about 1.0V. The DL and DLR are about 1V, based on diode voltage of about 0.7V with a few hundred millivolts drop for resistors and pass gates. If the cross-coupled PMOS are in two-level stacks, each PMOS only endures voltage stress of (2.5-1.0)/2=0.75V. Alternatively, merging MOS 275' and 276' into a single MOS or using a junction diode in the pullup is another embodiment. Inserting low-Vt NMOS as cascode devices between 170' and 130'; 171' and 131' is another embodiment. The output nodes from the drains of 170' and 171' are about 1.0-1.2V so that the sense amplifier as shown in FIG. 19(b) can be used with all core logic devices. The reference resistor 116' can be a plurality of resistors for selection to suit different cell resistance ranges in another embodiment.

Figure 20E:
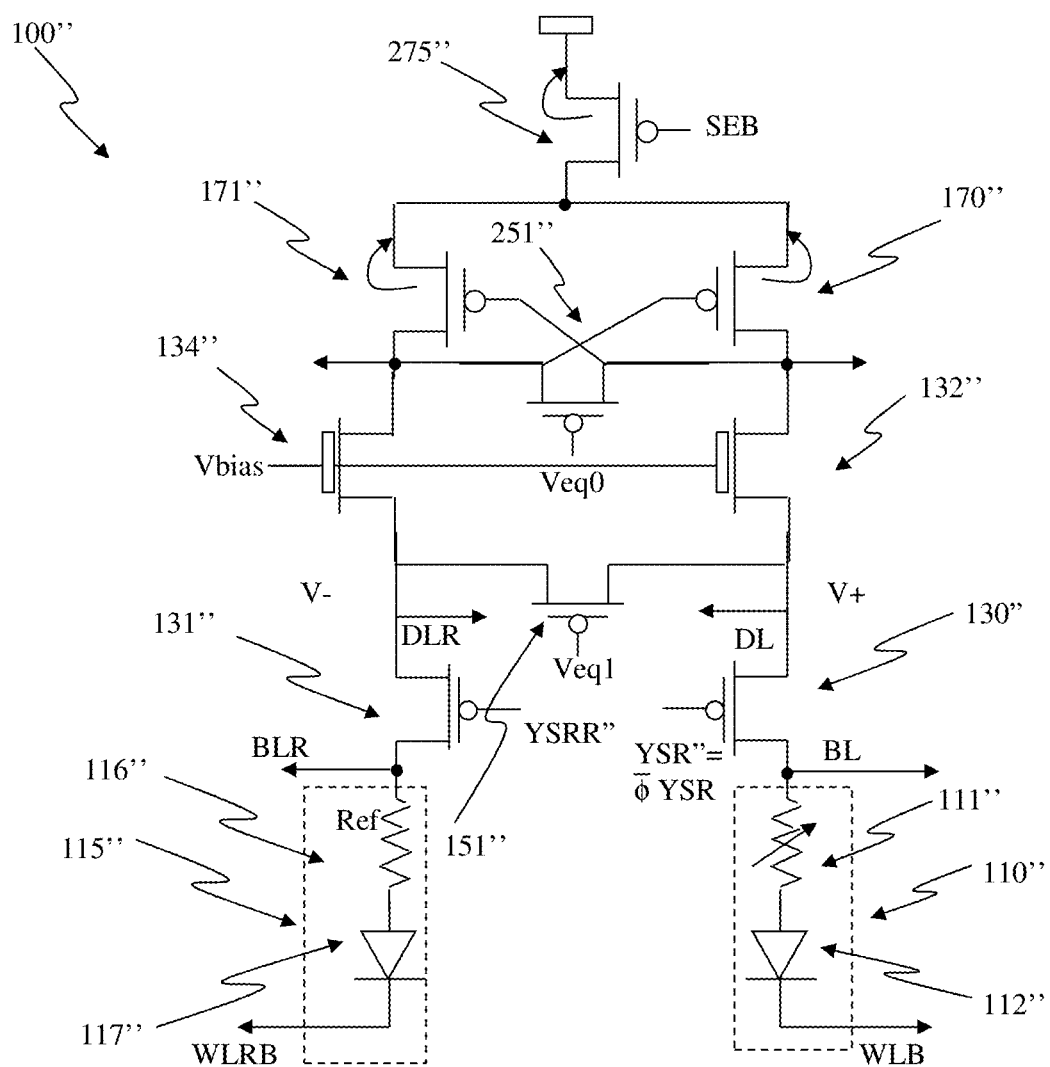

FIG. 20(e) shows another embodiment of a pre-amplifier 100" with an activation device 275" according to one embodiment. A programmable resistive cell 110" has a resistive element 111" and a diode 112" as program selector that can be selected for read by asserting YSR" to turn on a gate of a MOS 130" and wordline bar WLB. The MOS 130" is Y-select pass gate to select a signal from one of the at least one bitline(s) (BL) coupled to cells to a dataline (DL) for sensing. The pre-amplifier 100" also has a reference cell 115" including a reference resistive element 116" and a reference diode 117". The reference cell 115" can be selected for differential sensing by asserting YSRR" to turn on a gate of a MOS 131" and reference wordline WLRB. The MOS 131" is a reference pass gate to pass a signal from a reference bitline (BLR) to a reference dataline (DLR) for sensing. YSRR" is similar to YSR" to turn on a reference cell rather than a selected cell, except that the reference branch typically has only one reference bitline (BLR). The drains of MOS 130" and 131" are coupled to the sources of MOS 132" and 134", respectively. The drains of MOS 132" and 134" are coupled to the drains of PMOS 170" and 171", respectively. The gate of 170" is coupled to the drain of 171" and the gate of 171" is coupled to the drain of 170". The sources of MOS 170" and 171" are coupled to the drain of MOS 275" whose source is coupled to a supply voltage and gate coupled to a Sensing Enable Bar (SEB). The drains of 170" and 171" are coupled to a MOS equalizer 251" with a gate controlled by an equalizer signal Veq0. The sources of 132" and 134" are coupled by a MOS equalizer 151" with a gate controlled by an equalizer signal Veq1. The equalizer signals Veq0 and Veq1 can be dc or ac signals to reduce the voltage swings in the sources of 170", 171" and 132", 134", respectively.

FIGS. 19(a), 20(a), 20(d) and 20(e) only show four of many pre-amplifier embodiments. Similarly, FIGS. 19(b), 20(c) and 20(b) only show several of many amplifier and level shifter embodiments. Various combinations of pre-amplifiers, level shifters, and amplifiers in NMOS or PMOS, in core logic or I/O devices, with devices stacked or with an activation device, operated under high voltage VDDR or core supply VDD can be constructed differently, separately, or mixed. The equalizer devices can be embodied as PMOS or NMOS, and can be activated by a dc or ac signal. In some embodiments, the equalizers can be omitted.

Figure 21A:
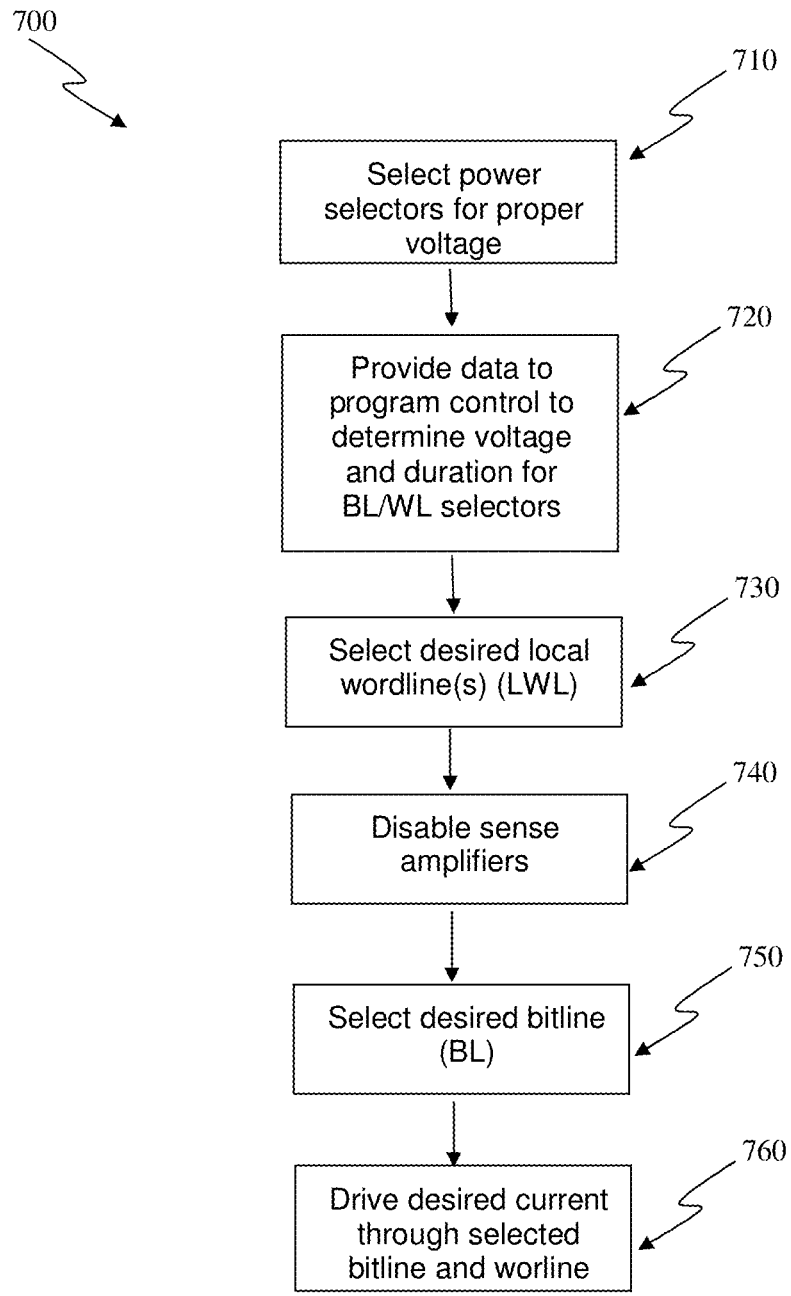
FIG. 21(*a*) depicts a method of programming a programmable resistive memory in a flow chart according to one embodiment.
Figure 21B:
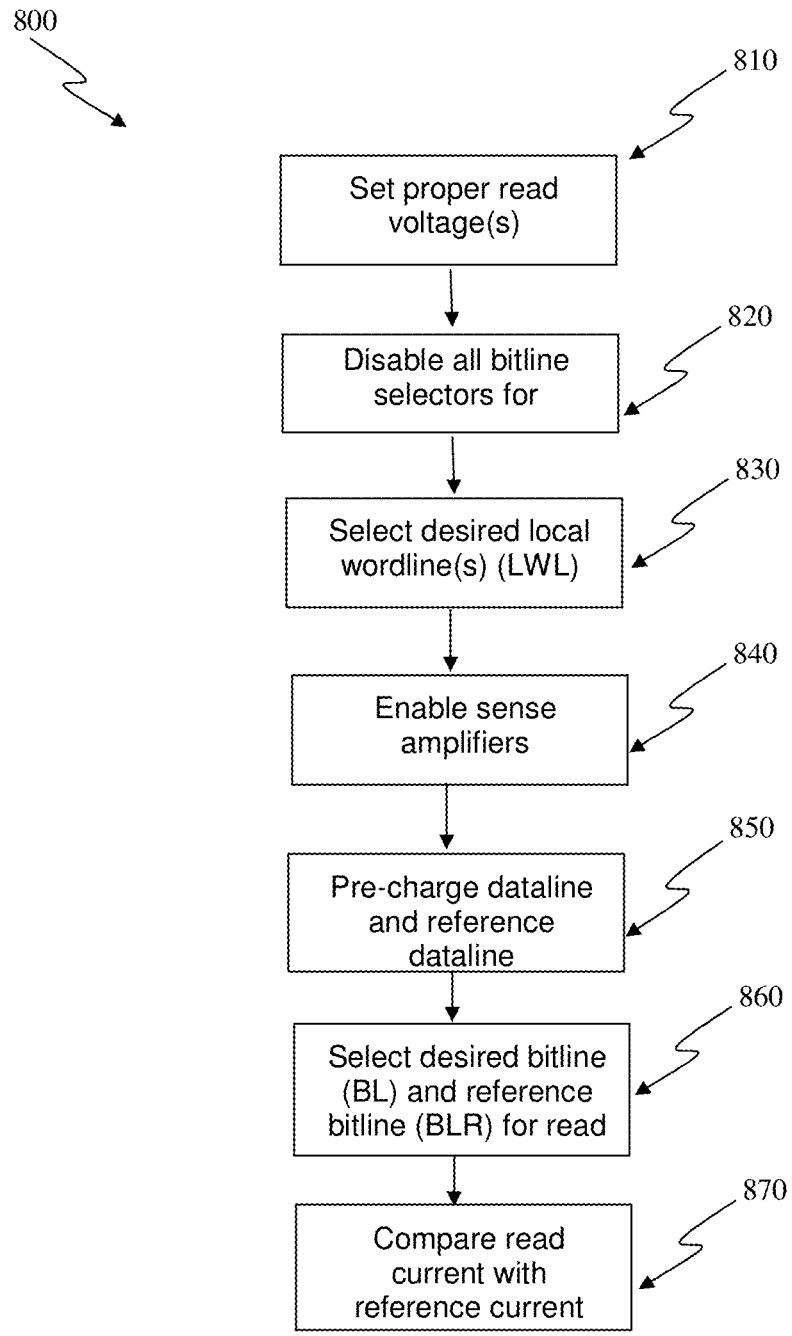

FIGS. 21(a) and 21(b) show a flow chart depicting embodiments of a program method 700 and a read method 800, respectively, for a programmable resistive memory in accordance with certain embodiments. The methods 700 and 800 are described in the context of a programmable resistive memory, such as the programmable resistive memory 100 in FIGS. 15, 16(a) and 16(b). In addition, although described as a flow of steps, one of ordinary skilled in the art will recognize that at least some of the steps may be performed in a different order, including simultaneously, or skipped.

FIG. 21(a) depicts a method 700 of programming a programmable resistive memory in a flow chart according to one embodiment. In the first step 710, proper power selectors can be selected so that high voltages can be applied to the power supplies of wordline drivers and bitlines. In the second step 720, the data to be programmed in a control logic (not shown in FIGS. 15, 16(a), and 16(b)) can be analyzed, depending on what types of programmable resistive devices. For electrical fuse, this is a One-Time-Programmable (OTP) device such that programming always means blowing fuses into a non-virgin state and is irreversible. Program voltage and duration tend to be determined by external control signals, rather than generated internally from the memory. For PCM, programming into a 1 (to reset) and programming into a 0 (to set) require different voltages and durations such that a control logic determines the input data and select proper power selectors and assert control signals with proper timings. For MRAM, the directions of current flowing through MTJs are more important than time duration. A control logic determines proper power selectors for wordlines and bitlines and assert control signals to ensure a current flowing in the desired direction for desired time. In the third step 730, a cell in a row can be selected and the corresponding local wordline can be turned on. In the fourth step 740, sense amplifiers can be disabled to save power and prevent interference with the program operations. In the fifth step 750, at least one cell in a column can be selected and the corresponding Y-write pass gate can be turned on to couple the selected bitline to a supply voltage. In the last step 760, a desired current can be driven for a desired time in an established conduction path to complete the program operations. For most programmable resistive memories, this conduction path is from a high voltage supply through a bitline select, resistive element, diode as program selector, and an NMOS pulldown of a local wordline driver to ground. Particularly, for programming a 1 to an MRAM, the conduction path is from a high voltage supply through a PMOS pullup of a local wordline driver, diode as program selector, resistive element, and bitline select to ground.

FIG. 21(b) depicts a method 800 of reading a programmable resistive memory in a flow chart according to one embodiment. In the first step 810, proper power selectors can be selected to provide supply voltages for local wordline drivers, sense amplifiers, and other circuits. In the second step 820, all Y-write pass gates, i.e. bitline program selectors, can be disabled. In the third step 830, desired local wordline(s) can be selected so that the diode(s) as program selector(s) have a conduction path to ground. In the fourth step 840, sense amplifiers can be enabled and prepared for sensing incoming signals. In the fifth step 850, the dataline and the reference dataline can be pre-charged to the V− voltage of the programmable resistive device cell or to each other. In the sixth step 860, the desired Y-read pass gate can be selected so that the desired bitline is coupled to an input of the sense amplifier. A conduction path is thus established from the bitline to the resistive element in the desired cell, diode(s) as program selector(s), and the pulldown of the local wordline driver(s) to ground. The same applies for the reference branch. In the last step 870, the sense amplifiers can compare the read current with the reference current to determine a logic output of 0 or 1 to complete the read operations.

Figure 22:
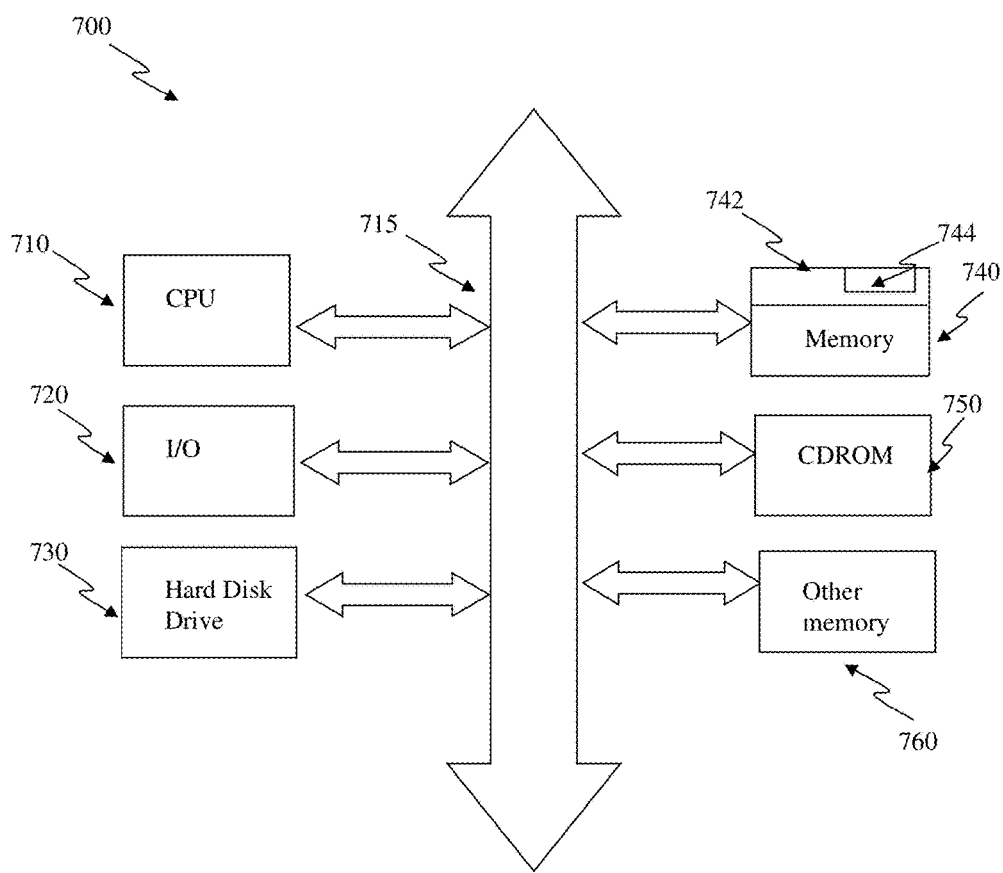
FIG. 22 shows a processor system according to one embodiment.

FIG. 22 shows a processor system 700 according to one embodiment. The processor system 700 can include a programmable resistive device 744, such as in a cell array 742, in memory 740, according to one embodiment. The processor system 700 can, for example, pertain to a computer system. The computer system can include a Central Process Unit (CPU) 710, which communicate through a common bus 715 to various memory and peripheral devices such as I/O 720, hard disk drive 730, CDROM 750, memory 740, and other memory 760. Other memory 760 is a conventional memory such as SRAM, DRAM, or flash, typically interfaces to CPU 710 through a memory controller. CPU 710 generally is a microprocessor, a digital signal processor, or other programmable digital logic devices. Memory 740 is preferably constructed as an integrated circuit, which includes the memory array 742 having at least one programmable resistive device 744. The memory 740 typically interfaces to CPU 710 through a memory controller. If desired, the memory 740 may be combined with the processor, for example CPU 710, in a single integrated circuit.

The invention can be implemented in a part or all of an integrated circuit in a Printed Circuit Board (PCB), or in a system. The programmable resistive device can be fuse, anti-fuse, or emerging nonvolatile memory. The fuse can be silicided or non-silicided polysilicon fuse, thermally isolated active-region fuse, local interconnect fuse, metal fuse, contact fuse, or via fuse. The anti-fuse can be based on gate-oxide breakdown, contact or via breakdown with dielectrics in-between, junction or source/drain breakdown, or source/drain punch-through. The emerging nonvolatile memory can be Magnetic RAM (MRAM), Phase Change Memory (PCM), Conductive Bridge RAM (CBRAM), or Resistive RAM (RRAM). Though the program mechanisms are different, their logic states can be distinguished by different resistance values.

Additional information on programmable resistive memory structures and their formation and usage can be found in: (1) U.S. patent application Ser. No. 13/026,650, filed on Feb. 14, 2011 and entitled "CIRCUIT AND SYS- TEM FOR USING A POLYSILICON DIODE AS PROGRAM SELECTOR FOR RESISTIVE DEVICES IN CMOS LOGIC PROCESSES," which is hereby incorporated herein by reference; (2) U.S. patent application Ser. No. 13/026,725, filed on Feb. 14, 2011 and entitled "CIRCUIT AND SYSTEM FOR USING A JUNCTION DIODE AS PROGRAM SELECTOR FOR RESISTIVE DEVICES," which is hereby incorporated herein by reference; (3) U.S. patent application Ser. No. 13/026,725, filed on Feb. 14, 2011 and entitled "CIRCUIT AND SYSTEM OF USING JUNCTION DIODE AS PROGRAM SELECTOR FOR RESISTIVE DEVICES IN CMOS LOGIC PROCESSES," which is hereby incorporated herein by reference; (4) U.S. patent application Ser. No. 13/026,650, filed on Feb. 14, 2011 and entitled "CIRCUIT AND SYSTEM OF USING POLYSILICON DIODE AS PROGRAM SELECTOR FOR RESISTIVE DEVICES IN CMOS LOGIC PROCESSES," which is hereby incorporated herein by reference; and (5) U.S. patent application Ser. No. 13/471,704, filed on May 15, 2012 and entitled "CIRCUIT AND SYSTEM FOR USING A JUNCTION DIODE AS PROGRAM SELECTOR FOR ONE-TIME PROGRAMMABLE DEVICES," which is hereby incorporated herein by reference.

The above description and drawings are only to be considered illustrative of exemplary embodiments, which achieve the features and advantages of the present invention. Modifications and substitutions of specific process conditions and structures can be made without departing from the spirit and scope of the present invention.

The many features and advantages of the present invention are apparent from the written description and, thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. An One-Time Programmable (OTP) memory, comprising:
  a plurality of OTP cells, at least one of the OTP cells comprising:
    a resistive element; and
    at least one semiconductor fin structure residing in a common well or on an isolated substrate, the semiconductor fin structure including a plurality of fins, at least one of the plurality of fins being covered by at least one MOS gate to divide the at least one of the plurality of fins into at least a first active region and a second active region, the first active region having a first type of dopant, and the second active region having the first type of dopant or the second type of dopant; the first active region coupled to one end of the resistive element, the other end of the resistive element coupled to a first voltage supply line, the second active region coupled to a second voltage supply line, and the MOS gate coupled to a third voltage supply line,
  wherein the first and/or the second active regions of two or more of the plurality of fins are coupled together by at least one extended source/drain, and
  wherein the resistive element can be configured to be programmable into a different resistance state by applying voltages to the first, second, and the third voltage supply lines.

2. An OTP memory as recited in claim 1, wherein the resistive element is built on at least a portion of the extended source/drain coupling between fins.

3. An OTP memory as recited in claim 1, wherein the resistive element is built on at least a portion of the extended source/drain without any of the plurality of fins underneath.

4. An OTP memory as recited in claim 1, wherein the resistive element is built on at least one portion of the extended source/drain over one or more of the plurality of fins.

5. An OTP memory as recited in claim 1, wherein the resistive element is built on at least one portion of the gate over field and without fins underneath.

6. An OTP memory as recited in claim 1, wherein the resistive element is built on at least a portion of the gate over at least one of the plurality of fins.

7. An OTP memory as recited in claim 1, wherein the extended source/drain comprises at least one of metal, metal alloy, SiGe, silicide, or epitaxial silicon.

8. An OTP memory as recited in claim 1, wherein the resistive element has only one contact in one end.

9. An OTP memory as recited in claim 1, wherein the resistive element has more contacts at one end than at another end.

10. An OTP memory as recited in claim 1, wherein the resistive element has length to width ratio of between 2 to 8 between two nearest contacts in two ends.

11. An OTP memory as recited in claim 1, wherein the first active region provides a first terminal of the MOS, and the second active region provides a second terminal of the MOS.

12. An OTP memory as recited in claim 1, wherein the resistive element has at least one extended source/drain region and built into the same structure as the MOS.

13. An electronics system, comprising:
a processor; and
an OTP memory operatively connected to the processor, the OTP memory includes at least a plurality of OTP cells for providing data storage, each of the OTP cells comprising:
a resistive element; and
at least one semiconductor fin structure residing in a common well or on an isolated substrate, the semiconductor fin structure include a plurality of fins, at least one of the plurality of fins can be covered by at least one MOS gate to divide the at least one fins into at least a first active region and a second active region, the first active region having a first type of dopant, and the second active region having the first type of dopant or the second type of dopant, the first active region coupled to the resistive element, the other end of the resistive element coupled to a first voltage supply line, the second active region coupled to a second voltage supply line, and the gate coupled to a third voltage supply line,
wherein the first and/or the second active region of the fins are coupled together by extended source/drain and
wherein the resistive element is configured to be programmable into a different resistance state by applying voltages to the first, second, and the third voltage supply lines.

14. An electronics system as recited in claim 13, wherein the resistive element is built on at least one portion of the extended source/drain coupling between the fins.

15. An electronics system as recited in claim 13, wherein the extended source/drain comprises at least one of metal, metal alloy, SiGe, silicide, epitaxial silicon, or combination thereof.

16. A method for providing an One-Time Programmable (OTP) memory, comprising:
providing a plurality of OTP cells, at least one of the OTP cells include at least (i) a resistive element coupled to a first supply voltage line; and (ii) at least one semiconductor fin structure having at least one active region divided by at least one MOS gate into at least a first active region and a second active region, the first active region having a first type of dopant and the second region having a first or second type of dopant, both the first and second active regions being fabricated from sources or drains of CMOS devices, both the first and second active regions residing in a common well fabricated from CMOS wells or on an isolated substrate, at least one of the first or the second active regions are coupled together by at least one extended source/drain, and the first active region coupled to the resistive element and the second active region coupled to a second supply voltage line; the MOS gate coupled to a third supply voltage line; and
programming a logic state into at least one of the OTP cells by applying voltages to the first, second, and/or third voltage lines.

17. A method as recited in claim 16, wherein at least one MOS diode or diode is built in on the at least one semiconductor fin structure.

18. A method as recited in claim 16, wherein the resistive element is built on at least one portion of the extended source/drain coupling between fins of the at least one semiconductor fin structure.

19. A method as recited in claim 16, wherein the program voltage of resistive element is found by procedures of testing a maximum voltage through a minimum programming voltage.

20. An One-Time Programmable (OTP) memory, comprising:
a plurality of OTP cells, at least one of the OTP cells comprising:
a resistive element;
at least one semiconductor fin structure residing in a common well or on an isolated substrate, the semiconductor fin structure including a plurality of fins, at least one of the plurality of fins being covered by at least one MOS gate to divide the at least one of the plurality of fins into the first active region coupled to one end of the resistive element, the other end of the resistive element being coupled to a first voltage supply line, the second active region being coupled to a second voltage supply line, and the MOS gate being coupled to a third voltage supply line,
wherein the first and/or the second active regions of two or more of the plurality of fins are coupled together by at least one extended source/drain, and
wherein the resistive element is configured to be programmable into a different resistance state by applying voltages to the first, second, and the third voltage supply lines.

* * * * *